United States Patent
Moore et al.

(10) Patent No.: US 7,450,044 B2
(45) Date of Patent: Nov. 11, 2008

(54) SUB-HARMONIC IMAGE MITIGATION IN DIGITAL-TO-ANALOG CONVERSION SYSTEMS

(75) Inventors: George S. Moore, Veradale, WA (US); Nico Lugil, Rotselaar (BE); Kenneth D. Poulton, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/692,128

(22) Filed: Mar. 27, 2007

(65) Prior Publication Data

US 2008/0238747 A1 Oct. 2, 2008

(51) Int. Cl.
*H03M 1/06* (2006.01)
(52) U.S. Cl. .................................. 341/118; 341/144
(58) Field of Classification Search ......... 341/118–120, 341/144, 145
See application file for complete search history.

(56) References Cited

U.S. PATENT DOCUMENTS

| 7,061,412 | B1 * | 6/2006 | Wang et al. | 341/118 |
| 7,324,798 | B2 * | 1/2008 | Seo et al. | 455/324 |
| 2004/0212525 | A1 * | 10/2004 | Mallinson | 341/144 |
| 2006/0022857 | A1 * | 2/2006 | Chen | 341/144 |

* cited by examiner

*Primary Examiner*—Brian Young
(74) *Attorney, Agent, or Firm*—Ian Hardcastle

(57) ABSTRACT

A digital-to-analog conversion system comprises a digital input, a digital-to-analog converter and a modified digital signal generator. The digital-to-analog converter has a conversion frequency and is subject to a periodic error having a periodicity equal to that of an N-th sub-harmonic of the conversion frequency, where N is an integer. The digital input is operable to receive a digital input signal. The modified digital signal generator is interposed between the digital input and the digital-to-analog converter and is operable in response to the digital input signal to generate a modified digital signal. The modified digital signal comprises a dynamic digital mitigation component that mitigates the periodic error of the digital-to-analog converter.

22 Claims, 15 Drawing Sheets

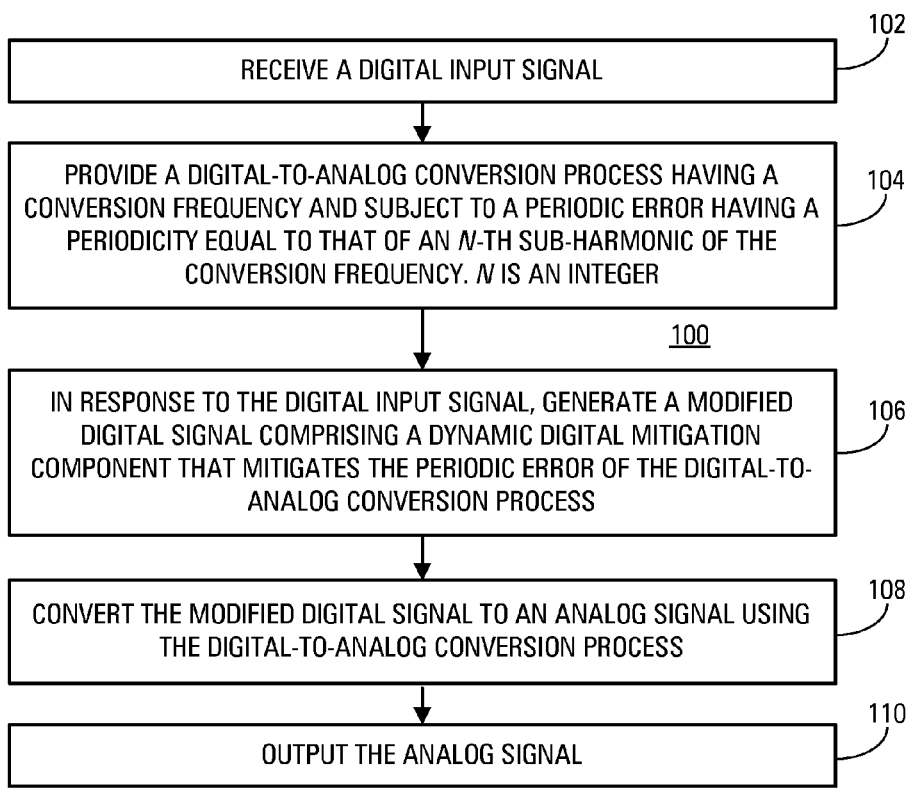
FIG.1
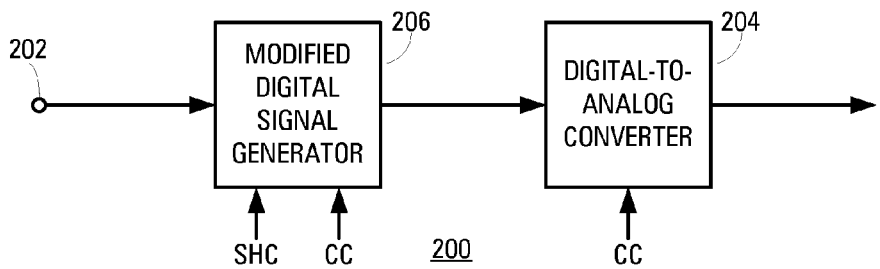
FIG.2
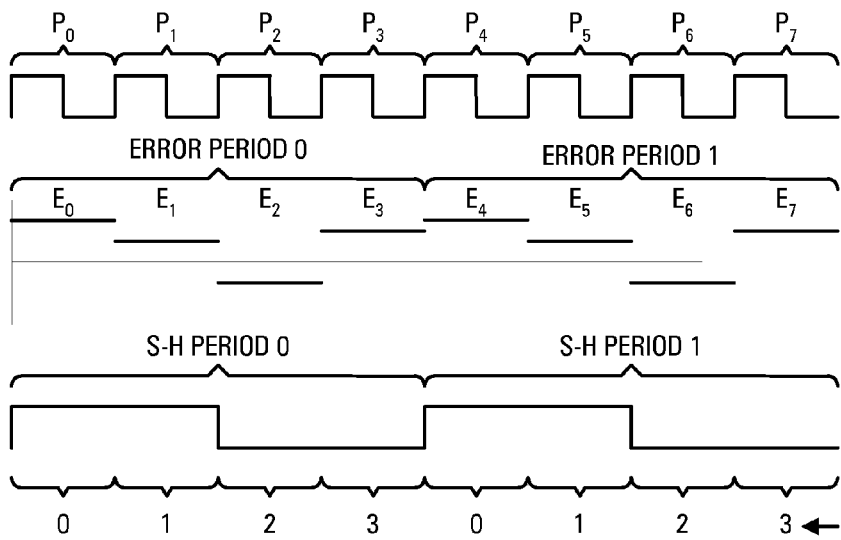
FIG.3A
FIG.3B
FIG.3C
FIG.3D

SUB-HARMONIC IMAGE MITIGATION IN DIGITAL-TO-ANALOG CONVERSION SYSTEMS

BACKGROUND

Digital-to-analog conversion systems are subject to errors that result in a difference between the analog output signal output by the digital-to-analog conversion system and the analog signal represented by the digital signal input to the digital-to-analog conversion system. In some digital-to-analog conversion systems, the error to which the digital-to-analog conversion system is subject is a periodic error having a periodicity equal to that of an N-th sub-harmonic of the conversion frequency $F_s$ of the digital-to-analog conversion system, i.e., the frequency at which the digital-to-analog conversion system converts successive values of the digital input signal to respective segments of the analog output signal. The error is periodic in the sense that the error varies from period-to-period of the conversion frequency in a repetitive pattern. The repetitive pattern has a periodicity equal to that of the above-mentioned sub-harmonic of the conversion frequency. In many cases, the digital-to-analog conversion system is subject to more than one periodic error. In this case, the description of periodic error herein applies to each periodic error to which the digital-to-analog conversion system is subject.

Some digital-to-analog conversion systems are composed of a digital-to-analog converter and one or more auxiliary circuits. The auxiliary circuits operate in response to clock signals at a sub-harmonic of the conversion frequency of the digital-to-analog converter. Leakage of signals from such auxiliary circuits into the analog signal path or clock signal path of the digital-to-analog converter subjects the digital-to-analog conversion system to a periodic error having a periodicity equal to that of a sub-harmonic of the conversion frequency of the digital-to-analog conversion system. Additionally or alternatively, leakage of signals from nearby circuits not part of the digital-to-analog conversion system but that operate in response to a clock signal at a sub-harmonic of the conversion frequency of the digital-to-analog conversion system can subject the digital-to-analog conversion system to a periodic error having a periodicity equal to that of the sub-harmonic of the conversion frequency.

A periodic leakage signal leaking into the digital-to-analog conversion system can appear directly in the analog output signal output by the digital-to-analog conversion system. In this case, the digital-to-analog conversion system can be regarded as being subject to a periodic offset error. A periodic offset error is an example of a signal-independent periodic error as it is independent of the analog signal represented by the digital input signal input to the digital-to-analog conversion system. The analog signal represented by the digital input signal will be referred to as a first analog signal.

Additionally or alternatively, a periodic leakage signal leaking into the digital-to-analog conversion system can modulate the gain of the digital-to-analog conversion system by modulating a bias signal or a supply voltage. In this case, the digital-to-analog conversion system can be regarded as being subject to a periodic gain error. Additionally or alternatively, such periodic leakage signal can modify the timing of transitions of the analog output signal generated by the digital-to-analog conversion system from one conversion period to the next. In this case, the digital-to-analog conversion system can be regarded as being subject to a periodic timing error. A periodic gain error and a periodic timing error are examples of signal-dependent periodic errors. A signal-dependent periodic error is a periodic error that depends on the first analog signal. A digital-to-analog conversion system may be subject to either or both a signal-independent periodic error and a signal-dependent error. Other types of periodic error are possible.

Other digital-to-analog conversion systems are composed of interleaved digital-to-analog converters. Each digital-to-analog converter operates at a conversion frequency of $F_s/N$, where N is the number of digital-to-analog converters constituting the digital-to-analog conversion system. Mismatches of timing and conversion gain, which may be frequency-dependent, among the digital-to-analog converters subject the digital-to-analog conversion system to a periodic error having a periodicity equal to that of a sub-harmonic of the conversion frequency of the digital-to-analog conversion system. The mismatches of timing and conversion gain can be caused by differences among the constituent digital-to-analog converters. Additionally or alternatively, such mismatches can be caused by leakage signals from nearby circuits not part of the digital-to-analog conversion system but that operate in response to a clock signal at a sub-harmonic of the conversion frequency of the digital-to-analog conversion system. Such mismatches of timing and conversion gain can be regarded as subjecting the digital-to-analog conversion system to periodic offset, gain and timing errors similar to those described above.

In a digital-to-analog conversion system subject to a signal-independent periodic error, such as a periodic offset error, the signal-independent error appears directly in the analog output signal output by the digital-to-analog conversion system. As a result, the analog output signal differs dynamically from the first analog signal by an error equal to the signal-independent periodic error. The error in the analog output signal has a periodicity equal to that of the sub-harmonic of the conversion frequency.

In a digital-to-analog conversion system subject to a signal-dependent periodic error, such as a periodic gain error or a periodic timing error, the spectrum of the signal-dependent periodic error is convolved with the spectrum of the first analog signal (gain error), or the time derivative of the spectrum of the first analog signal (timing error). As a result, the analog output signal differs dynamically from the first analog signal by an error composed of unwanted images of the first analog signal. For a first analog signal having a frequency of $f_{in}$ and a digital-to-analog conversion system subject to a periodic signal-dependent error having a frequency of $F_s/N$, the unwanted images of the first analog signal have various amplitudes and are at frequencies of $f_{in} \pm MF_s/N$, where M is an integer. Since the error in the analog output signal depends on the first analog signal, or its time derivative, any periodicity in the error in the analog output signal will depend on the periodicity of the first analog signal and the periodicity of the periodic error.

The digital-to-analog conversion system being subject to a periodic error having a periodicity equal to that of a sub-harmonic of the conversion frequency causes an error in the analog output signal output by the digital-to-analog conversion system, and therefore impairs the conversion accuracy of the digital-to-analog conversion system. Such impairment is undesirable. Accordingly, what is needed is a way to mitigate the periodic errors to which digital-to-analog conversion systems are subject.

BRIEF DESCRIPTION OF THE DRAWINGS

FIG. 1 is a flow chart showing an example of a digital-to-analog conversion method in accordance with an embodiment of the invention.

FIG. 2 is a block diagram showing an example of a digital-to-analog conversion system in accordance with an embodiment of the invention.

FIGS. 3A-3D are graphs showing an example of a periodic error to which the digital-to-analog converter of the digital-to-analog conversion system shown in FIG. 2 is subject.

DETAILED DESCRIPTION

Figure 4:
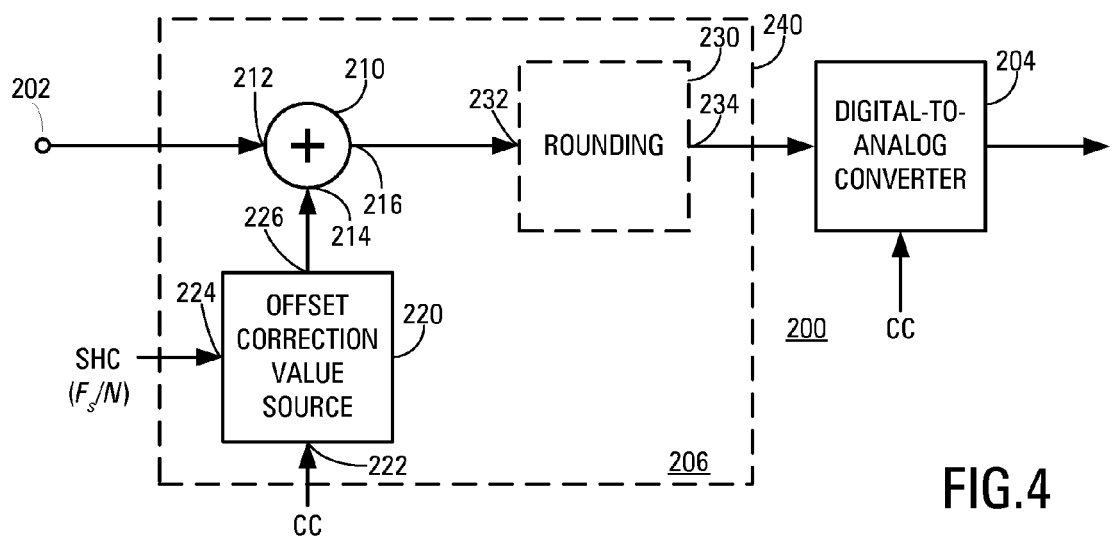
FIG. 4 is a block diagram showing an example of a digital-to-analog conversion system in which a periodic offset error is mitigated.

FIG. 1 is a flow chart showing an example of a digital-to-analog conversion method 100 in accordance with an embodiment of the invention. In block 102, a digital input signal is received. In block 104, a digital-to-analog conversion process having a conversion frequency is provided. The digital-to-analog conversion process is subject to a periodic error having a periodicity equal to that of an N-th sub-harmonic of the conversion frequency. N is an integer. In block 106, a modified digital signal is generated in response to the digital input signal. The modified digital signal comprises a dynamic digital mitigation component that mitigates the periodic error of the digital-to-analog conversion process. In block 108, the modified digital signal is converted to an analog signal using the above-described digital-to-analog conversion process. In block 110, the analog signal is output.

The digital input signal represents a first analog signal and the digital-to-analog conversion process is one that would convert such digital input signal to a second analog signal that differs from the first analog signal due to the periodic error. The modified digital signal represents a third analog signal that differs from the first analog signal by a dynamic difference represented by the dynamic digital mitigation component. When the modified digital signal is converted to the analog signal using the digital-to-analog conversion process, the dynamic difference between the third analog signal represented by the modified digital signal and the first analog signal represented by the digital input signal mitigates the periodic error of the digital-to-analog conversion process.

The first analog signal is the analog signal that would be generated by converting the digital input signal to an analog signal by a digital-to-analog conversion process having no periodic error. The properties of such first analog signal are typically determined by predicting them mathematically from the digital input signal. Typically, the digital input signal is digitally synthesized to represent a first analog signal having specific waveform characteristics. In this case, the first analog signal is known in advance. In other instances, the first analog signal is a real analog signal input to an analog-to-digital conversion process that converts the real analog signal to the digital input signal. In such instances, the analog-to-digital conversion process is substantially more precise than the digital-to-analog conversion process. Alternatively, the analog-to-digital converter has errors that are known and are corrected for.

In some embodiments, the digital-to-analog conversion process is a single digital-to-analog conversion process operating at the conversion frequency. In other embodiments, the digital-to-analog conversion process comprises multiple, interleaved digital-to-analog conversion processes. Each digital-to-analog conversion process operates at a conversion frequency of $F_s/N$, where $F_s$ is the conversion frequency of the digital-to-analog conversion process as a whole and N is the number of digital-to-analog conversion processes.

In block 106, the modified digital signal is described as comprising a dynamic digital mitigation component that mitigates the periodic error of the digital-to-analog conversion process. Typically, the modified digital signal comprises the digital input signal as an additional component thereof. Alternatively, as will be described below, the modified digital signal comprises an intermediate modified digital signal generated from the digital input signal. A modified digital signal that comprises such intermediate modified digital signal will also be regarded as comprising the digital input signal. In an example in which the digital-to-analog conversion process is subject to more than one type of periodic error, the digital input signal is subject to a first performance of block 106 to mitigate a first type of periodic error and to generate an intermediate modified digital signal. The intermediate modified digital signal is then subject to a second performance of block 106 to mitigate a second type of periodic error. In some embodiments, block 106 is performed more than twice. Several examples of digital-to-analog conversion systems that perform block 106 more than once are described below.

FIG. 2 is a block diagram showing an example of a digital-to-analog conversion system 200 in accordance with an embodiment of the invention. In the example shown, digital-to-analog conversion system 200 is composed of a digital input 202, a digital-to-analog converter 204 and a modified digital signal generator 206.

Digital input 202 is operable to receive a digital input signal. Digital-to-analog converter 204 has a conversion frequency, and is subject to a periodic error having a periodicity equal to that of an N-th sub-harmonic of the conversion frequency. N is an integer. In the example shown, the conversion frequency of digital-to-analog converter 204 is defined by a conversion clock signal CC. Modified digital signal generator 206 is interposed between digital input 202 and digital-to-analog converter 204 and is operable to generate a modified digital signal comprising a dynamic digital mitigation component that mitigates the periodic error of digital-to-analog converter 204. Modified digital signal generator 206 generates the modified digital signal in response to conversion clock signal CC and additionally in response to sub-harmonic clock signal SHC. Sub-harmonic clock signal SHC locks the operation of modified digital signal generator 206 in phase to the periodic error of digital-to-analog converter 204, as will be described in greater detail below with reference to FIGS. 3A-3D.

The digital input signal received at digital input 202 represents a first analog signal, and digital-to-analog converter 204 is one that would convert such digital input signal to a second analog signal that differs from the first analog signal due to the periodic error. The modified digital signal represents a third analog signal that differs from the first analog signal by a dynamic difference represented by the dynamic digital mitigation component. When the modified digital signal generated by modified digital signal generator 206 is converted to the analog output signal by digital-to-analog converter 204, the dynamic digital mitigation component of the modified digital signal mitigates the periodic error of digital-to-analog converter 204.

In some embodiments, digital-to-analog converter 204 is a single digital-to-analog converter operating at the conversion frequency. In other embodiments, digital-to-analog converter 204 is embodied as a digital-to-analog conversion system comprising interleaved digital-to-analog converters (not shown). Each digital-to-analog converter operates at a conversion frequency of $F_s/N$, where $F_s$ is the conversion frequency of the digital-to-analog conversion system, and N is the number of digital-to-analog converters constituting the digital-to-analog conversion system.

FIG. 3A is a graph showing eight exemplary periods $P_0$ through $P_7$ of the conversion clock signal CC provided to an example of digital-to-analog converter 204. In this disclosure, one period of the conversion clock signal CC will be referred to as a conversion clock period.

FIG. 3B is a graph schematically showing an example of the periodic error to which the example of digital-to-analog converter 204 is subject. The graph shows errors $E_0$ through $E_7$ to which digital-to-analog converter 204 is subject in periods $P_0$ through $P_7$, respectively, of conversion clock signal CC. In the example shown, the same digital input signal value is input to the digital-to-analog converter in each of the periods $P_0$ through $P_7$ of conversion clock signal CC and, in each period, the second analog signal output by the digital-to-analog converter is measured. The difference between the second analog signal output in each conversion clock period and the first analog signal represented by the digital input signal is calculated to determine the respective error. The periodic error may be independent of the digital input signal, in which case the periodic error is a signal-independent periodic error.

FIG. 3B shows how the error of digital-to-analog converter 204 is different in conversion clock periods $P_0$ through $P_7$. The differing errors indicate that digital-to-analog converter 204 is subject to a dynamic error. Moreover, in the example shown in FIG. 3B, error $E_4$ in conversion clock period $P_4$ is identical to error $E_0$ in conversion clock period $P_0$; error $E_5$ in conversion clock period $P_5$ is identical to error $E_1$ in conversion clock period $P_1$; error $E_6$ in conversion clock period $P_6$ is identical to error $E_2$ in conversion clock period $P_2$ and error $E_7$ in period $P_7$ is identical to error $E_3$ in conversion clock period $P_3$. This indicates that the dynamic error to which digital-to-analog converter 204 is subject is also periodic with a periodicity equal to four periods of conversion clock signal CC. Thus, the periodic error of digital-to-analog converter 204 has a periodicity equal to that of the fourth sub-harmonic of conversion clock signal CC. FIG. 3B shows two periods of the periodic error of digital-to-analog converter 204: error period 0 covering errors $E_0$ through $E_3$ and error period 1 covering errors $E_4$ through $E_7$.

FIG. 3C is a graph showing a sub-harmonic clock signal SHC having a periodicity equal to that of the periodic error of digital-to-analog converter 204, and locked in phase thereto. Two periods of sub-harmonic clock signal SHC are shown. In this disclosure, a period of sub-harmonic clock signal SHC will be referred to as a sub-harmonic clock period. Each sub-harmonic clock period corresponds to N conversion clock periods, where N is the number of the sub-harmonic of the conversion clock signal. In the example shown, each sub-harmonic clock period corresponds to four conversion clock periods.

Within each sub-harmonic clock period, each conversion clock period corresponds to a different error in the respective error period. Each conversion clock period in the sub-harmonic clock period is assigned a conversion clock period number that corresponds to a respective error in the error period. FIG. 3D schematically illustrates the conversion clock period numbering scheme. The conversion clock period numbers are captioned CCPN. The conversion clock period numbers repeat in each sub-harmonic clock period.

The periodic nature of the periodic error of digital-to-analog converter 204 enables the periodic error to be mitigated using a cyclic error mitigation scheme locked in phase to sub-harmonic clock signal SHC. As noted above, the sub-harmonic clock signal is in turn locked in phase to the periodic error of digital-to-analog converter 204. In the cyclic error mitigation scheme, in each sub-harmonic clock period, a respective value of the modified digital signal differs from the respective value of the digital input signal by a difference that depends at least in part on the conversion clock period number in the sub-harmonic clock period.

A similar description applies to the digital-to-analog conversion process referred to above with reference to FIG. 1.

FIG. 4 is a block diagram showing an example of digital-to-analog conversion system 200 in accordance with an embodiment of the invention. The example of digital-to-analog conversion system 200 shown comprises an embodiment of digital-to-analog converter 204 subject to a periodic offset error, and an embodiment 240 of modified digital signal generator 206 that mitigates such periodic offset error. A periodic offset error manifests itself as a difference between the level of the analog output signal output by digital-to-analog converter 204 and the level of the first analog signal represented by the digital input signal input to digital-to-analog conversion system 200. The level difference due to an offset error is independent of the level of the first analog signal represented by the digital input signal. Thus, a periodic offset error is an example of a signal-independent periodic error.

The offset error to which digital-to-analog converter 204 is subject is dynamic in the sense that the offset error varies from period-to-period of the conversion clock signal of digital-to-analog converter 204. The variation of the offset error has a periodicity equal to that of the N-th sub-harmonic of the conversion frequency, as described above. This will be described in more detail below with reference to FIGS. 5A-5D.

In the example shown, modified digital signal generator 206 is composed of a summing element 210, an offset correction value source 220 and, optionally, a rounding circuit 230. Summing element 210 has a first input 212, a second input 214 and an output 216. First input 212 is connected to digital input 202.

Offset correction value source 220 has a clock input 222, a synchronization input 224 and a correction value output 226. Clock input 222 is connected to receive conversion clock signal CC. Synchronization input 224 is connected to receive sub-harmonic clock signal SHC having a periodicity corresponding to that of the periodic offset error of digital-to-analog converter 204 and locked in phase to the offset error. In embodiments in which the periodic error is caused by signal leakage from an adjacent circuit, sub-harmonic clock signal SHC is typically provided by such adjacent circuit. In embodiments in which the periodic error is due to mismatches between constituent digital-to-analog converters of digital-to-analog converter 204, sub-harmonic clock signal SHC is provided by digital-to-analog converter 204. Correction value output 226 is connected to the second input 214 of summing element 210.

Optional rounding circuit 230 has an input 232 and an output 234. Input 232 is connected to the output 216 of summing element 210. Output 234 is connected to the input of digital-to-analog converter 204. In an example, rounding circuit 230 performs a simple truncation. In other examples, rounding circuit 230 performs a more sophisticated rounding process.

Offset correction value source 220 cyclically outputs offset correction values to summing element 210 at a rate defined by conversion clock signal CC and with a timing defined by conversion clock signal CC and sub-harmonic clock signal SHC. The duration of each output cycle of offset correction value source 220 is equal to that of the sub-harmonic clock periods shown in FIG. 5B. As noted above, sub-harmonic clock signal SHC has a periodicity equal to that of the periodic offset error of digital-to-analog converter 204 shown in FIG. 5C and is locked in phase thereto. The number N of correction values output to summing element 210 in each output cycle is equal to the number N of the sub-harmonic of the conversion frequency, i.e., four in this example. This corresponds to the number of conversion clock periods in each sub-harmonic clock period. Each output cycle begins in response to a transition of sub-harmonic clock signal SHC. In the example shown, the transition is a positive-going transition.

In an example, correction value source 220 is composed of memory and a suitable memory controller (not shown). The memory has sufficient capacity to store one correction value for each conversion clock period in one sub-harmonic clock period. In other words, the memory has sufficient capacity to store N correction values. Read-only memory, a shift register or another suitable type of memory may be used as the memory. In some applications, the read-only memory is programmable to allow individual calibration and/or re-calibration of modified digital signal generator 206. The memory controller operates in response to conversion clock signal CC and sub-harmonic clock signal SHC to cause the memory to output one correction value each conversion clock period. Operation of the memory is locked in phase to the periodic offset error of digital-to-analog converter 204 by the sub-harmonic clock signal.

Figure 5A:
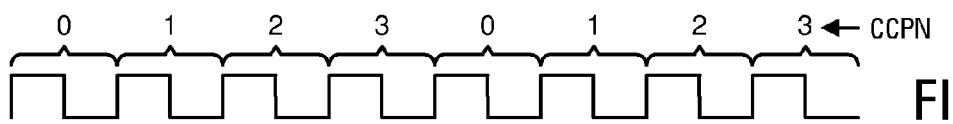
FIGS. 5A-5D are graphs illustrating periodic offset error mitigation in the digital-to-analog conversion system shown in FIG. 4.
Figure 5B:
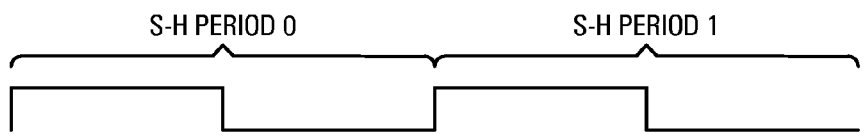

FIGS. 5A and 5B are graphs showing respective examples of the conversion clock signal CC of digital-to-analog converter 204 and sub-harmonic clock signal SHC, as described above. Sub-harmonic clock signal SHC has a periodicity equal to that of the periodicity of the periodic error of digital-to-analog converter 204 and is locked in phase thereto. In the example shown, the error of digital-to-analog converter 204 has a periodicity equal to that of the fourth sub-harmonic of the conversion frequency, i.e., the frequency of conversion clock signal CC. Consequently, the frequency of sub-harmonic clock signal SHC is one-fourth of that of conversion clock signal CC. Other examples (not shown) have error periodicities equal to those of other sub-harmonics of the conversion clock signal. FIG. 5B shows two periods of sub-harmonic clock signal SHC. FIG. 5A also shows the conversion clock period number CCPN of each conversion clock period. References in this disclosure to a conversion clock period number (CCPN) will be taken to refer to the number of the conversion clock period within each sub-harmonic clock period. Thus, in the example shown, the conversion clock periods in each sub-harmonic clock period have conversion clock period numbers 0 through 3, respectively.

Figure 5C:
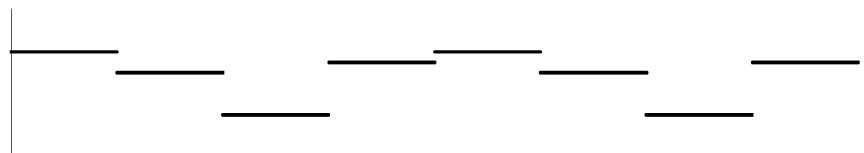

FIG. 5C is a graph in which the offset error of digital-to-analog converter 204 is plotted against conversion clock period number over two periods of sub-harmonic clock signal SHC that indicates the periodicity of the periodic offset error. FIG. 5C shows how the offset error of digital-to-analog converter 204 differs from period-to-period of conversion clock signal CC with a pattern that repeats every sub-harmonic clock period. Thus, identical offset errors occur in conversion clock periods with the same conversion clock period number.

Figure 5D:
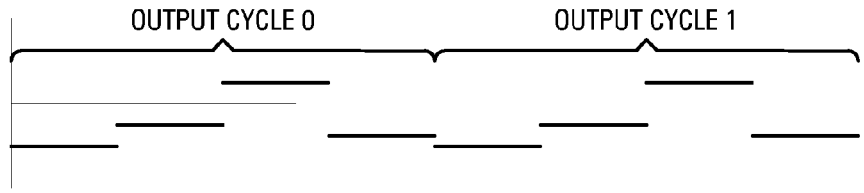

The offset correction value output by correction value source 220 in each conversion clock period is a digital value that represents an analog level complementary to the offset error of digital-to-analog converter 204 in the same conversion clock period. To a first approximation, the analog level is equal in magnitude and opposite in sign to the offset error. FIG. 5D is a graph showing an example of the analog levels represented by the correction values output by correction value source 220 in the example in which the periodic error of digital-to-analog converter 204 is a periodic offset error having a periodicity equal to that of the fourth sub-harmonic of the conversion frequency. In FIG. 5D, the analog levels represented by the correction values are plotted against the conversion clock period number over two sub-harmonic clock periods, which correspond to two output cycles of offset correction value source 220. FIG. 5D shows how the analog level represented by the offset correction value output by correction value source 220 in each conversion clock period is complementary to the offset error of digital-to-analog converter 204 in the same conversion clock period. FIG. 5D also shows how the analog levels represented by the correction values output by correction value source 220 differ from period-to-period of conversion clock signal CC within each output cycle of conversion value source 220. FIG. 5D also shows how the analog levels repeat every four conversion clock periods (corresponding to the fourth sub-harmonic). Thus, the correction values output by the correction value source in conversion clock periods having the same conversion clock period number are identical.

The offset correction values cyclically output by correction value source 220 collectively constitute the dynamic digital mitigation component of the modified digital signal generated by modified digital signal generator 240. Summing element 210 incorporates the dynamic digital mitigation component and the digital input signal received at digital input 202 into the modified digital signal output by modified digital signal generator 240.

In operation, summing element 210 receives the digital input signal at input 212. The digital input signal is a sequence of n-bit values that will be referred to as digital input signal values. The digital input signal values are received at a rate equal to the frequency of conversion clock signal CC. Summing element 210 additionally receives the offset correction values cyclically output by offset correction value source 220 at the same rate and locked in phase to the periodic error of digital-to-analog converter 204 by sub-harmonic clock signal SHC. Summing element 210 sums the correction values and respective digital input signal values to generate respective values of the modified digital signal. Values of the modified digital signal will be referred to as modified digital signal values. The modified digital signal values are output to optional rounding circuit 230. When present, rounding circuit 230 applies rounding to the modified digital signal values to match the input width of digital-to-analog converter 204. Rounding circuit 230 then outputs a resulting rounded modified digital signal to digital-to-analog converter 204. Otherwise, summing element 210 outputs the modified digital signal directly to digital-to-analog converter 204. Rounding circuit 230 may alternatively truncate the modified digital signal values to match the input width of digital-to-analog converter 204.

Figure 6:
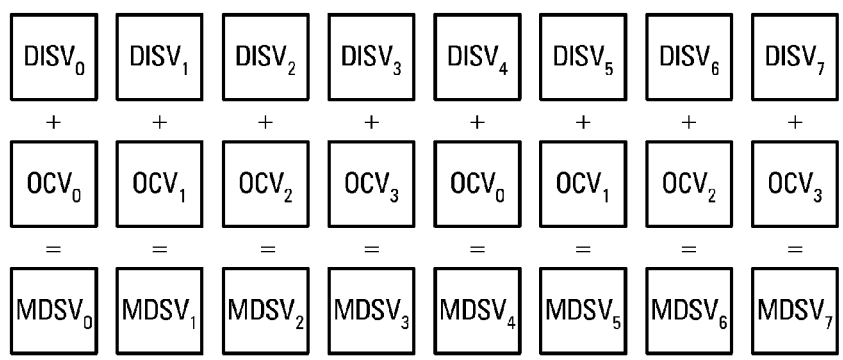
FIG. 6 is a schematic drawing illustrating the summing performed by the summing element of the example shown in FIG. 4 during two output cycles of the offset correction value store.

FIG. 6 is a schematic drawing illustrating the summing performed by summing element 210 during two output cycles of offset correction value store 220 shown in FIG. 4 and corresponding to the two periods of sub-harmonic clock signal SHC shown in FIG. 5B. The elements of FIG. 6 are aligned column-wise with the conversion clock signal CC shown in FIG. 5A and sub-harmonic clock signal SHC shown in FIG. 5B. During a first output cycle of correction value source 220 performed during period 0 of sub-harmonic clock signal SHC, summing element 210 sequentially receives four digital input signal values $DISV_0$ through $DISV_3$ and sequentially receives four offset correction values $OCV_0$ through $OCV_3$, respectively. Each digital input signal value and its respective offset correction value are received in a respective conversion clock period. The summing element sums digital input signal values $DISV_0$ through $DISV_3$ and offset correction values $OCV_0$ through $OCV_3$, respectively, to generate four values $MDSV_0$ through $MDSV_3$, respectively, of the modified digital signal. During a second output cycle of correction value source 220 performed during period 1 of sub-harmonic clock signal SHC, summing element 210 sequentially receives four further values $DISV_4$ through $DISV_7$ of the digital input signal and again sequentially receives the four offset correction values $OCV_0$ through $OCV_3$, respectively. Again, each digital input signal value and its respective offset correction value are received in a respective conversion clock period. The summing element sums digital input signal values $DISV_4$ through $DISV_7$ and offset correction values $OCV_0$ through $OCV_3$, respectively, to generate four further values $MDSV_4$ through $MDSV_7$, respectively, of the modified digital signal.

Summing the offset correction values cyclically output by offset correction value source 220 and respective digital input signal values generates the modified digital signal that periodically differs from the digital input signal in a manner that mitigates the periodic offset error of digital-to-analog converter 204. Consequently, in response to the modified digital signal, digital-to-analog converter 204 generates an analog output signal in which the periodic offset error is mitigated, i.e., digital-to-analog converter 204 generates an analog output signal in which the periodic offset error is substantially reduced.

The dynamic range of the analog levels represented by the offset correction values is substantially less than that of the first analog signal represented by the digital input signal. In a typical example, the dynamic range represented by the correction values is one-sixteenth of that of the first analog signal represented by the digital input signal. Hence, the correction values are typically composed of fewer bits than the digital input signal values. In an example, the digital input signal is composed of 14-bit values and the correction values are 10-bit values so that the dynamic range represented by the correction values is one-sixteenth of that represented by the digital input signal.

In embodiments that include rounding circuit 230, offset correction values having a greater resolution than the digital input signal values are used. In the above example, using 13-bit correction values instead of 10-bit correction values increases the resolution of the correction values and, hence, the resolution of the modified digital signal values, to one-eighth of the least-significant bit of the digital input signal values. Rounding circuit 230 rounds each sum value generated by summing circuit 210 to the nearest 14-bit value to generate a corresponding rounded modified digital signal value. Using offset correction values with a greater resolution than the digital input signal values and applying rounding increases the resolution of the periodic error mitigation to less than one least-significant bit of the digital input signal values. Rounding circuit 230 may be omitted in embodiments in which the resolution of the correction values is equal to that of the digital input signal values.

One way of determining the offset correction values stored in offset correction value source 220 begins by measuring the periodic offset error of digital-to-analog converter 204. In an example, a digital input signal representing a static first analog signal is supplied to the digital input of digital-to-analog converter 204 and a difference between the analog output signal generated by digital-to-analog converter 204 and the first analog signal is measured for each conversion clock period in one sub-harmonic clock period. In other words, a difference is measured for each conversion clock period number. For convenience, a digital input signal representing a static first analog signal having a level of zero can be supplied. In this case, deviations of the analog output signal segments from a level of zero represent respective offset errors. Measurement of the levels of the analog output signal segments begins in the first conversion clock period after the transition of sub-harmonic clock signal SHC that marks the beginning of the output cycle of offset correction value source 220. Only the levels of the analog output signal segments output in one sub-harmonic clock period (four analog signal segments in the example described above with reference to FIGS. 5A-5D and 6) need be measured to determine respective offset correction values. However, it is typically desirable to measure the levels of the analog output signal segments in more than one sub-harmonic clock period to ensure that the levels are consistent and that the periodicity of the offset error is not twice (or more) the periodicity supposed.

Once the analog levels of the analog output signal segments have been measured, the analog levels are inverted in sign, the sign-inverted analog levels are converted to digital values that provide respective digital offset correction values. The digital offset correction values are then stored in the appropriate locations in offset correction value source 220. In embodiments that incorporate rounding circuit 230, the sign-inverted analog levels are converted to respective digital offset correction values with a resolution greater than that of the digital input signal values, as described above. The digital offset correction values are stored in correction value source 220 in storage locations such that, in each conversion clock period in one sub-harmonic clock period, the offset correction value output from that storage location represents an analog signal complementary to the periodic offset error of digital-to-analog converter 204 in the same conversion clock period. Such offset correction value, when combined with the digital input signal and input to digital-to-analog converter 204 in the respective conversion clock period mitigates the offset error of digital-to-analog converter 204 in that conversion clock period.

Figure 7A:
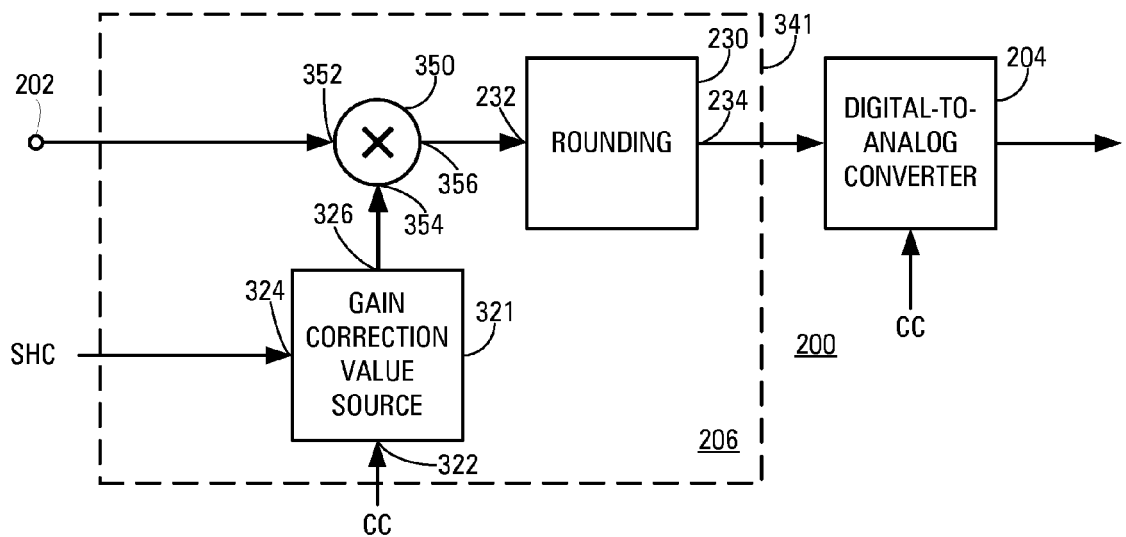
FIG. 7A is a block diagram showing a first example of a digital-to-analog conversion system in which a periodic gain error is mitigated.

FIG. 7A is a block diagram showing a first example of digital-to-analog conversion system 200 in accordance with an embodiment of the invention. The example of digital-to-analog conversion system 200 shown comprises an embodiment of digital-to-analog converter 204 subject to a periodic gain error, and an embodiment 341 of modified digital signal generator 206 that mitigates such periodic gain error. A periodic gain error manifests itself as a difference between the level of the analog output signal output by digital-to-analog converter 204 and the level of the first analog signal represented by the digital input signal input to digital-to-analog conversion system 200. The level difference due to a gain error depends on the level of the first analog signal represented by the digital input signal. Thus, a periodic gain error is an example of a signal-dependent periodic error. With a digital input signal representing a dynamic analog signal, a periodic gain error additionally manifests itself as unwanted images in the spectrum of the analog output signal output by digital-to-analog converter 204. The unwanted images are offset in frequency from the wanted image by multiples of $F_s/N$, where $F_s$ is the conversion frequency of digital-to-analog converter 204. Elements of the embodiment of modified digital signal generator 341 shown in FIG. 7A that correspond to elements of modified digital signal generator 240 shown in FIG. 4 are indicated using the same reference numerals and will not be described again in detail.

Modified digital signal generator 341 is composed of a multiplier 350, a gain correction value source 321 and rounding circuit 230.

Gain correction value source 321 has a clock input 322, a synchronization input 324 and a correction value output 326. Clock input 322 is connected to receive conversion clock signal CC. Synchronization input 324 is connected to receive sub-harmonic clock signal SHC having a periodicity equal to that of the periodic gain error of digital-to-analog converter 204 and locked in phase thereto. Gain correction value source 321 is similar in structure and operation to offset correction value source 220 described above with reference to FIG. 4 but the gain correction values cyclically output by correction value source 321 differ from the offset correction values output by offset correction value source 220. Specifically, in this example, the gain correction values are values near unity and have at least the same resolution as the digital input signal values received at digital input 202. The gain correction values typically have a greater resolution than the digital input signal values, as described above.

Multiplier 350 has a first input 352, a second input 354 and an output 356. First input 352 is connected to digital input 202 to receive successive digital input signal values. Second input 354 is connected to the correction value output 326 of gain correction value source 321 to receive the N gain correction values cyclically output by the gain correction value source. Output 356 is connected to the input 232 of rounding circuit 230.

In operation, multiplier 350 multiplies the gain correction values cyclically output by gain correction value source 321 and respective digital input signal values received from digital input 202 to generate respective values of the modified digital signal that it outputs to rounding circuit 230. The multiplication operation performed by multiplier 350 generates the modified digital signal values with more bits than the input width of digital-to-analog converter 204. Rounding circuit 230 applies rounding to the modified digital signal to reduce the number of bits to equal the input width of digitalto-analog converter 204 and outputs a rounded modified digital signal to digital-to-analog converter 204.

Figure 7B:
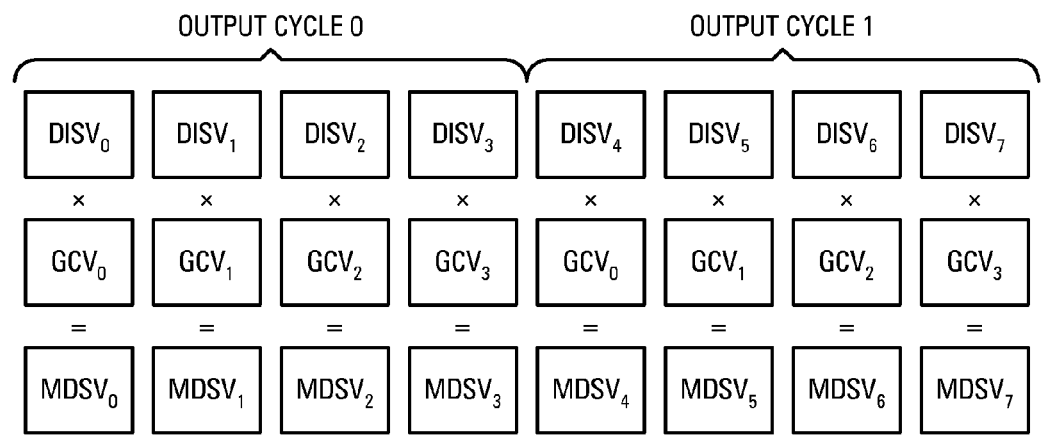
FIG. 7B is a schematic drawing illustrating the multiplying performed by the multiplier of the example shown in FIG. 7A during two output cycles of the gain correction value store.

FIG. 7B is a schematic drawing illustrating the multiplying performed by multiplier 350 during two output cycles of gain correction value store 321 shown in FIG. 7A corresponding to the two periods of sub-harmonic clock signal SHC shown in FIG. 5B. During a first output cycle of gain correction value source 321 performed during period 0 of sub-harmonic clock signal SHC, multiplier 350 sequentially receives four digital input signal values $DISV_0$ through $DISV_3$ and additionally receives four gain correction values $GCV_0$ through $GCV_3$, respectively. Each digital input signal value and its respective gain correction value are received in a respective conversion clock period. The multiplier multiplies digital input signal values $DISV_0$ through $DISV_3$ and gain correction values $GCV_0$ through $GCV_3$, respectively, to generate four values $MDSV_0$ through $MDSV_3$, respectively, of the modified digital signal. During a second output cycle of gain correction value source 321 performed during period 1 of sub-harmonic clock signal SHC, multiplier 350 sequentially receives four further values $DISV_4$ through $DISV_7$ of the digital input signal and again additionally receives the four gain correction values $GCV_0$ through $GCV_3$, respectively. Again, each digital input signal value and its respective gain correction value are received in a respective conversion clock period. The multiplier multiplies digital input signal values $DISV_4$ through $DISV_7$ and gain correction values $GCV_0$ through $GCV_3$, respectively, to generate four further values $MDSV_4$ through $MDSV_7$, respectively, of the modified digital signal.

Multiplying the gain correction values cyclically output by gain correction value source 220 and respective digital input signal values generates the modified digital signal that periodically differs from the digital input signal in a manner that mitigates the periodic gain error of digital-to-analog converter 204. Consequently, in response to the modified digital signal, digital-to-analog converter 204 generates an analog output signal in which the periodic gain error is mitigated, i.e., digital-to-analog converter 204 generates an analog output signal in which the periodic gain error is substantially reduced.

One way in which the gain correction values stored in gain correction value source 321 are determined starts by measuring the periodic gain error of digital-to-analog converter 204. In an example, a digital input signal representing two different static levels of the first analog signal is supplied to the digital input of digital-to-analog converter 204 and, for each level of the first analog signal represented by the digital input signal, the level of the respective analog output signal segment output by digital-to-analog converter 204 is measured in each conversion clock period in one sub-harmonic clock period. Typically, the static levels of the first analog signal are a level of zero and a level near full-scale. Measurement of the levels of the analog output signal segments begins in the first conversion clock period after the transition of sub-harmonic clock signal SHC that marks the beginning of the output cycle of gain correction value source 321. Only the levels of the analog output signal segments output in one sub-harmonic clock period (four segments in the example described above with reference to FIG. 7B) need be measured. However, it is typically desirable to measure the levels of the analog output signal segments in more than one sub-harmonic clock period to ensure that the levels are consistent and that the periodicity of the periodic gain error is not twice (or more) the periodicity supposed. Moreover, it may additionally be desirable to perform additional measurements with a digital input signal representing more than two static levels of first analog signal to ensure that the gain error is linear. Small amounts of gain non-linearity can be dealt with by averaging.

The above-described measurement process provides two analog signal segment level measurements for each conversion clock period number, i.e., for each conversion clock period in the sub-harmonic clock period. A gain correction value for each conversion clock period number is calculated from the respective analog signal segment level measurements as follows. The difference between the two static levels of the first analog signal represented by the digital input signal is calculated to provide an input level difference. Then, for each conversion clock period number, an output level difference between the respective analog signal segment level measurements is calculated, and the input level difference is divided by the output level difference to provide a respective analog gain correction value.

The analog gain correction values provided by the above-described measurement and calculation process are converted to digital values that provide respective digital gain correction values. The digital gain correction values are then stored in the appropriate locations in gain correction value source 321. The analog gain correction values are converted to respective digital gain correction values typically having a resolution greater than the resolution of the digital input signal values, as described above. The digital gain correction values are stored in gain correction value source 321 in storage locations such that, in each conversion clock period, the gain correction value output from that storage location and multiplied with the respective digital input signal value by multiplier 350 will generate a respective modified digital signal value that differs from the digital input signal value by a difference that mitigates the periodic gain error of digital-to-analog converter 204 in the same conversion clock period.

As noted above, the gain correction values output by gain correction value source 321 are values near unity. Consequently, each can be regarded as being composed of a value of unity and a difference value that represents the difference between the gain correction value and unity. Multiplying the digital input signal by unity generates a digital input signal component of the modified digital signal. Multiplying the digital input signal values by the respective difference values generates values of the dynamic digital mitigation component of the modified digital signal. The structures of the gain correction value source and the multiplier can be simplified by separately generating the digital input signal component and the dynamic digital mitigation component of the modified digital signal and incorporating these components into the modified digital signal, as will be described next with reference to FIGS. 8A and 8B.

Figure 8A:
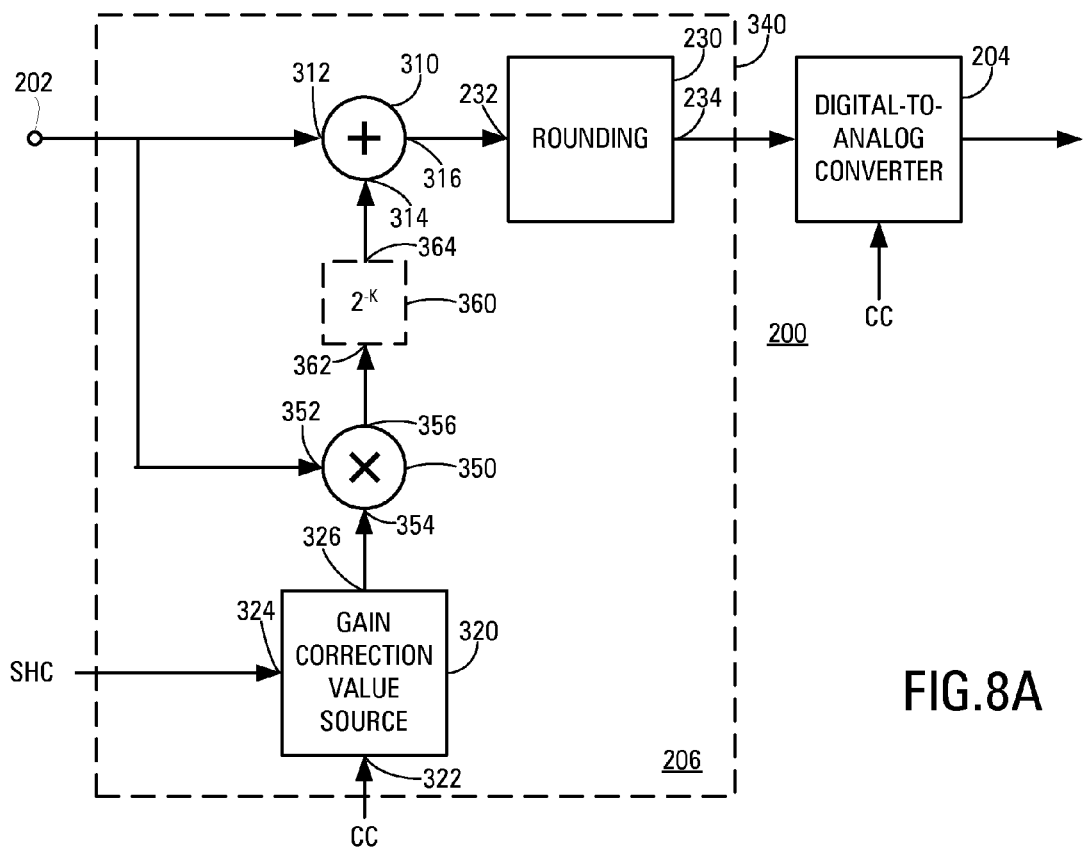
FIG. 8A is a block diagram showing a second example of a digital-to-analog conversion system in which a periodic gain error is mitigated.

FIG. 8A is a block diagram showing a second example of digital-to-analog conversion system 200 in accordance with an embodiment of the invention. The example of digital-to-analog conversion system 200 shown comprises an embodiment of digital-to-analog converter 204 subject to a periodic gain error, and an embodiment 340 of modified digital signal generator 206 that mitigates such periodic gain error. Elements of the embodiment of modified digital signal generator 340 shown in FIG. 8A that correspond to elements of modified digital signal generator 240 described above with reference to FIG. 4 and modified digital signal generator 341 described above with reference to FIG. 7A are indicated using the same reference numerals and will not be described again in detail.

Modified digital signal generator 340 is composed of a summing element 310, a gain correction value source 320, an optional scaling element 360 and rounding circuit 230. Summing element 310 has a first input 312, a second input 314 and an output 316. First input 312 is connected to digital input 202. Output 316 is connected to the input 232 of rounding circuit 230.

Gain correction value source 320 is similar in structure and operation to offset correction value source 220 described above with reference to FIG. 4 but the gain correction values cyclically output by gain correction value source 320 differ from the offset correction values output by offset correction value source 220. The gain correction values typically have a greater resolution than the digital input signal values, as described above. The gain correction values are typically small, and are therefore typically scaled by a factor of $2^K$. This allows each gain correction value to be represented using fewer bits and allows multiplier 350 to use simpler hardware. Modified digital signal generator 340 includes scaling element 360 when the gain correction values are scaled.

In multiplier 350, first input 352 is connected to digital input 202 to receive successive digital input signal values. Second input 354 is connected to the correction value output 326 of gain correction value source 320 to receive the N gain correction values cyclically output by the gain correction value source.

Scaling element 360 has an input 362 and an output 364. Input 362 is connected to the output 356 of multiplier 350. Output 364 is connected to the second input 314 of summing element 310. Scaling element 360 scales by a factor of $2^{-K}$.

The product values generated by multiplier 350 and scaled by scaling element 360, if present, have more bits than the input width of the second input 314 of summing element 310. A rounding element (not shown) may be located ahead of second input 314 to round the product values to a bit width equal to or greater than that of the digital input signal values received at the first input 312 of summing element 310. In embodiments in which the rounding element rounds to a bit width equal to that of the digital input signal values, rounding circuit 230 may be omitted.

Modified digital signal generator 340 and the modified digital signal generators described below typically additionally comprise one or more delay elements (not shown) that align in time the values processed by the various circuit elements.

In operation, multiplier 350 multiplies the gain correction values cyclically output by gain correction value source 320 and respective digital input signal values received from digital input 202 to generate respective product values. Optional scaling element 360 scales the product values by a factor of $2^{-K}$ to reverse the scaling applied to the gain correction values. As noted above, scaling element 360 is omitted when the gain correction values are not scaled. Summing element 310 sums the scaled product values received from scaling element 360 and respective digital input signal values received from digital input 202 to generate respective modified digital signal values that it outputs to rounding circuit 230. Rounding circuit 230 applies rounding to the modified digital signal and outputs a rounded modified digital signal to digital-to-analog converter 204. Otherwise, summing element 310 outputs the modified digital signal directly to digital-to-analog converter 204.

The scaled product values output by scaling element 360 collectively constitute the dynamic digital mitigation component of the modified digital signal generated by modified digital signal generator 340. Summing element 310 incorporates the dynamic digital mitigation component and the digital input signal received at digital input 202 into the modified digital signal output by modified digital signal generator 340.

Figure 8B:
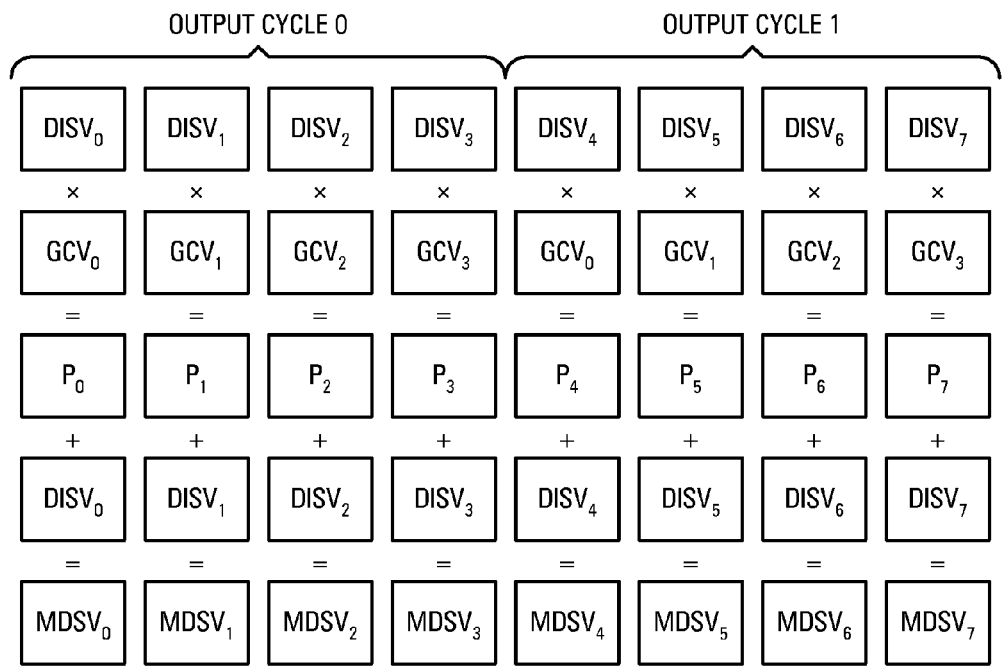
FIG. 8B is a schematic drawing illustrating the multiplying and summing performed by the multiplier and summing element, respectively, of the example shown in FIG. 8A during two output cycles of the gain correction value store.

FIG. 8B is a schematic drawing illustrating the processing performed by summing element 310 and multiplier 350 during two output cycles of gain correction value source 320 shown in FIG. 8A corresponding to the two periods of sub-harmonic clock signal SHC shown in FIG. 5B. In the example shown, to simplify the explanation, the gain correction values are not scaled and scaling element 360 is therefore omitted. During a first output cycle (labelled output cycle 0) of gain correction value source 320 performed during the first sub-harmonic clock period, multiplier 350 receives four digital input signal values $DISV_0$ through $DISV_3$. Multiplier 350 additionally receives four gain correction values $GCV_0$ through $GCV_3$ output by correction value source 320. Multiplier 350 receives each digital input signal value and its respective correction value in a respective conversion clock period. The multiplier multiplies digital input signal values $DISV_0$ through $DISV_3$ and gain correction values $GCV_0$ through $GCV_3$, respectively, to generate product values $P_0$ through $P_3$ that it outputs to summing element 310. The summing element additionally receives digital input signal values $DISV_0$ through $DISV_3$ from digital input 202. The summing element sums digital input signal values $DISV_0$ through $DISV_3$ and product values $P_0$ through $P_3$ respectively, to generate four modified digital values $MDSV_0$ through $MDSV_3$, respectively.

During a second output cycle (labelled output cycle 1) of correction value source 320 performed during the second sub-harmonic clock period, multiplier 350 receives four further digital input signal values $DISV_4$ through $DISV_7$. Multiplier 350 again additionally receives the four gain correction values $GCV_0$ through $GCV_3$ output by correction value source 320. Again, the multiplier receives each digital input signal value and its respective correction value in a respective conversion clock period. The multiplier multiplies digital input signal values $DISV_4$ through $DISV_7$ and gain correction values $GCV_0$ through $GCV_3$, respectively, to generate four further product values $P_4$ through $P_7$ that it outputs to summing element 310. The summing element additionally receives the four further digital input signal values $DISV_4$ through $DISV_7$ from digital input 202. The summing element sums digital input signal values $DISV_4$ through $DISV_7$ and product values $P_4$ through $P_7$, respectively, to generate four further modified digital signal values $MDSV_4$ through $MDSV_7$, respectively.

One way in which the gain correction values stored in gain correction value source 320 are determined starts by using the measurement process described above with reference to FIGS. 7A and 7B. The measurement process provides two analog signal segment level measurements for each conversion clock period number, i.e., for each conversion clock period in the sub-harmonic clock period. A gain correction value for each conversion clock period number is calculated from the respective analog signal segment level measurements as follows. A difference between the two static levels of the first analog signal represented by the digital input signal is calculated to provide an input level difference. Then, for each conversion clock period number, an output level difference between the respective analog signal segment level measurements is calculated, the input level difference is subtracted from the output level difference to provide an analog level difference, the analog level difference is inverted in sign, the sign-inverted analog level difference is divided by the input level difference to provide a respective analog gain error, and the analog gain error is converted to a digital value that provides the respective gain correction value. Optionally, the gain correction value is obtained by scaling the digital value, as described above.

The digital gain correction values provided by the above-described measurement and calculation process are stored in the appropriate locations in gain correction value source 320. The analog gain errors are converted to respective digital gain correction values typically having a resolution greater than the resolution of the digital input signal, as described above. The digital gain correction values are stored in gain correction value source 320 in storage locations such that, in each conversion clock period, the gain correction value output from that storage location and processed by multiplier 350 and summing element 310 will generate a modified digital signal value that differs from the corresponding digital input signal value by a difference that mitigates the periodic gain error of digital-to-analog converter 204 in the same conversion clock period.

Figure 9:
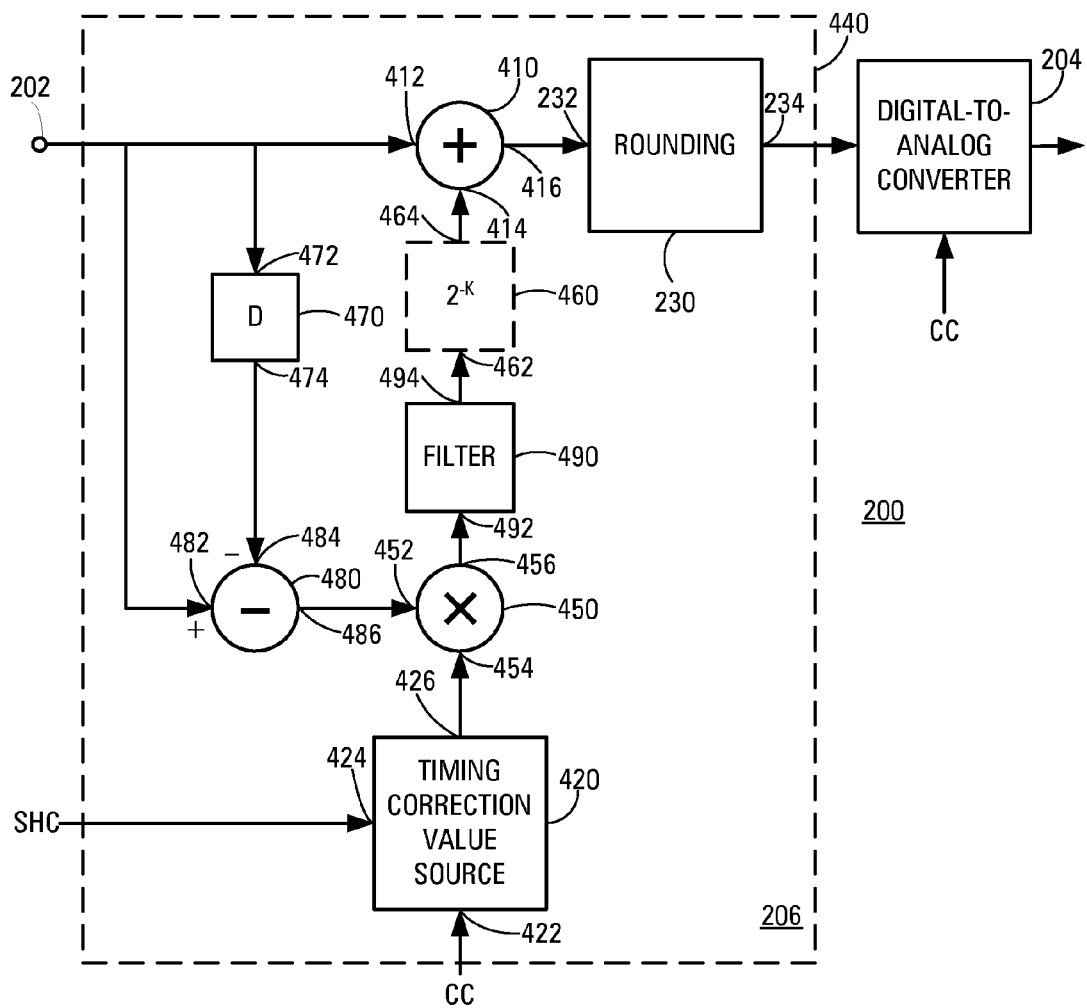
FIG. 9 is a block diagram showing an example of a digital-to-analog conversion system in which a periodic timing error is mitigated.

FIG. 9 is a block diagram showing an example of digital-to-analog conversion system 200 in accordance with an embodiment of the invention. The example of digital-to-analog conversion system 200 comprises an embodiment of digital-to-analog converter 204 subject to a periodic timing error, and an embodiment 440 of modified digital signal generator 206 that mitigates such timing error. A timing error manifests itself as a difference between the time during which digital-to-analog converter 204 outputs a segment of the analog output signal and the duration of the sampling period with which the first analog signal represented by the digital input signal value input to digital-to-analog converter 204 was sampled. Thus, a periodic timing error is an example of a signal-dependent periodic error. With a digital input signal representing a dynamic analog signal, a periodic timing error additionally manifests itself as unwanted images in the spectrum of the analog output signal of digital-to-analog converter 204. The unwanted images are offset in frequency from the wanted image by multiples of $F_s/N$, where $F_s$ is the conversion frequency of digital-to-analog converter 204. Elements of the embodiment of modified digital signal generator 440 shown in FIG. 9 that correspond to elements of modified digital signal generators 240, 340 and 341 described above with reference to FIG. 4, FIG. 8A and FIG. 7A, respectively, are indicated using the same reference numerals and will not be described again in detail.

As noted above, a timing error manifests itself as a shift in the timing of each analog signal segment output by the digital-to-analog converter 204. When the digital input signal represents a static first analog signal, such timing shift does not matter. As the frequency of the first analog signal represented by the digital input signal increases, the error introduced by the timing shift becomes more significant. The error energy is proportional to the timing shift multiplied by the level difference between consecutive segments of the analog output signal. Mitigating the timing error involves providing N correction values, where N is the number of conversion clock periods in each sub-harmonic clock period, and cyclically multiplying the correction values by respective differences between consecutive digital input signal values to generate respective product values.

The timing error is typically a small fraction of the duration of the segment of the analog output signal. If, for example, the edge of the segment is shifted in time by 1% of the width of the segment, the area of the segment is changed by 1%. Since an error segment that would result from subtracting the analog output signal segment from the corresponding segment of the first analog signal is very narrow, it has a very flat spectrum. However, the above-described timing error correction process corrects the timing error by making a small amplitude change to two adjacent analog signal segments. Effectively, the correction is shared between the analog signal segments bounding the incorrectly-timed transition. Consequently, the spectrum of a two-segment pulse has a response defined by $(\sin \pi x)/\pi x$, where $x=2f/F_s$, f is the frequency of the analog output signal and $F_s$ is the conversion frequency. This characteristic has a zero at a frequency equal to one-half the conversion frequency. At a frequency of 0.4 $F_s$, the response is down by 12 dB, which would limit the timing error reduction to about 3 dB. To overcome this problem, the product values are subject to filtering with a nominal inverse sinc filter characteristic, i.e., a nominal $\pi x/\sin \pi x$ filter characteristic, at least up to a frequency of about 0.4 $F_s$. In an example that incorporates such a filter, over 20 dB of timing error mitigation was obtained.

Modified digital signal generator 440 is composed of a summing element 410, a timing correction value source 420, a multiplier 450, an optional scaling element 460, a delay circuit 470, a differencing element 480, a filter 490 and rounding circuit 230. Summing element 410 has a first input 412, a second input 414 and an output 416. Timing correction value source 420 has a clock input 422, a synchronization input 424 and a correction value output 426. Clock input 422 is connected to receive conversion clock signal CC. Synchronization input 424 is connected to receive sub-harmonic clock signal SHC having a frequency corresponding to the periodicity of the periodic timing error of digital-to-analog converter 204 and locked in phase thereto. Timing correction value source 420 is similar in structure and operation to offset correction value source 220 described above with reference to FIG. 4 but timing correction value source 420 cyclically outputs timing correction values that differ from the offset correction values cyclically output by offset correction value source 220. The timing correction values typically have a greater resolution than the digital input signal values, as described above. The timing correction values are typically small, and are therefore typically scaled by a factor of $2^K$. This allows each gain correction value to be represented using fewer bits and allows multiplier 450 to use simpler hardware. Modified digital signal generator 440 includes scaling element 460 when the gain correction values are scaled.

Multiplier 450 has a first input 452, a second input 454 and an output 456. Second input 454 is connected to the output 426 of timing correction value source 420.

Delay circuit 470 has an input 472 and an output 474. Input 472 is connected to digital input 202 to receive successive digital input signal values. Delay circuit 470 has a delay equal to one conversion clock period.

Differencing element 480 has a non-inverting input 482, an inverting input 484 and an output 486. Non-inverting input 482 is connected to digital input 202 to receive digital input signal values. Inverting input 484 is connected to the output 474 of delay circuit 470. Output 486 is connected to the first input 452 of multiplier 450. For each digital input signal value, differencing element 480 subtracts each current digital input signal value and the immediately-preceding digital input signal value (delayed by delay circuit 470) to generate a respective difference value and outputs the difference value to multiplier 450.

Filter 490 has an input 492 and an output 494. Input 492 is connected to the output 456 of multiplier 450. Filter 490 has a nominal inverse sinc filter characteristic, i.e., a nominal $\pi x/\sin \pi x$ filter characteristic, where $x=2f/F_s$, as noted above. However, in many applications, superior results are obtained with the filter characteristic of filter 490 differs somewhat from the nominal inverse sinc characteristic. Such a filter characteristic will be referred to herein as a filter characteristic that approximates an inverse sinc filter characteristic. Moreover, a filter characteristic described as a filter characteristic that approximates an inverse sinc filter characteristic is to be understood to encompass the nominal inverse sinc filter characteristic.

Scaling element 460 has an input 462 and an output 464. Input 462 is connected to the output 494 of filter 490. Output 464 is connected to the second input 414 of summing element 410. Scaling element 460 scales by a factor of $2^{-K}$.

The product values generated by multiplier 450, filtered by filter 490 and scaled by scaling element 460, if present, have more bits than the input width of the second input 414 of summing element 410. A rounding element (not shown) may be located ahead of second input 414 to round the product values to a bit width equal to or greater than that of the digital input signal values received at the first input 412 of summing element 410. In embodiments in which the rounding element rounds to a bit width equal to that of the digital input signal values, rounding circuit 230 may be omitted.

In operation, differencing element 480 receives the current and preceding digital input signal values from digital input 202 directly and via delay circuit 470, respectively. Differencing element 480 subtracts each current digital input signal value and the immediately-preceding digital input signal value to generate a respective difference value and outputs the difference value to multiplier 450. Multiplier 450 multiplies the timing correction values cyclically output by timing correction value source 420 and respective difference values received from differencing element 480 to generate respective product values. Filter 490 filters the product values using a filter characteristic that approximates an inverse sinc filter characteristic to generate respective filtered product values. Scaling element 460 receives successive filtered product values from filter 490 and scales them by a factor of $2^{-K}$ to reverse the scaling applied to the timing correction values. Summing element 410 sums the scaled filtered product values received from scaling element 460 and respective digital input signal values received from digital input 202 to generate respective modified digital signal values. Summing element 410 outputs the respective modified digital signal values to optional rounding circuit 230. Rounding circuit 230 applies rounding to the modified digital signal and outputs a rounded modified digital signal to digital-to-analog converter 204.

The scaled, filtered product values output by scaling element 460 collectively constitute the dynamic digital mitigation component of the modified digital signal generated by modified digital signal generator 440. Summing element 410 incorporates the dynamic digital mitigation component and the digital input signal received at digital input 202 into the modified digital signal output by modified digital signal generator 440.

One way of determining the timing correction values stored in timing correction value source 420 begins with generating a digital input signal that represents a first analog signal having a frequency in the Nyquist region for which the timing correction values are being determined. The digital input signal is input to the digital-to-analog conversion system 200 under test and additionally to a numerically-controlled oscillator (NCO). In response to the digital input signal, the NCO generates an analog signal that matches the first analog signal represented by the digital input signal substantially more closely than the analog output signal generated by digital-to-analog conversion system 200. The analog signal generated by the NCO is then subtracted from that generated by digital-to-analog conversion system 200 and the resulting error signal is fed into a spectrum analyzer. The complex amplitude of each sub-harmonic spur generated by digital-to-analog conversion system 200 is then measured using the spectrum analyzer. From this measurement, a set of initial timing correction values is determined. The initial timing correction values are stored in respective locations in timing correction value source 420, and the above-described measurement of the complex amplitudes of the sub-harmonic spurs is repeated. The resulting measurements are used to modify the set of initial timing correction values to generate a final set of timing correction values. More than one iteration may be needed.

Figure 10:
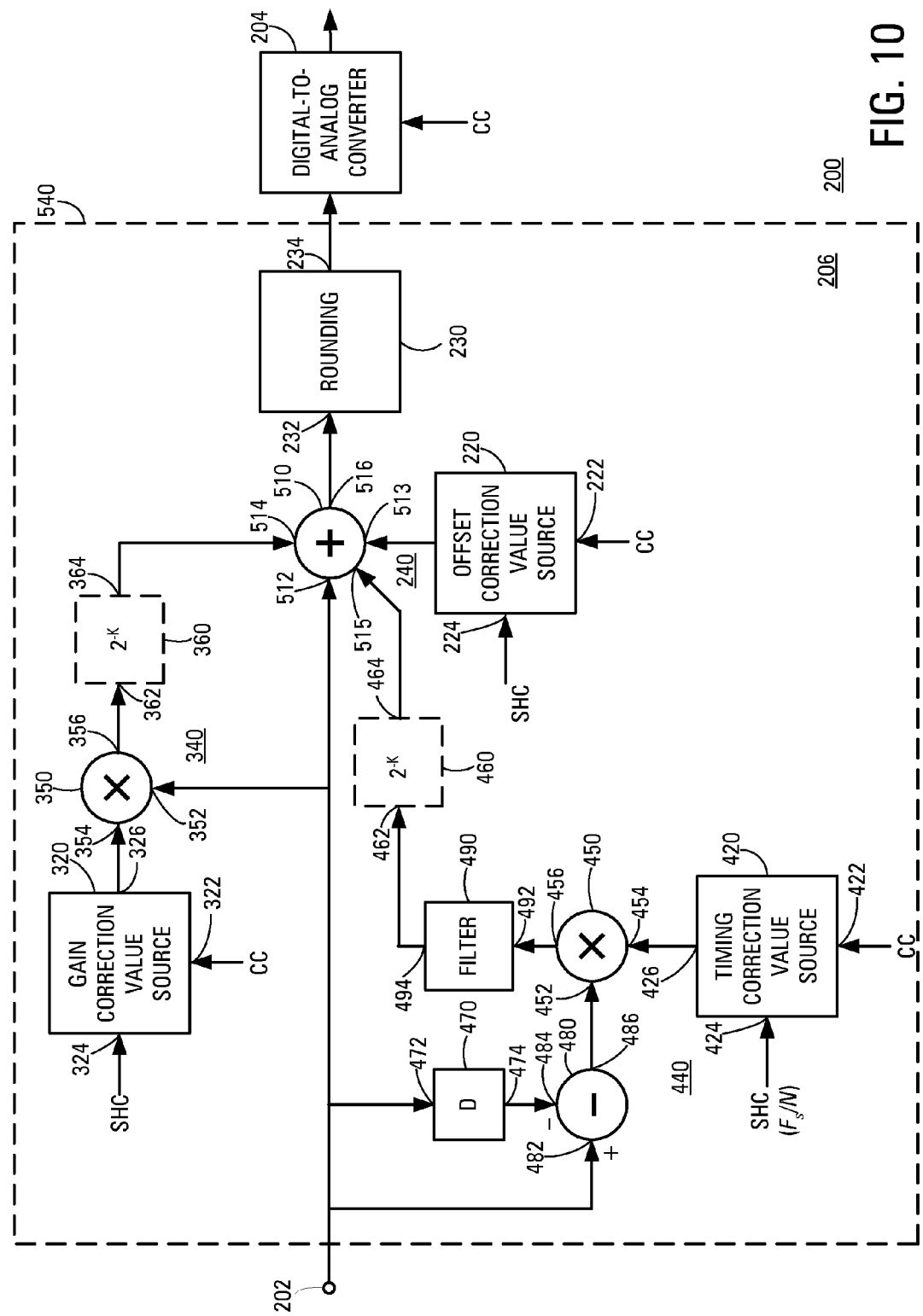
FIG. 10 is a block diagram showing an example of a digital-to-analog conversion system in which a periodic offset error, a periodic gain error and a periodic timing error are mitigated.

Typical digital-to-analog converters are subject to more than one type of periodic error. The periodic error mitigation schemes described above can be combined to mitigate the periodic error of a digital-to-analog converter having more than one type of periodic error. FIG. 10 is a block diagram showing an example of digital-to-analog conversion system 200 in accordance with an embodiment of the invention. The example of digital-to-analog conversion system 200 shown comprises an embodiment of digital-to-analog converter 204 subject to a periodic offset error, a periodic gain error and a periodic timing error, and an embodiment 540 of modified digital signal generator 206 that mitigates such periodic offset error, periodic gain error and periodic timing error. Elements of modified digital signal generator 540 that correspond to elements of modified digital signal generators 240, 340 and 440 described above with reference to FIGS. 4, 8A and 9, respectively, are indicated using the same reference numerals and will not be described again in detail.

Modified digital signal generator 540 comprises above-described modified digital signal generators 440, 340 and 240 with a single summing element 510 substituted for summing elements 210, 310 and 410. Cascaded individual summing elements may alternatively be used. Summing element 510 has inputs 512, 513, 514 and 515 and an output 516. Input 512 is connected to digital input 202, input 513 is connected to the output of offset correction value source 220, input 514 is connected to the output 364 of optional scaling circuit 360, input 515 is connected to the output 464 of optional scaling circuit 460 and output 516 is connected to the input 232 of rounding circuit 230. Summing element 510 sums the offset corrections, the gain corrections, the timing corrections and the digital input signal to generate the modified digital signal. Modified digital signal generator 341 described above with reference to FIG. 7A may be interposed between the output 516 of summing element 510 and the input 232 of rounding circuit 230, in which case, modified digital signal generator 340 is omitted.

The correction values stored in offset correction value source 220, gain correction value source 320 and timing correction value source 420 can be determined using the processes described above with reference to FIGS. 4, 8A and 9, respectively, or other suitable processes.

In the example shown in FIG. 10, offset correction value source 220, gain correction value source 320 and timing correction value source 420 are shown as separate elements. Alternatively, offset correction value source 220, gain correction value source 320 and timing correction value source 420 may be combined. In each conversion clock period, such combined correction value source outputs an offset correction value, a respective gain correction value and a respective timing correction value in a single read operation. However, the offset correction value, the respective gain correction value and the respective timing correction value output in each read operation typically pertain to different conversion clock periods because processing delays cause the offset correction value, the gain correction value and the timing correction value for a given conversion clock period to be processed in different conversion clock periods. Similar timing considerations apply to embodiments having independent correction value sources for the offset correction value source, the gain correction value source and the timing correction value source, i.e., correction values pertaining to the same conversion clock period number are typically not output from the respective correction value sources in the same conversion clock period.

One way of determining the correction values stored in correction value sources 220, 320 and 420 uses procedures similar to those described above for determining offset correction values, gain correction values and timing correction values. In one example, offset correction values are determined first and are stored in offset correction value source 220, gain correction values are next determined and are stored in gain correction value source 320. Finally, timing correction values are determined and are stored in timing correction value source 420.

Portions of modified digital signal generator 540 may be omitted in embodiments suitable for use with embodiments of digital-to-analog converter 204 not subject to three types of periodic error. For example, offset gain correction source 220 may be omitted in embodiments of modified digital signal generator 540 suitable for use with embodiments of digital-to-analog converter 204 not subject to a periodic offset error.

Modified digital signal generator 540 generates modified digital signal values in response to respective digital input signal values and respective offset, gain and timing correction values using a respective calculation process for each type of periodic error. Alternatively, modified digital signal values may be determined in advance, at least in part, to reduce the processing that the modified digital signal generator has to perform to generate the modified digital signal. Calculating modified digital signal values in advance additionally allows periodic errors that are non-linearly signal dependent to be mitigated. Modified digital signal values that are determined before the corresponding digital input signal values are received by the modified digital signal generator will be regarded as being determined in advance.

Figure 11:
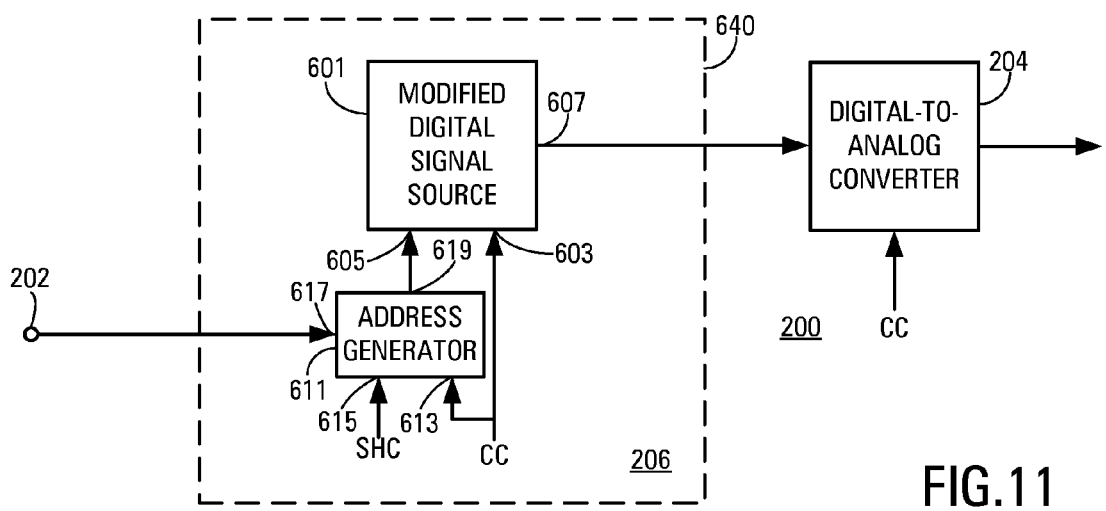
FIG. 11 is a block diagram showing an example of a digital-to-analog conversion system in which a periodic offset error and a periodic gain error are mitigated and the modified digital signal values are determined in advance.

FIG. 11 is a block diagram showing an example of digital-to-analog conversion system 200 in accordance with an embodiment of the invention. The example of digital-to-analog conversion system 200 shown comprises an embodiment of digital-to-analog converter 204 subject to a periodic offset error and a periodic gain error, and an embodiment 640 of modified digital signal generator 206 that mitigates such periodic offset error and periodic gain error using modified digital signal values that are determined in advance. The periodic gain error of digital-to-analog converter 204 may be non-linearly signal-dependent. Elements of modified digital signal generator 640 shown in FIG. 11 that correspond to elements of modified digital signal generator 240 described above with reference to FIG. 4 are indicated using the same reference numerals and will not be described again in detail.

Modified digital signal generator 640 is composed of a modified digital signal source 601 and an address generator 611. Modified digital signal source 601 has a clock input 603, an address input 605 and a modified digital signal output 607. Clock input 603 is connected to receive conversion clock signal CC. Modified digital signal output 607 is connected directly to the digital input of digital-to-analog converter 204.

Address generator 611 has a clock input 613, a synchronization input 615, a digital signal input 617 and an address output 619. Clock input 613 is connected to receive conversion clock signal CC. Synchronization input 615 is connected to receive sub-harmonic clock signal SHC having a periodicity equal to that of the periodic offset error and the periodic gain error of digital-to-analog converter 204 and locked in phase thereto. Digital signal input 617 is connected to digital input 202 to receive successive digital input signal values. Address output 619 is connected to the address input 605 of modified digital signal source 601. Address generator 611 operates in response to each digital input signal value received at digital input 202 and a respective conversion clock period number CCPN (FIG. 3D) to output an address to modified digital signal source 601. The conversion clock period number is defined by conversion clock signal CC and sub-harmonic clock signal SHC, as described above. The address output to digital signal source 601 is the address in modified digital signal source 601 where the modified digital signal value corresponding to the digital input signal value and the respective conversion clock period number is stored. In response to the address received at address input 605 and the conversion clock signal CC received at conversion clock signal input 603, modified digital signal source 601 outputs the respective modified digital signal value at modified digital signal output 607.

For each possible combination of conversion clock period number CCPN and digital input signal value, modified digital signal source 601 stores a respective modified digital signal value. Each modified digital signal value has the same number of bits as the digital input signal values and comprises a digital mitigation component. Each modified digital signal value is stored linked to its respective conversion clock period number and its respective digital input signal value. Thus, in an embodiment in which the digital input signal values are M-bit values and the periodic error of digital-to-analog converter 204 has a periodicity equal to that of the N-th sub-harmonic of the conversion frequency, modified digital signal source 601 stores $2^M \times N$ modified digital signal values. In an example in which the digital input signal values are 14-bit values and the periodic error of digital-to-analog converter 204 has a periodicity equal to that of the fourth sub-harmonic of the conversion frequency, modified digital signal source 601 stores $2^{14} \times 4 = 16{,}384 \times 4 = 5{,}536$ modified digital signal values.

Each modified digital signal value is determined in advance such that, when output from modified digital signal source 601 in response to a digital input signal value and the conversion clock period number and converted by digital-to-analog converter 204 to an analog signal segment in its respective conversion clock period, the analog signal segment is nominally identical in level to the first analog signal represented by the digital input signal value notwithstanding digital-to-analog converter 204 having a periodic gain error and a periodic offset error. Processes similar to those described above for determining offset correction values and gain correction values are performed to determine a modified digital signal value corresponding to each possible combination of digital input signal value and conversion clock period number.

As noted above, each modified digital signal value is stored in modified digital signal source 601 linked to a respective digital input signal value and a respective conversion clock period number. In an example, the linking is accomplished through an addressing scheme. However, other linking schemes are possible. In an address-based linking scheme, each modified digital signal value is stored at a specific address in modified digital signal source 601. Address generator 611 operates in response to the current digital input signal value, the sub-harmonic clock signal SHC and the conversion clock signal CC to provide an address to modified digital signal source. The address is the address in modified digital signal source 601 where the modified digital signal value corresponding to the current digital input signal value and the current conversion clock period number is stored. In response to this address and the conversion clock signal CC, modified digital signal source 601 reads out the modified digital signal value from that address and outputs the modified digital signal value at modified digital signal output 607.

In another example of modified digital signal generator 640, the output 607 of modified digital signal source 601 is connected to one input of a two-input summing element (not shown). The other input of the summing element is connected to digital input 202. The output of the summing element is connected to the input of digital-to-analog converter 204. In this arrangement, each memory location in modified digital signal source 601 stores a correction value instead of a respective modified digital signal value. Since a correction value ($\Delta$) has fewer bits than the respective modified digital signal value ($1+\Delta$), the storage capacity required in modified digital signal source is reduced. The summing element sums each digital input signal value received at digital input 202 and the respective correction value read out from modified digital signal source 601 to generate a respective modified digital signal value.

Figure 12:
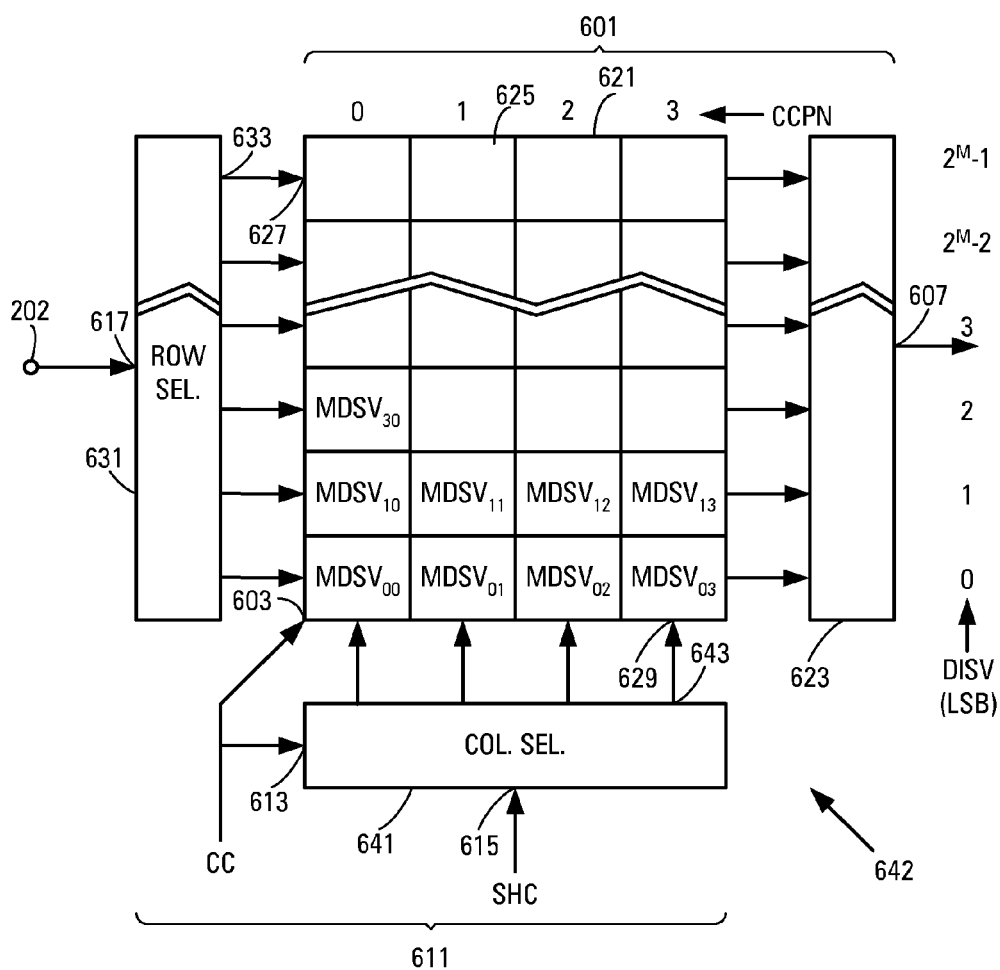
FIG. 12 is a block diagram showing an example of the modified digital signal source and the address generator of the digital-to-analog conversion system shown in FIG. 11.

FIG. 12 is a block diagram showing an example of modified digital signal source 601 and address generator 611. In this example, modified digital signal source 601 comprises a read-only memory 621 and a multiplexer 623. Read-only memory 621 comprises memory cells arranged in a two-dimensional array in which one dimension corresponds to digital input signal values and the other dimension corresponds to conversion clock period numbers. In the example shown, the rows of the array correspond to the digital input signal values (DISV) and the columns of the array correspond to the conversion clock period numbers (CCPN). An exemplary memory cell is shown at 625. Each memory cell stores a respective modified digital signal value. Memory 621 additionally has an input that provides the clock input 603 of modified digital signal source 601. In some embodiments, read-only memory 621 is a programmable read-only memory to allow individual calibration and/or recalibration.

Each row of memory 621 has an output connected to a respective input of multiplexer 623. Multiplexer 623 has an output that provides the modified digital signal output 607 of modified digital signal source 601.

Address generator 611 is composed of a row selector 631 and a column selector 641. Row selector 631 has row outputs that collectively provide part of the address output 619 (FIG. 1) of address generator 611. An exemplary row output is shown at 633. Each row output is coupled to a respective row input of memory 621. An exemplary row input is shown at 627. The row inputs of memory 621 collectively constitute part of the address input 605 of modified digital signal source 601. Row selector 631 additionally has a digital signal input that provides the digital signal input 617 of address generator 611.

Column selector 641 has column outputs that collectively provide the remainder of the address output 619 (FIG. 11) of address generator 611. An exemplary column output is shown at 643. Each column output is coupled to a respective column input of memory 621. An exemplary column input is shown at 629. The column inputs of memory 621 collectively constitute the remainder of the address input 605 of modified digital signal source 601. Column selector 641 additionally has a clock input and a synchronization input that provide the clock input 613 and the synchronization input 615, respectively, of address generator 611.

In operation, row selector 631 receives each digital input signal value and, in response thereto, activates a single row of memory 621 by means of an activation signal output via the respective one of row outputs 633. Additionally, column selector 641 receives sub-harmonic clock signal SHC and conversion clock signal CC and, in response, sequentially and cyclically activates a single one of the columns of memory 621 at a time. Specifically, in response to each, e.g., positive-going transition of sub-harmonic clock signal SHC, column selector activates column 0 of memory 621. Then, on the next N−1 successive, e.g., positive-going transitions of conversion clock signal CC, column selector 641 sequentially activates column 1 through column N−1 of memory 621.

Conversion clock signal CC received at clock input 603 causes memory 621 to output to multiplexer 623 the modified digital signal value stored in the memory cell 625 located at the intersection of the activated row and the activated column. Multiplexer 623 outputs the modified digital signal value at modified digital signal output 607.

The modified digital signal values that are stored in modified digital signal source 601 are determined in advance by inputting a static digital input signal representing a static first analog signal to digital-to-analog converter 204 and measuring the difference between the analog signal segment output by digital-to-analog converter 204 in each period of the conversion clock signal and the first analog signal. In each conversion clock period starting at the transition of sub-harmonic signal SHC, a respective correction value is added to the digital input signal. The correction value is varied until the difference between the analog signal segment output in the conversion clock period and the first analog signal is reduced to zero. This process generates a correction value for each conversion clock period. The correction value is then combined with the digital input signal value to generate a respective modified digital signal value. The process just described is performed for each possible digital input signal value. Each modified digital signal value generated by the process just described is then stored in modified digital signal source 601 linked to its respective digital input signal value and its respective conversion clock period number, as described above.

Above-described modified digital signal generator 640 can used as part of a modified digital signal generator that additionally mitigates a periodic timing error. In an example, a modified digital signal generator similar to modified digital signal generator 440 described above with reference to FIG. 9 is interposed between the modified digital signal output 607 of modified digital signal generator 640 and the input of digital-to-analog converter 204. In such an embodiment, modified digital signal source outputs an intermediate modified digital signal. Referring additionally to FIG. 9, the input 412 of the summing element 410 of additional modified digital signal generator 440 is connected to the modified digital signal output 607 of modified digital signal source 601. The input 472 of delay circuit 470 and the first input 482 of differencing element 480 are connected to the digital input 202 of modified digital signal generator 640. Summing element 410 sums the scaled, filtered product values output by scaling element 460 to respective intermediate modified digital signal values output by modified digital signal source 601 to generate respective modified digital signal values that additionally mitigate the periodic timing error of digital-to-analog converter 204.

Figure 13:
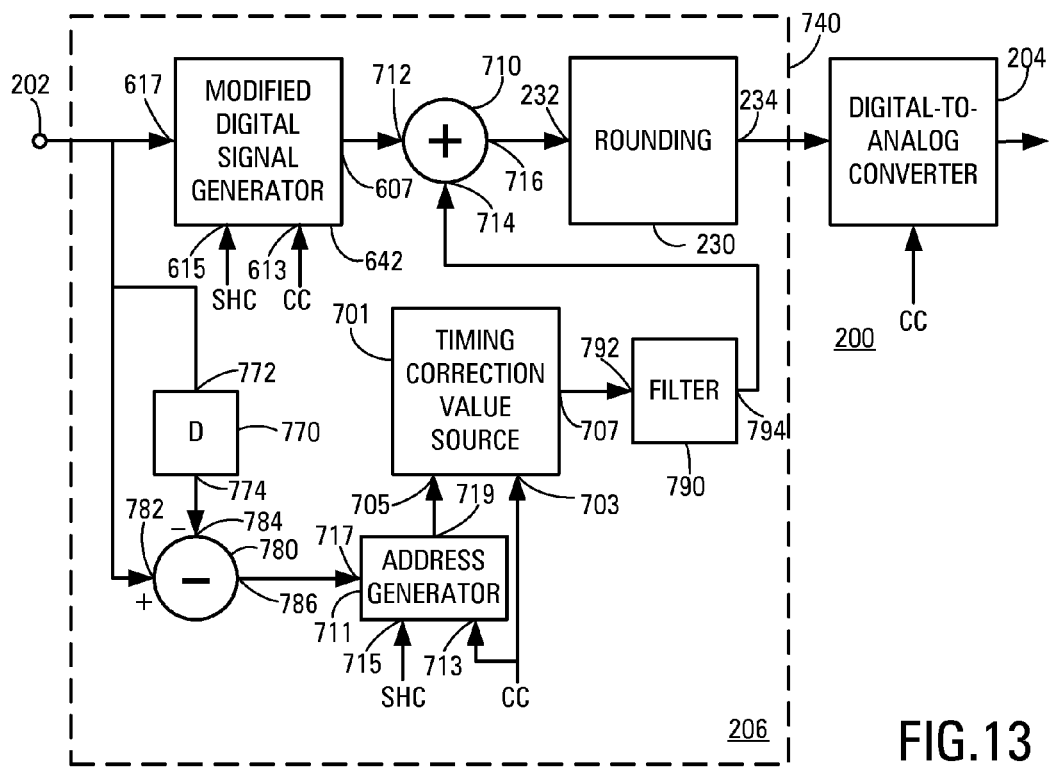
FIG. 13 is a block diagram showing an example of a digital-to-analog conversion system in which a periodic offset error, a periodic gain error and a periodic timing error are mitigated and the modified digital signal values are determined in advance.

FIG. 13 is a block diagram showing an example of digital-to-analog conversion system 200 in accordance with an embodiment of the invention. The example of digital-to-analog conversion system 200 shown comprises an embodiment of digital-to-analog converter 204 subject to a periodic offset error, a periodic gain error and a periodic timing error, and an embodiment 740 of modified digital signal generator 206 that mitigates the periodic offset error, periodic gain error and periodic timing error using modified digital signal values and timing correction values determined in advance. Modified digital signal generator 740 incorporates a modified digital signal generator similar to modified digital signal generator 640 described above with reference to FIG. 11 to generate an intermediate modified digital signal that would mitigate the periodic offset error and the periodic gain error of digital-to-analog converter 204 and incorporates a circuit similar in structure to modified digital signal generator 640 to provide timing correction values that are combined with the intermediate modified digital signal to generate a modified digital signal that mitigates the periodic offset error, the periodic gain error and the periodic timing error of digital-to-analog converter 204.

Modified digital signal generator 740 is composed of a modified digital signal generator 642, a timing correction value source 701, a summing element 710, an address generator 711, a delay circuit 770, a differencing element 780, a filter 790 and rounding circuit 230.

Modified digital signal generator 642 is substantially similar to modified digital signal generator 640 described above with reference to FIG. 11, but differs in that the modified digital signal values stored therein are intermediate modified digital signal values that may have more bits than the digital input signal values. Modified digital signal generator 642 operates in response to the digital input signal, the conversion clock signal CC and sub-harmonic clock signal SHC to output an intermediate modified digital signal at output 607. Such intermediate modified digital signal, if provided to digital-to-analog converter 204, would mitigate the periodic offset error and the periodic gain error of the digital-to-analog converter in a manner similar to that of modified digital signal generator 640 described above with reference to FIG. 11.

Timing correction value source 701 has a clock input 703, an address input 705 and a correction value output 707. Clock input 703 is connected to receive conversion clock signal CC. Timing correction value source 701 is similar in structure and operation to modified digital signal source 601 described above with reference to FIG. 11. For each possible conversion clock period number, timing correction value source 701 stores a respective timing correction value for each possible difference value between the current digital input signal value and the immediately-preceding digital input signal value. The timing correction values are similar to those used in modified digital signal generator 440 described above with reference to FIG. 9, i.e., they have fewer bits but a greater resolution than the digital input signal values. In some embodiments, the number of difference values for which a respective timing correction value is stored in timing correction value source 701 is equal to approximately twice the number of possible digital input signal values. In other embodiments, the number of difference values for which a respective timing correction value is stored in timing correction value source 701 is reduced by taking into account the maximum difference value that can exist between the current digital input signal value and the preceding digital input signal value in an actual digital input signal.

Address generator 711 has a clock input 713, a synchronization input 715, a difference value input 717 and an address output 719. Clock input 713 is connected to receive conversion clock signal CC. Synchronization input 715 is connected to receive sub-harmonic clock signal SHC having a periodicity corresponding to that of the periodic timing error of digital-to-analog converter 204 and locked in phase thereto. Address output 719 is connected to the address input 705 of timing correction value source 701. Timing correction value source 710 and address generator 711 collectively constitute a circuit structure similar to that of modified digital signal generator 640 described above with reference to FIG. 11. In some embodiments, timing correction value source 710 and address generator 711 are similar in structure to the example of modified digital signal generator 640 described above with reference to FIG. 12.

Summing element 710 has a first input 712, a second input 714 and an output 716. First input 712 is connected to the modified digital signal output 607 of modified digital signal generator 642. Output 716 is connected to the input 232 of rounding circuit 230.

Delay circuit 770 has an input 772 and an output 774. Input 772 is connected to digital input 202 to receive successive digital input signal values. Delay circuit 770 has a delay equal to one conversion clock period.

Differencing element 780 has a non-inverting input 782, an inverting input 784 and an output 786. Non-inverting input 782 is connected to digital input 202 to receive successive digital input signal values. Inverting input 784 is connected to the output 774 of delay circuit 770. Output 786 is connected to the difference value input 717 of address generator 711. For each digital input signal value, differencing element 780 subtracts the current digital input signal value and the immediately-preceding digital input signal value (delayed by delay circuit 770) to generate a respective difference value and outputs the difference value to address generator 711.

Filter 790 has an input 792 and an output 794. Input 792 is connected to the correction value output 707 of timing correction value source 701. Output 794 is connected to the second input 714 of summing element 710. Filter 790 has a filter characteristic that approximates an inverse sinc filter characteristic.

The timing correction values stored in timing correction value source 701 may be scaled, as described above. In this case, a scaling element (not shown) similar to scaling circuit 460 described above with reference to FIG. 9 is interposed between the output 794 of filter 790 and the second input 714 of summing element 710 in a manner similar to that described above. A rounding element (not shown) may be located ahead of the second input 714 of summing element 710 in a manner similar to that described above. In embodiments in which such rounding element rounds to a resolution equal to that of the modified digital signal values received at first input 712, rounding circuit 230 may be omitted.

Similar to modified digital signal generator 640 described above with reference to FIG. 11, modified digital signal generator 642 operates in response to each digital input signal value received at digital input 202 and the respective conversion clock period number to generate a respective value of the intermediate modified digital signal. Modified digital signal generator 642 outputs the intermediate modified digital signal to the first input 712 of summing element 710 via modified digital signal output 607. The intermediate modified digital signal, if supplied to digital-to-analog converter 204, would mitigate the periodic offset error and the periodic gain error of the digital-to-analog converter.

Additionally, differencing element 780 subtracts each current digital input signal value received at digital input 202 and the immediately-preceding digital input signal value delayed by delay circuit 770 to generate a respective difference value. Differencing element 780 outputs each difference value to the difference input 717 of address generator 711.

Similar to address generator 611 described above with reference to FIG. 11, address generator 711 operates in response to the difference value, the sub-harmonic clock signal SHC and the conversion clock signal CC to provide an address to the address input 705 of timing correction value source 701. The address is the address in timing correction value source 701 where the timing correction value corresponding to the difference value received at difference value input 717 and the respective conversion clock period number is stored. In response to the address and conversion clock signal CC received at clock input 703, timing correction value source 701 reads out the timing correction value stored at that address and outputs the timing correction value at timing correction output 707.

Similar to filter 490 described above with reference to FIG. 9, filter 790 receives successive timing correction values from timing correction output 707 of timing correction value source 701 and filters the timing correction values using a filter characteristic that approximates an inverse sinc filter characteristic to generate respective filtered timing correction values. Filter 790 outputs the filtered timing correction values to the second input 714 of summing element 710 via output 794.

Modified digital signal generator 642 delays the values of the intermediate modified digital signal output to summing element 710 such that each value of the intermediate modified digital signal arrives and the respective filtered timing correction value originating from the same digital input signal value arrive the first input 710 and the second input 712, respectively, of summing element 710 during the same operational cycle of summing element 710. Summing element 710 sums each value of the intermediate modified digital signal and the respective filtered timing correction value to generate a respective modified digital signal value. The modified digital signal mitigates not only the periodic gain and timing errors of digital-to-analog converter 204, but also mitigates the periodic timing error of digital-to-analog converter 204. Summing element 710 outputs the values of the modified signal to rounding circuit 230. Rounding circuit 230 applies rounding to the modified digital signal and outputs a rounded modified digital signal to digital-to-analog converter 204.

Figure 14:
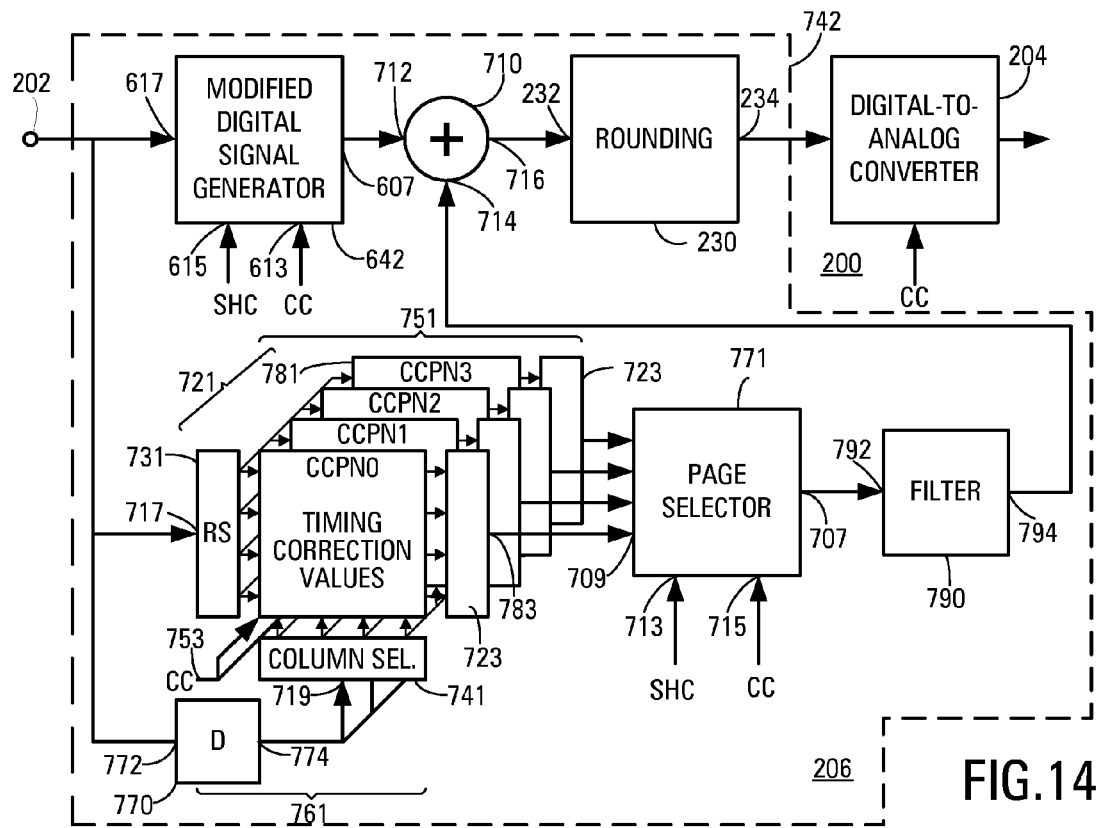
FIG. 14 is a block diagram showing an example of a digital-to-analog conversion system in which a periodic offset error, a periodic gain error and a periodic timing error are mitigated and in which modified digital signal values and timing correction values are determined in advance.

FIG. 14 is a block diagram showing an example of digital-to-analog conversion system 200 in accordance with an embodiment of the invention comprising an embodiment 742 of modified digital signal generator 206 that mitigates the periodic offset error, the periodic gain error and the periodic timing error of digital-to-analog converter 204 without the need to calculate difference values between consecutive digital input signal values. Modified digital signal generator 742 is composed of modified digital signal generator 642, summing element 710, rounding circuit 230, a timing correction value source 751, an address generator 761, delay circuit 770, a page selector 771 and filter 790. Modified digital signal generator 642, summing element 710, delay circuit 770 and filter 790 are described above with reference to FIG. 13 and rounding circuit 230 is described above with reference to FIG. 4.

Timing correction value source 751 and address generator 761 are similar in structure to the examples of modified digital signal source 601 and address generator 611 described above with reference to FIG. 12. However, in timing correction value source 751, read-only memory 721 is composed of one page 781 and one multiplexer 723 for each possible conversion clock period number. Each page 781 of read-only memory 721 comprises memory cells arranged in a two-dimensional array similar to that described above with reference to FIG. 12. One dimension of the array corresponds to current digital input signal values and the other dimension of the array corresponds to preceding digital input signal values, i.e., the digital input signal values delayed by one conversion clock period. Each memory cell stores a respective timing correction value. The timing correction value corresponds to a respective current digital input signal value, a respective preceding digital input signal value and a respective conversion clock period number. Memory 721 additionally has an input that provides the clock input 753 of timing correction value source 751. In some embodiments, read-only memory 721 is a programmable read-only memory to allow individual calibration and/or recalibration.

In read-only memory 721, each row of each page 781 as an output connected to a respective input of a respective multiplexer 723.

Address generator 761 is composed of a row selector 731, a column selector 741 and a selector 771. Row selector 731 has a digital signal input 717 connected to digital input 202. Row selector 731 has row outputs each of which is coupled to a respective row input of the pages of memory 721.

Column selector 741 has column outputs each of which is coupled to a respective column input of the pages of memory 721. Column selector 741 additionally has a previous digital signal input 719 connected to digital input 202 via delay circuit 770.

Page selector 771 has a respective timing correction value input, e.g., timing correction value input 709, connected to the output of the multiplexer 723 of each page 781 of read-only memory 721, a synchronization input 715 connected to receive sub-harmonic clock signal SHC and a clock input 713 connected to receive conversion clock signal CC. Page selector 771 additionally has a timing correction value output 707 connected to the input 792 of filter 790. The output 794 of filter 790 is connected to the second input 714 of summing element 710, as described above.

The timing correction values stored in timing correction value source 751 may be scaled, as described above. In this case, a scaling element (not shown) similar to scaling circuit 460 described above with reference to FIG. 9 is interposed between the output of filter 790 and the second input 714 of summing element 710 in a manner similar to that described above. A rounding element (not shown) may be located ahead of the second input 714 of summing element 710 in a manner similar to that described above. In embodiments in which such rounding element rounds to a resolution equal to that of the modified digital signal values received at first input 712, rounding circuit 230 may be omitted.

In operation, row selector 731 receives each current digital input signal value and, in response, activates a single row in each page 781 of memory 721 by means of an activation signal output at the respective one of its row outputs. Additionally, column selector 741 receives the preceding digital input signal from delay circuit 770. In response, column selector 741 activates a single column in each page of memory 721 by means of an activation signal output at the respective one of its column outputs.

Conversion clock signal CC received at clock input 753 causes each page 781 of read-only memory 721 to output to its respective multiplexer 723 the timing correction value stored in the memory cell located at the intersection of the activated row and the activated column. The multiplexer 723 of each page 781 outputs the timing correction value received from the identified memory cell at its timing correction value output 783.

The timing correction value output at the timing correction value output 783 of the multiplexer 723 of each page 781 of memory 721 passes to the respective timing correction value input 709 of page selector 771. Additionally, page selector 771 receives sub-harmonic clock signal SHC and conversion clock signal CC and, in response, sequentially and cyclically selects one of its timing correction value inputs 709 connected to a respective page 781 of read-only memory 721.

Specifically, in response to the first, e.g., positive-going transition of conversion clock signal CC following each, e.g., positive-going transition of sub-harmonic clock signal SHC, page selector 771 activates the timing correction value input 709 connected to the multiplexer 723 of the first page 781 of memory 721. Then, on the next N−1 successive e.g., positive-going transitions of conversion clock signal CC, page selector 771 sequentially activates the timing connection inputs connected to the multiplexer 723 of the second page 781 through the (N−1)-th page, respectively, of memory 721. Page selector 771 outputs the timing correction value received via the selected one of its timing correction value inputs 709 in each conversion clock period to the input 792 of filter 790. The remainder of modified digital signal generator 740 operates as described above with reference to FIG. 13.

The modified digital signal generators 540, 740 and 742 described above with reference to FIGS. 10, 13 and 14, respectively, mitigate three types of periodic error of digital-to-analog converter 204. The above-described modified digital signal generators 540, 740 and 742 can be regarded as having a parallel circuit topology in which gain corrections and timing corrections are independently derived directly from the digital input signal. Such parallel circuit topology avoids unwanted interactions between the various corrections.

Figure 15A:
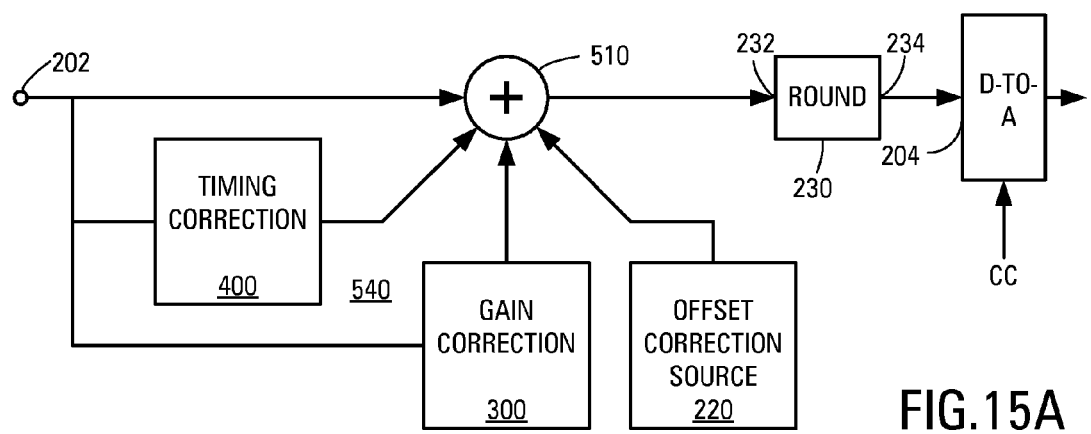
FIGS. 15A-15D are block diagrams illustrating various alternative circuit topologies that can be used to mitigate a periodic offset error, a periodic gain error and a periodic timing error.

Referring to FIG. 15A, modified digital signal generator 540 described above with reference to FIG. 10 can be regarded as comprising an offset correction source 220, a gain correction module 300, a timing error correction module 400 and a summing element 510. Gain correction module 300 and timing error correction module 400 independently generate gain error corrections and timing error corrections, respectively, from the digital input signal itself. Summing element 510 sums the timing error corrections, the gain error corrections, offset correction values output by offset correction source 220 and the digital input signal to generate the modified digital signal that is output to digital-to-analog converter 204 directly or via rounding circuit 230.

Figure 15B:
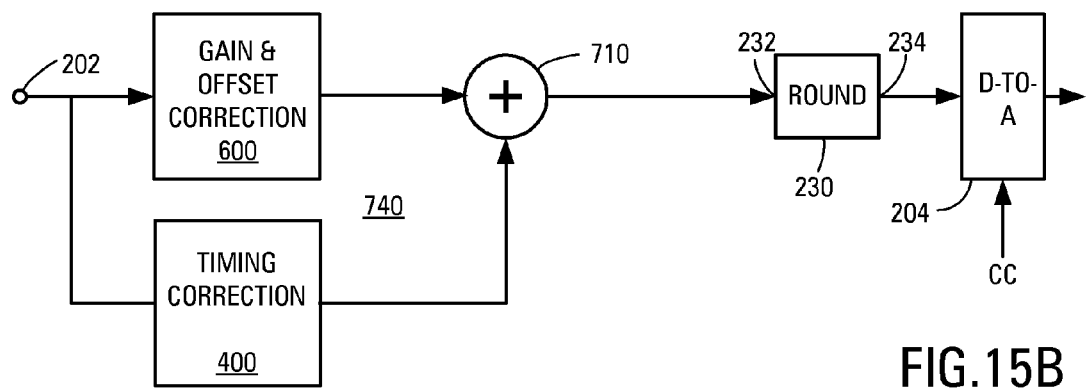

Referring to FIG. 15B, modified digital signal generator 740 shown in FIG. 13 and modified digital signal generator 742 shown in FIG. 14 can each be regarded as comprising a timing correction module 400, a gain and offset correction module 600 and a summing element 710. Timing correction module 400 generates timing error corrections from the digital input signal. Gain and offset correction module 600 independently generates an intermediate modified digital signal from the digital input signal. The intermediate modified digital signal incorporates the digital input signal itself and gain and offset corrections. Summing element 710 sums the timing error correction and the intermediate modified digital signal to generate the modified digital signal that is output to digital-to-analog converter 204 via rounding circuit 230.

Figure 15C:
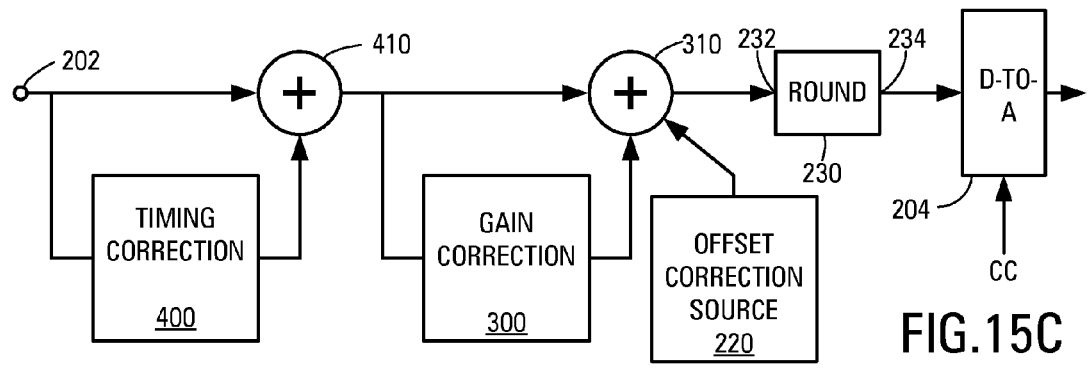
Figure 15D:
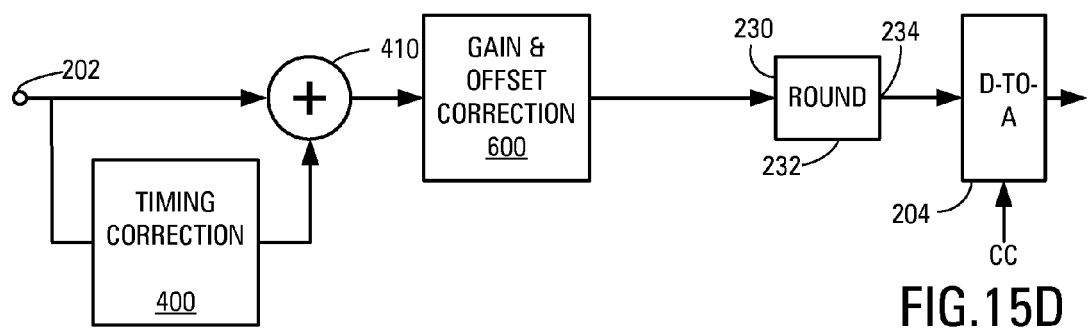

FIG. 15C shows a first example of a series circuit topology capable of mitigating three types of periodic error in digital-to-analog converter 204. In this first series circuit topology, the gain correction is derived from the intermediate modified digital signal obtained by summing the timing correction and the digital input signal. The gain correction, the offset correction and the intermediate modified digital signal are then summed to generate the modified digital signal that is output to digital-to-analog converter 204 via rounding circuit 230. FIG. 15D shows a second example of a series circuit topology capable of mitigating three types of periodic error of digital-to-analog converter 204. In this second series circuit topology, the modified digital signal is generated in response to the intermediate modified digital signal obtained by summing the timing correction and the digital input signal. Series circuit topologies such as those just described typically provide a more accurate correction of the periodic errors but at the expense of a greater incidence of unwanted interactions between the corrections.

The series circuit topology example shown in FIG. 15C is composed of offset correction source 220, gain correction module 300, timing error correction module 400, a summing element 310 and a summing element 410. Timing correction module 400 generates timing corrections from the digital input signal and summing element 410 sums the timing corrections and the digital input signal to form the intermediate modified digital signal. Summing element 410 outputs the intermediate modified digital signal to one input of summing element 310 and to the input of gain correction module 300. Gain correction module 300 generates gain corrections in response to the intermediate modified digital signal and summing element 310 sums the intermediate modified digital signal, the gain corrections output by gain correction module 300 and the offset corrections output by offset correction source 220 to generate the modified digital signal that is output to digital-to-analog converter 204 via rounding circuit 230.

The series circuit topology example shown in FIG. 15D is composed of gain and offset correction module 600, timing error correction module 400 and summing element 410. Timing correction module 400 generates timing corrections from the digital input signal and summing element 410 sums the timing corrections and the digital input signal to form the intermediate modified digital signal. Summing element 410 outputs the intermediate modified digital signal to the input of gain and offset correction module 600. In response to the intermediate modified digital signal, gain and offset correction module 600 generates the modified digital signal that is output to digital-to-analog converter 204 via rounding circuit 230. The modified digital signal incorporates the digital input signal and corrections for offset, gain and timing.

Other series topologies are possible. For example, gain correction module 300 and timing correction module 400 can be interchanged in the example shown in FIG. 15C, and timing correction module 400 and offset and gain correction module 600 can be interchanged in the example shown in FIG. 15D.

Figure 16:
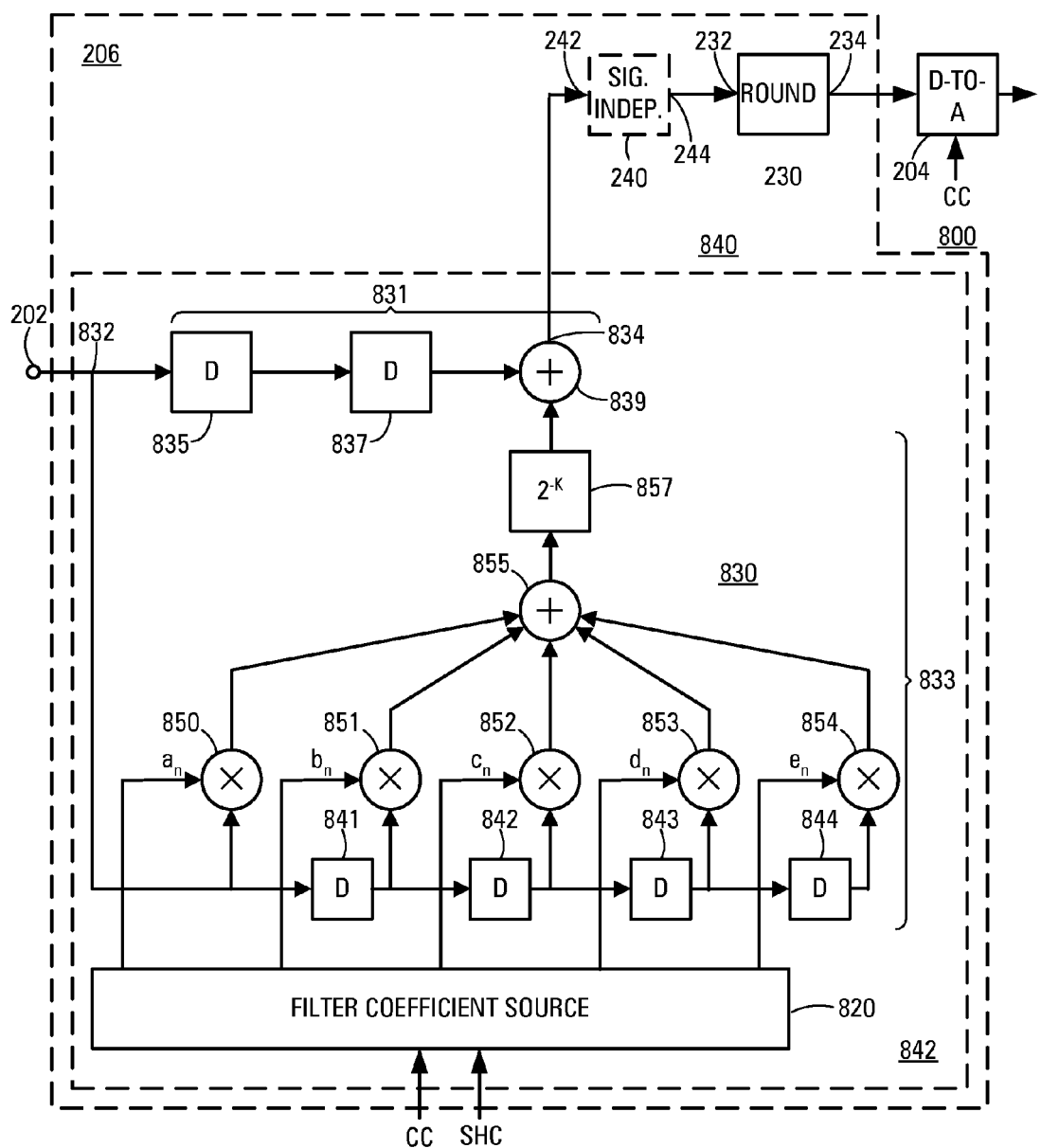
FIG. 16 is a block diagram showing an example of a digital-to-analog conversion system in accordance with an embodiment of the invention in which a cyclic time varying filter-based modified digital signal generator is used to mitigate the signal-dependent periodic errors of the digital-to-analog converter.

FIG. 16 is a block diagram showing an example of a digital-to-analog conversion system 800 in accordance with an embodiment of the invention in which a cyclic time varying filter-based modified digital signal generator is used to mitigate the signal-dependent periodic errors of the digital-to-analog converter. In the example shown, digital-to-analog conversion system 800 is composed of digital input 202, an embodiment of digital-to-analog converter 204 in which the periodic error is at least a signal-dependent periodic error, and an embodiment 840 of modified digital signal generator 206 that mitigates such periodic error. As noted above, digital-to-analog converter 204 has a conversion frequency $F_s$ and is subject to a periodic error having periodicity equal to that of the N-th sub-harmonic $F_s/N$ of its conversion frequency.

Modified digital signal generator 840 comprises a cyclic time varying filter-based modified digital signal generator 842 and a rounding circuit 230. In cyclic time-varying filter-based modified digital signal generator 842, a cyclic time-varying digital filter having N discrete filter characteristics generates a modified digital signal that mitigates the signal-dependent periodic error of digital-to-analog converter 204. Rounding circuit 230 applies rounding to the modified digital signal.

In embodiments of digital-to-analog conversion system 800 in which digital-to-analog converter 204 is additionally subject to a signal-independent periodic error, modified digital signal generator 840 additionally comprises signal-independent modified digital signal generator 240 interposed between filter-based modified digital signal generator 842 and rounding circuit 230. The modified digital signal generated by cyclic time varying filter-based modified digital signal generator 842 is input to signal-independent modified digital signal generator 240 as an intermediate modified digital signal. Signal-independent modified digital signal generator 240 modifies the intermediate modified digital signal to generate a modified digital signal that additionally mitigates the signal-independent periodic error of digital-to-analog converter 204. Rounding circuit 230 applies rounding to the modified digital signal, as described above.

Cyclic time varying filter-based modified digital signal generator 842 is composed of a cyclic time-varying filter 830 and a filter coefficient source 820. Filter 830 is time-varying in the sense that its filter characteristic differs in each period of conversion clock signal CC. Filter 830 is cyclic in the sense that the variation of its filter characteristic repeats with a periodicity equal to that of the periodic error of digital-to-analog converter 204. Thus, filter 830 has a different filter characteristic in each conversion clock period number. See FIG. 3D The filter characteristic of filter 830 in each conversion clock period number is defined by a respective set of filter coefficients stored in filter coefficient source 820. Thus, filter coefficient source 820 stores N sets of filter coefficients. Filter coefficient source 820 operates in response to conversion clock signal CC and sub-harmonic clock signal SHC to cyclically output the sets of the filter coefficients stored therein to time-varying filter 830 such that the same set of filter coefficients is output in each clock period number. Thus, filter coefficient source 820 outputs the same set of filter coefficients every N clock periods. Sub-harmonic clock signal SHC has a periodicity equal to that of the periodic error of digital-to-analog converter 204, and is locked in phase thereto. Consequently, the filter characteristics of filter 830 are different in each conversion clock period number, with the same filter characteristics cyclically recurring every N conversion clock periods. Filtering the digital input signal received at digital input 202 with filter 830 mitigates the signal-dependent periodic error of digital-to-analog converter 202.

The example of filter 830 shown in FIG. 16 is a fourth order (5-tap) finite impulse response (FIR) filter. In other examples, filter 830 has more or fewer taps. In general, filter 830 is an X-th order filter with X+1 taps, where X is an integer.

The example of cyclic time-varying filter 830 shown in FIG. 16 has a main path 831, a side path 833, an input 832 and an output 834. Input 832 is connected to digital input 202. Output 834 is connected to the input 242 of signal-independent modified digital signal generator 240. Main path 831 is composed of delay circuits 835, 837 and a summing element 839 connected in series between input 832 and output 834. Each delay circuit 835, 837 provides a delay equal to one period of conversion clock signal CC. In general, the total delay provided by the delay circuits in main path 831 is equal to X/2 conversion clock periods.

Side path 833 is composed of delay circuits 841, 842, 843, 844, two-input multipliers 850, 851, 852, 853, 854, a summing element 855 and a scaling circuit 857. Each delay circuit 841, 842, 843, 844 provides a delay equal to one period of conversion clock signal CC. In general, side path 833 has X delay circuits connected in series and X+1 multipliers, and summing element 855 has X+1 inputs. The input of delay circuit 841 is connected to input 832. The remaining delay circuits 842, 843, 844 are connected in series with delay circuit 841. A first input of multiplier 850 is connected to input 832. A first input of each multiplier 851, 852, 853, 854 is connected to the output of delay circuits 841, 842, 843, 844, respectively. Second inputs of multipliers 850, 851, 852, 853, 854 are connected to filter coefficient source 820 to receive respective filter coefficients (labelled $a_n$ through $e_n$ in this example) in each conversion clock period number. The set of filter coefficients received by multipliers 850-854 in each conversion clock period number defines the filter characteristic of filter 830 in that conversion clock period number. The filter coefficients are typically small in magnitude and are therefore scaled by a scaling factor $2^K$, as described above. Scaling the filter coefficients allows multipliers 850, 851, 852, 853, 854 and summing element 855 to be simplified. The outputs of multipliers 850, 851, 852, 853, 854 are connected to respective inputs of summing element 855. Summing element 855 sums the product values output by multipliers 850-854. Scaling circuit 857 is interposed between the output of summing element 855 and an input of summing element 839. Scaling circuit 857 divides the sum values output by summing element 855 by $2^K$ to reverse the scaling applied to the filter coefficients input to multipliers 850-854. Alternatively, the filter coefficients are not scaled, and scaling circuit 857 is omitted. Summing circuit 839 sums the scaled sum values received from scaling circuit 857 and respective delayed digital input signal values output by delay circuit 857 to generate respective modified digital signal values. The modified digital signal values are output at output 834.

Cyclic time-varying filter 830 may alternatively be implemented as a single-path circuit. In such an implementation, main path 831, including delay circuits 835 and 837 and summing element 839, is omitted, scaling circuit 857 is omitted, and the output of summing circuit 855 provides the output 834 of filter 830. In such an embodiment, filter coefficients $a_n$, $b_n$, $d_n$ and $e_n$ are not scaled, and filter coefficient $c_n$ is a value close to unity. To a first approximation, filter coefficient $c_n$ differs from unity by a value approximately equal to the value of filter coefficient $c_n$ in the dual path implementation shown in FIG. 16. In an alternative single-path implementation, only delay circuits 835 and 837 are omitted, filter coefficients $a_n$, $b_n$, $d_n$ and $e_n$ are scaled but filter coefficient $c_n$ is a value close to unity, summing element 855 sums the outputs only of multipliers 850, 851, 853 and 854, and summing element 839 sums the output of scaling circuit 857 with that of multiplier 852 to generate the modified digital signal.

Other types of filter can be used as cyclic time-varying filter 830. The main requirement of filter 830 is that it be capable of providing the frequency response necessary to mitigate the periodic error of digital-to-analog converter 204 in each conversion clock period number. In practical embodiments, filter 830 applies small corrections to a dominant pass-through signal component. The pass-through signal component is delayed to make the filter causal. In general, filter 830 is best represented as an even-order filter, which has an odd number of taps. Otherwise, the nominal group delay is fractional and the filter must additionally perform interpolation, which significantly increases the length (order) of the filter required to provide a given frequency response characteristic. It is typically desirable to minimize the size and complexity and, hence, the order, of filter 830. Minimizing the order of filter 830 involves approximating the calculated target frequency response of the filter using as few taps as possible. Approximation methods, such as the Remez algorithm, exist and can be used for this purpose. An exemplary process for calculating the target frequency response of filter 830 in each conversion clock period number will be described below.

Figure 17:
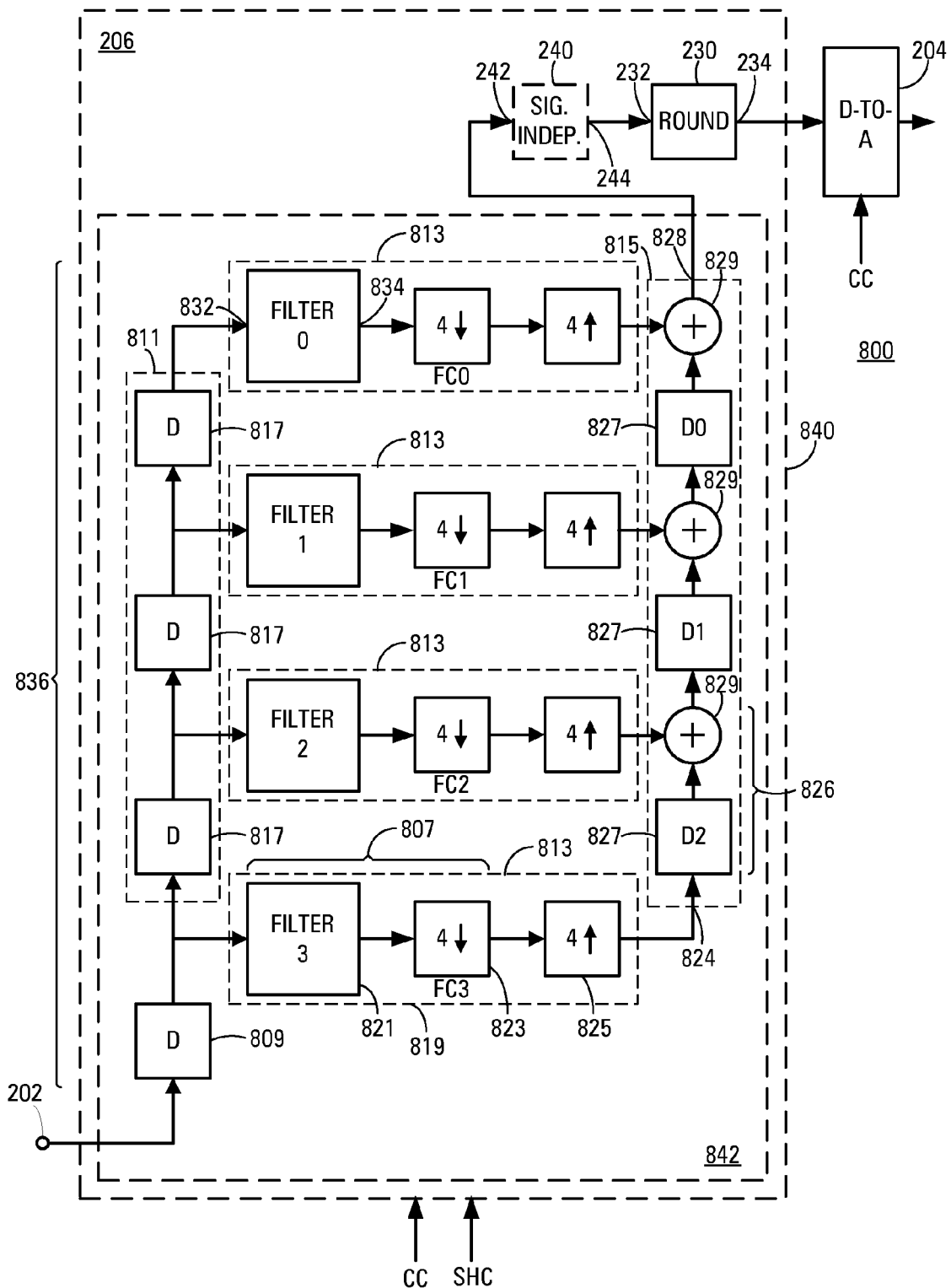
FIG. 17 is a block diagram showing another example of a digital-to-analog conversion system in accordance with an embodiment of the invention in which a cyclic time varying filter-based modified digital signal generator is used to mitigate the signal-dependent periodic errors of the digital-to-analog converter.

FIG. 17 is a block diagram showing another example of a digital-to-analog conversion system 800 in accordance with an embodiment of the invention in which a cyclic time varying filter-based modified digital signal generator comprises a cyclic time-varying filter 836 composed of N filter channels, each comprising a static correction filter having a respective filter characteristic. The filter characteristic of each of the static correction filters is identical to the filter characteristic of cyclic time-varying filter 830 described above with reference to FIG. 16 in a respective conversion clock period number. Cyclic time-varying filter 836 is simpler to analyze and is more amenable to polyphase decomposition than cyclic time-varying filter 830 described above with reference to FIG. 16.

In this example of digital-to-analog conversion system 800, cyclic time-varying filter 836 constitutes cyclic time varying filter-based modified digital signal generator 842. Cyclic time-varying filter 836 is composed of N filter channels 813, a delay circuit 809, an input shift register 811 and an output shift register 815. The number N of filter channels 813 is equal to the number N of the sub-harmonic of the conversion frequency of digital-to-analog converter 204 having the same periodicity as the periodic error of digital-to-analog converter 204. In the example shown, the periodic error of digital-to-analog converter 204 has a periodicity equal to that of the fourth sub-harmonic of the conversion frequency $F_s$, and modified digital signal generator 842 has four filter channels 813. In other examples in which the periodicity of the periodic error of digital-to-analog converter 204 is different from four, the number N of filter channels 813 is greater or fewer than the number of filter channels in the example shown.

Cyclic time-varying filter 836 is time-varying in the sense that its filter characteristic differs in each period of conversion clock signal CC. Filter 836 is cyclic in the sense that the variation of its filter characteristic repeats with a periodicity equal to that of the periodic error of digital-to-analog converter 204. Thus, filter 836 has a different filter characteristic in each conversion clock period number. The filter characteristic of filter 836 in each conversion clock period number is defined by a set of filter coefficients that defines the filter characteristic of a respective one of the filter channels 813.

Delay circuit 809 has a delay equal to one conversion clock period of digital-to-analog converter 204. The input of delay circuit 809 is connected to digital input 202.

Input shift register 811 is composed of N−1 delay circuits 817 (three delay circuits in this example) connected in series. Delay circuits 817 each have a delay equal to one conversion clock period of digital-to-analog converter 204. The input of the delay circuit 817 at one end of input shift register 811 is connected to the output of delay circuit 809.

Filter channels 813 will be described with reference to an exemplary filter channel 819. Filter channel 819 is composed of a correction filter 821, a downsampler 823 and an upsampler 825 connected in order in series. Reference numerals 821, 823 and 825 will additionally be used to refer to the correction filter, downsampler and upsampler, respectively, of the remaining filter channels 813.

Correction filter 821 has a static filter characteristic. Downsampler 823 downsamples by a factor of N, and upsampler 825 upsamples by the same factor. Thus, in the example shown, in a conversion clock period 0, downsampler 823 outputs the value it receives from correction filter 821 and continues to output this value until the end of a conversion clock period N−1. In each of conversion clock periods 1 through N−1, i.e., conversion clock periods 1 through 3 in this example, downsampler 823 discards the respective values it receives from correction filter 821. Moreover, in the example shown, in conversion clock period 0, upsampler 825 outputs the value it receives from downsampler 823, and in each of conversion clock periods 1 through N−1, i.e., conversion clock periods 1 through 3 in this example, outputs a value of 0 regardless of the value it receives from downsampler 823 in these conversion clock periods.

The remaining filter channels 813 are identical in structure to that of exemplary filter channel 819. However, the respective correction filters 821 in at least two of the filter channels 813 differ in their static filter characteristics. More typically, the respective correction filters 821 in all of the filter channels 813 have mutually-different static filter characteristics. The correction filter 821 in each filter channel 813 has a static filter characteristic that mitigates the periodic error of digital-to-analog converter 204 in a respective conversion clock period number.

Output shift register 815 is composed of N−1 delay elements (three delay elements in this example) connected in series. An exemplary delay element is shown at 826. Each delay element 826 is composed of a delay circuit 827 and a summing element 829, in order, connected in series. Delay circuit 827 has a delay equal to one conversion clock period of digital-to-analog converter 204. Output shift register 815 has an output 828 at which the modified digital signal is output.

Input shift register 811 and output shift register 815 each operate in response to conversion clock signal CC and sub-harmonic clock signal SHC to ensure that the modified digital signal value output by modified digital signal generator 842 in each conversion clock period number will mitigate the signal-dependent periodic error of digital-to-analog converter 204 in the same conversion clock period number. Sub-harmonic clock signal SHC has a periodicity equal to that of the periodic error of digital-to-analog converter 204, and is locked in phase thereto.

In filter channel 819, the input of correction filter 821 is connected to the output of delay circuit 809 and the output of upsampler 825 is connected to the input 824 of output shift register 815. Input 824 is at the end of output shift register 815 remote from output 828. In each of the remaining filter channels 813, the input of correction filter 821 is connected to the output of a respective delay circuit 817 of input shift register 811 and the output of upsampler 825 is connected to one input of the summing element 829 of a respective delay element 826 of output shift register 815. Remaining filter channels 813 are connected to input shift register 811 and output shift register 815 such that, for each remaining filter channel 813, the number of delay circuits 817 between the input of the remaining filter channel 813 and the input of filter channel 819 is the same as the number of delay elements 826 between the output of the remaining filter channel 813 and the output of filter channel 819. The combination of output shift register 815 and upsamplers 825 commutate the outputs of correction filters 821 to generate the modified digital signal output by the output shift register.

Table 1 illustrates the operation of cyclic time-varying filter 836 to derive the modified digital signal from the digital input signal over eight exemplary conversion periods $P_0$ through $P_7$ of digital-to-analog converter 204, i.e., over sub-harmonic clock periods 0 and 1. For convenience, Table 1 is divided into four parts labelled Table 1A through Table 1D. Moreover, in the example of filter 836 whose operation is illustrated in Table 1, correction filters 821 are replaced by respective conductors to simplify the description. In each of Tables 1A-1D, row 1 shows the two periods of sub-harmonic clock signal SHC and row 2 shows the corresponding eight periods of conversion clock signal CC.

TABLE 1A

| 1 SHC per. | | 0 | | | | 1 | | |
|---|---|---|---|---|---|---|---|---|
| 2 CC period | $P_0$ | $P_1$ | $P_2$ | $P_3$ | $P_4$ | $P_5$ | $P_6$ | $P_7$ |
| 3 input 202 | 1 | 2 | 3 | 4 | 0 | 0 | 0 | 0 |
| 4 $FC_0$ in | 0 | 0 | 0 | 0 | 1 | 2 | 3 | 4 |
| 5 $FC_1$ in | 0 | 0 | 0 | 1 | 2 | 3 | 4 | 0 |
| 6 $FC_2$ in | 0 | 0 | 1 | 2 | 3 | 4 | 0 | 0 |
| 7 $FC_3$ in | 0 | 1 | 2 | 3 | 4 | 0 | 0 | 0 |

In Table 1A, row 3 shows exemplary digital input signal values received at digital input 202 in each conversion clock period shown in row 2. For the purpose of illustration, values of 1, 2, 3 and 4 are received in conversion clock periods $P_0$, $P_1$, $P_2$ and $P_3$, respectively, and values of 0 are received in conversion clock periods $P_4$ through $P_7$.

Additionally, in Table 1A, rows 4 through 7 show the values at the inputs of filter channels $FC_0$ through $FC_3$, respectively, in each conversion clock period $P_0$ through $P_7$. The inputs of filter channels $FC_0$ through $FC_3$ are indicated by row captions $FC_0$ in through $FC_3$ in, respectively. The values at the inputs of the filter channels progressively change in successive conversion clock periods. By conversion clock period $P_4$, values 1, 2, 3 and 4 are present at the inputs of filter channels $FC_0$ through $FC_3$, respectively. Since the correction filter 821 of each filter channel 813 is replaced by a respective conductor in this example, rows 4 through 7 additionally show the values at the outputs of the correction filters 821 and the inputs of the downsamplers 823 of filter channels $FC_0$ through $FC_3$, respectively.

TABLE 1B

| 1 SHC per. | | 0 | | | | 1 | | |
|---|---|---|---|---|---|---|---|---|
| 2 CC period | $P_0$ | $P_1$ | $P_2$ | $P_3$ | $P_4$ | $P_5$ | $P_6$ | $P_7$ |
| 8 $DS_0$ out | 0 | 0 | 0 | 0 | 1 | 1 | 1 | 1 |
| 9 $DS_1$ out | 0 | 0 | 0 | 0 | 2 | 2 | 2 | 2 |
| 10 $DS_2$ out | 0 | 0 | 0 | 0 | 3 | 3 | 3 | 3 |
| 11 $DS_3$ out | 0 | 0 | 0 | 0 | 4 | 4 | 4 | 4 |

In Table 1B, rows 8 through 11 show the values at the outputs of the downsamplers 823 of filter channels $FC_0$ through $FC_3$, respectively. The outputs of the downsamplers 823 of filter channels $FC_0$ through $FC_3$ are indicated by row captions $DS_0$ out through $DS_3$ out, respectively. In conversion clock period $P_0$, each downsampler outputs a value corresponding to the value present at its input. Conversion clock period $P_0$ corresponds to the start of sub-harmonic clock period 0. The output of each downsampler remains in the output state to which it was set in conversion clock period $P_0$ for the remainder of sub-harmonic clock period 0, corresponding to conversion clock periods $P_1$-$P_3$ of the conversion clock signal. Thus, during conversion clock periods $P_0$ through $P_3$, values of 0, 0, 0 and 0 are present at the outputs of downsamplers $DS_0$ through $DS_3$, respectively.

Again, in conversion clock period $P_4$, each downsampler outputs a value corresponding to the value present at its input. Conversion clock period $P_4$ corresponds to the start of sub-harmonic clock period 1. The output of each downsampler remains in the output state to which it was set in conversion clock period $P_4$ for the remainder of sub-harmonic clock period 1, corresponding to conversion clock periods $P_5$-$P_7$. Thus, during conversion clock periods $P_4$ through $P_7$ of the conversion clock signal, values 1, 2, 3 and 4 are present at the outputs of downsamplers $DS_0$ through $DS_3$, respectively.

TABLE 1C

| 1 SHC per. | | 0 | | | | 1 | | |
|---|---|---|---|---|---|---|---|---|
| 2 CC period | $P_0$ | $P_1$ | $P_2$ | $P_3$ | $P_4$ | $P_5$ | $P_6$ | $P_7$ |
| 12 $US_0$ out | 0 | 0 | 0 | 0 | 1 | 0 | 0 | 0 |
| 13 $US_1$ out | 0 | 0 | 0 | 0 | 2 | 0 | 0 | 0 |
| 14 $US_2$ out | 0 | 0 | 0 | 0 | 3 | 0 | 0 | 0 |
| 15 $US_3$ out | 0 | 0 | 0 | 0 | 4 | 0 | 0 | 0 |

In Table 1C, rows 12 through 15 show the values at the outputs of the upsamplers 825 of filter channels $FC_0$ through $FC_3$, respectively. The outputs of upsamplers 825 of filter channels $FC_0$ through $FC_3$ are indicated by row captions $US_0$ out through $US_3$ out, respectively. In conversion clock periods $P_0$ and $P_4$, respectively corresponding to the start of sub-harmonic clock periods 0 and 1, each upsampler outputs a value corresponding to the value present at its input. In the remaining conversion clock periods $P_1$-$P_3$ in sub-harmonic clock period 0 and $P_5$-$P_7$ in sub-harmonic clock period 1, each upsampler outputs a value of 0. Thus, during conversion clock period $P_0$, values of 0, 0, 0 and 0 are present at the outputs of upsamplers $US_0$ through $US_3$. Then, in each of conversion clock periods $P_1$ through $P_3$, values of 0, 0, 0 and 0 are present at the outputs of upsamplers $US_0$ through $US_3$. In conversion clock period $P_4$, values 1, 2, 3 and 4 are present at the outputs of upsamplers $US_0$ through $US_3$, respectively. Then, in each of conversion clock periods $P_5$-$P_7$, values of 0, 0, 0 and 0 are again present at the outputs of upsamplers $US_0$ through $US_3$.

TABLE 1D

| 1 SHC per. | | 0 | | | | 1 | | |
|---|---|---|---|---|---|---|---|---|
| 2 CC period | $P_0$ | $P_1$ | $P_2$ | $P_3$ | $P_4$ | $P_5$ | $P_6$ | $P_7$ |
| 16 $D_0$ out | 0 | 0 | 0 | 0 | 4 | 0 | 0 | 0 |
| 17 $D_1$ out | 0 | 0 | 0 | 0 | 3 | 4 | 0 | 0 |
| 18 $D_2$ out | 0 | 0 | 0 | 0 | 2 | 3 | 4 | 0 |
| 19 MDSV out | 0 | 0 | 0 | 0 | 1 | 2 | 3 | 4 |

In Table 1D, rows 16 through 18 respectively show the values at the outputs of the delay circuits 827 of output shift register 815. The outputs of delay circuits 827 are indicated by row captions $D_0$ out through $D_2$ out. In each conversion clock period, each delay circuit $D_0$ through $D_2$ outputs the value provided to its input by the output of filter channel $FC_1$ through $FC_3$, respectively. Through conversion clock period $P_4$, values of 0 are present at the outputs of delay circuits $D_0$ through $D_2$. Then, in conversion clock periods $P_5$, $P_6$ and $P_7$, delay circuit $D_0$ outputs the values that will be output as respective modified digital signal values in the same clock periods, delay circuit $D_1$ outputs the values that will be output as respective modified digital signal values in the next conversion clock periods, and delay circuit $D_2$ outputs the values that will be output as respective modified digital signal values in the next-but-one conversion clock periods.

Row 19 of Table 1D shows the modified digital signal values output at the output 828 of output shift register 815. The modified digital signal values output at output 828 are indicated by row caption MDSV out. In each conversion clock period through conversion clock period $P_3$, modified digital values of 0 are present at the output 828 of output shift register 815. Then, in conversion clock period $P_4$, filter channel $FC_0$ outputs a value of 1 that is summed with the value of 0 output by delay circuit $D_0$ to generate a modified digital signal value of 1 at the output 828 of output shift register 815. In conversion clock period $P_5$, filter channel $FC_0$ outputs a value of 0 that is summed with the value of 2 output by delay circuit $D_0$ to generate a modified digital signal value of 2 at the output 828 of output shift register 815. Similar summing operations generate a modified digital signal value of 3 and a modified digital signal value of 4 at the output 828 of output shift register 815 in conversion clock periods $P_6$ and $P_7$, respectively.

The presence of a correction filter 821 in each of filter channels $FC_0$ though $FC_3$ modifies the values input to the downsampler 823 of the respective filter channel, but otherwise the operation of filter 836 remains the same as that described above.

Many different types of filter can be used as the correction filter 821 of each filter channel 813. The main requirement of correction filter 821 is that it should be capable of providing the frequency response necessary to mitigate the periodic error of digital-to-analog converter 204. In practical embodiments, correction filter 821 applies small corrections to a dominant pass-through signal component. The pass-through signal component is delayed to make the correction filter causal. In general, the correction filter is best represented as an even-order filter, which has an odd number of taps. Otherwise, the nominal group delay is fractional and the correction filter must additionally perform interpolation, which significantly increases the length (order) of the filter required to provide a given frequency response characteristic. It is typically desirable to minimize the size and complexity and, hence, the order, of correction filter 821. Minimizing the order of correction filter 821 involves approximating the calculated target frequency response of the correction filter using as few taps as possible. Approximation methods, such as the Remez algorithm, exist and can be used for this purpose. An exemplary process for calculating the target frequency response of each correction filter 821 will be described below.

In an example, cyclic time-varying filter 836 is implemented using a two-path structure similar to that described above with reference to FIG. 16. In such implementation, the correction filter 821 in each filter channel 813 is similar in structure to the side path 833 of cyclic time-varying filter 830 described above with reference to FIG. 16, except that scaling element 857 is omitted, and the correction filter 821 in each filter channel 813 has its own static set of static filter characteristics a through e. In addition, a common scaling circuit (not shown) and an additional summing element (not shown) connected in series in order, are interposed between the output of the summing element 829 connected to filter channel FC0 and the output 828 of output shift register 815. A main path common to all filter channels 813 extends from digital input 202 to an input of the additional summing element. In such main path, a delay circuit delays the digital input signal such that each digital input signal value arrives at the additional summing element in the same conversion clock period as a respective correction value output by summing element 829. Delay element 809 and input shift register 811 may be used to provide part of the main path delay.

Determination of the filter characteristic of cyclic time-varying filter 830 in each conversion clock period number 0 through N−1 will now be described. The explanation set forth below additionally pertains to the filter characteristic of the correction filter 821 of each filter channel 813 of cyclic time-varying filter 836. References below to the filter characteristic of cyclic time-varying filter 830 in each conversion clock period number should additionally be taken to refer to the filter characteristic of the correction filter 821 of each filter channel 813 of cyclic time-varying filter 836, and references below to filter 830 should additionally be taken to refer to filter 836. Equations that represent the target responses $G_n(f)$ of cyclic time-varying filter 830 in conversion clock period numbers 0 through N−1 can be expressed in matrix form as follows:

$$\begin{bmatrix} H_{P_{\min},0}(f) & H_{P_{\min},1}(f) & H_{P_{\min},2}(f) & \cdots & H_{P_{\min},N-1}(f) \\ H_{P_{\min}+1,0}(f) & H_{P_{\min}+1,1}(f) & H_{P_{\min}+1,2}(f) & & H_{P_{\min}+1,N-1}(f) \\ \vdots & & \vdots & & \vdots \\ H_{0,0}(f) & H_{0,1}(f) & H_{0,2}(f) & & H_{0,N-1}(f) \\ \vdots & & \vdots & \ddots & \vdots \\ H_{P_{\max},0}(f) & H_{P_{\max},1}(f) & H_{P_{\max},2}(f) & \cdots & H_{P_{\max},N-1}(f) \end{bmatrix}$$

$$\begin{bmatrix} G_0(f) \\ G_1(f) \\ \vdots \\ G_{N-1}(f) \end{bmatrix} = \begin{bmatrix} 0 \\ 0 \\ \vdots \\ D(f) \\ \vdots \\ 0 \end{bmatrix}$$

where:

$$H_{p,n}(f) = \frac{e^{-j2\pi \frac{np}{N}}}{N} H_n\left(f + p\frac{F_s}{N}\right)$$

and D(f) is the specified response of digital-to-analog conversion system 800 and p is an index indicating each sub-harmonic image.

In the first Nyquist region, the minimum value $P_{min}$ of p is given by:

$$P_{\min} = -\left\lfloor N\left(\frac{1}{2} + \frac{F_e}{F_s}\right) \right\rfloor,$$

where $F_e$ is the frequency of the first analog signal represented by the digital input signal input to digital-to-analog conversion system 800, and $\lfloor\ \rfloor$ indicates the integer floor of the argument.

The maximum value $P_{max}$ of p is given by:

$$P_{max} = P_{min} + N - 1$$

The equations expressed above in matrix form are solved to yield the target frequency response $G_n(f)$ of filter 830 in each conversion clock period number at a frequency of interest of the first analog signal represented by the digital input signal. Then, for each conversion clock period number filter coefficients that give filter 830 a response that approximates the target response within a specified tolerance are calculated. For a particular frequency of interest of the first analog signal, the above method can be used to calculate target frequency responses for time-varying filter 830 that make the time-varying filter capable of fully suppressing N−1 undesired sub-harmonic spectral components. It should be noted that the modified digital signal generated by a given embodiment of modified digital signal generator 842 is only capable of mitigating the signal-dependent periodic error of digital-to-analog converter 204 in the Nyquist region for which the target responses of the respective filter were determined. In general, such embodiment of modified digital signal generator 842 will not effectively mitigate signal-dependent periodic errors in other Nyquist regions. However, digital-to-analog converter 204 typically includes a reconstruction filter (not shown). One purpose of the reconstruction filter is to suppress such errors.

In typical applications, the digital input signal input to digital-to-analog conversion system 800 represents a first analog signal having a range of frequencies. For use in such applications, target frequency responses for filter 830 are calculated over a range of frequencies of the first analog signal by formulating and solving the above set of equations over such range of frequencies. Then, for each conversion clock period number of filter 830, filter coefficients are calculated that give the filter a filter characteristic that approximates the target frequency response within a specified tolerance.

When the frequency of the first analog signal is swept over a range of frequencies to determine the target frequency response of filter 830 in each conversion clock period number, some anomalous results occur. It has been observed that, as the frequency of the first analog signal sweeps over a frequency corresponding to a harmonic of the frequency FIN of sub-harmonic clock signal SHC, discontinuities in the target frequency responses generally occur. An investigation indicated that these discontinuities occur when a new periodic error sweeps into, and an old periodic error sweeps out of, the Nyquist region for which the target frequency responses are being determined. Discarding the old periodic error and incorporating the new periodic error causes a step change in the target frequency responses. In the equations expressed in matrix form and set forth above, the discontinuities correspond to frequencies at which the rows of the matrix shift up or down by one. One row departs the matrix and a new row enters. Such discontinuities in the target frequency responses are difficult to approximate using practical filter designs, and are therefore undesirable.

The consequences of discontinuities in the matrix equations have been mitigated by generating an over-specified system of equations upon which a weighted least-squares solution is found. The weights on the entering periodic error are slowly increased and the weights on the departing periodic error are slowly decreased. This avoids the abrupt changes in the target frequency responses of filter 830, and provides target frequency responses that can be approximated with acceptable accuracy using relatively simple filter structures. Increasing the number of rows in the matrix from N (as in the example shown above) to N+2 is typically sufficient. The rows represent the N+2 discrete responses that are in or are closest to the Nyquist region for which the target frequency responses are being determined. Note that, for some frequencies of the first analog signal, there will be two non-zero entries in the above matrix equation each indicating a value of D(f). The additional non-zero entry corresponds to the desired image at a frequency equal to the frequency $F_s$ of conversion clock signal CC above or below the frequency of the first analog signal associated with the row in the matrix equations. In an embodiment, a raised-cosine taper has been successfully applied to weight the periodic errors entering and departing the matrix.

Digital-to-analog converter 204 is characterized to determine the target frequency responses of its constituent conversion filters, described below with reference to FIG. 21. Such characterization is needed to enable the above method to be used to determine the target frequency response of filter 830 in each conversion clock period number. In one example, the digital input signal supplied to digital input 202 of modified digital signal generator 842 has a single non-zero digital input signal value in the conversion clock period immediately following each positive-going (or negative-going) transition of sub-harmonic clock signal SHC and a zero digital input signal value in each of the remaining N–1 conversion clock periods. The analog output signal generated by digital-to-analog conversion system 800 in response to such a digital input signal is a pulse having a duty cycle of 1:N. The output waveform of digital-to-analog conversion system 800 is then subject to a Fourier transform or another suitable time domain to frequency domain transform to generate a frequency response of the conversion filter (equivalent to element 24 described below with reference to FIG. 21) of conversion channel zero of digital-to-analog converter 204. The above-described process is repeated with a digital input signal in which the single non-zero digital input signal value is temporally offset from the transition of sub-harmonic clock signal SHC by 1, 2, 3, ..., (N–1) conversion clock periods to determine the frequency responses of the conversion filters of conversion channels 1 through (N–1) of digital-to-analog converter 204. The calculated conversion filter responses are then inserted into the above matrix equations to determine a target frequency response of filter 830 in the respective conversion clock period number. Then, filter coefficients for filter 830 in the respective conversion clock period number are determined from the respective target frequency response.

The effectiveness with which modified digital signal generator 842 mitigates the periodic error of digital-to-analog converter 204 depends on the accuracy with which filter 830 approximates its respective target frequency response in each conversion clock period number. This in turn depends in part on the order of the respective filter. However, increasing the order of filter 830 increases the complexity of the filter and the task of determining the values of the filter coefficients thereof, since the number of filter coefficients whose values need to be determined depends on the order of the filter.

In some applications, the target frequency response of cyclic time-varying filter 830 in each of the conversion clock period numbers can be regarded as differing by a relatively small difference from a common target frequency response common to filter 830 in all of the conversion clock period numbers. Similarly, the target frequency response of the correction filter 821 of each of the filter channels 813 of cyclic time-varying filter 836 can be regarded as differing by a relatively small difference from a common target frequency response common to the correction filters 821 of all of the filter channels 813 of filter 836. The common target filter characteristic allows a specified mitigation of the periodic error of digital-to-analog converter 204 to be obtained using embodiments of cyclic time-varying filters 830 and 836 with fewer taps by additionally using a fixed-coefficient filter to provide the common target filter characteristic.

Figure 18:
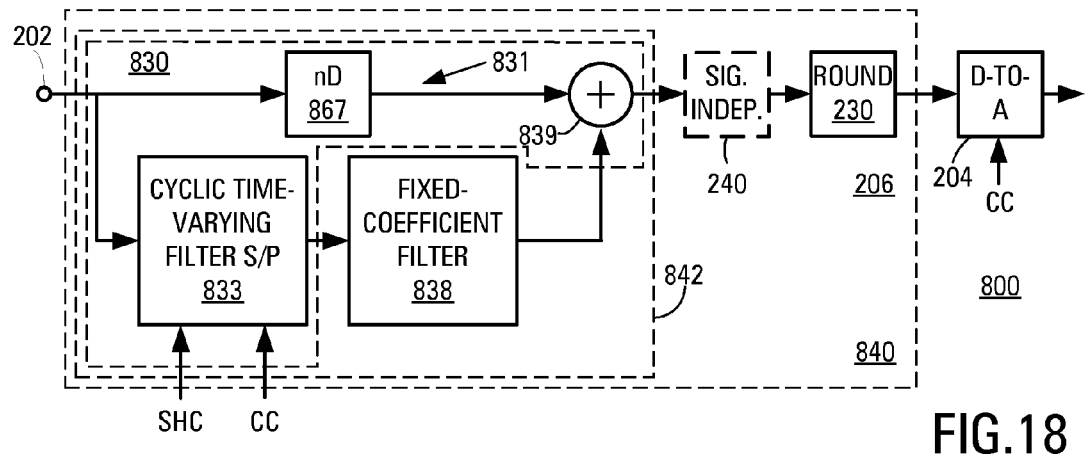
FIG. 18 is a block diagram showing another example of a digital-to-analog conversion system in accordance with an embodiment of the invention in which the modified digital signal generator is composed of a two-path cyclic time-varying filter with a fixed coefficient filter in its side-path.

FIG. 18 is a block diagram showing another example of digital-to-analog conversion system 800 in which modified digital signal generator 842 is based on cyclic time-varying filter 830 described above with reference to FIG. 16 with a fixed-coefficient filter 838 interposed between the output of side-path 833 and one input of summing element 839. A delay circuit 867 that provides a delay that maintains the causality of filter 830 is located in main path 831. In an embodiment in which the filter coefficients of time-varying filter 830 and fixed-coefficient filter 838 are scaled, scaling circuit 857 is omitted from the side-path 833 of time-varying filter 830, and a scaling circuit (not shown) common to time-varying filter 830 and fixed-coefficient filter 838 is interposed between the output of fixed-coefficient filter 838 and the respective input of summing element 839. The example of modified digital signal generator 842 shown in FIG. 18 provides a specified mitigation of the signal-dependent periodic error of digital-to-analog converter 204 with filter 830 having fewer taps than in the example of modified digital signal generator 842 shown in FIG. 16.

To determine the filter characteristic of fixed-coefficient filter 838, digital-to-analog converter 204 is characterized as described above to determine a target filter characteristic for filter 830 in each conversion clock period number. The target filter characteristics are then analyzed to identify a common target filter characteristic and fixed coefficient filter 838 is designed to approximate such common target filter characteristic. Then, for each conversion clock period number, the actual filter characteristic of fixed coefficient filter 838 is subtracted from the target filter characteristic of filter 830 to generate a respective target incremental filter characteristic. A set of filter coefficients that enable time-varying filter 830 to approximate within a specified tolerance the target incremental filter characteristic in the respective conversion clock period number is then determined.

The two-path implementation of cyclic time-varying filter 836 described above with reference to FIG. 17 may be similarly modified to interpose fixed-coefficient filter 838 between the output of the summing element 839 connected to the output of filter channel FC0 and the additional summing element (not shown) that sums the side path and the main path. Such modified filter 836 provides a specified mitigation of the signal-dependent periodic error of digital-to-analog converter 204 with the correction filter 821 of each filter channel 813 having fewer taps than in the example of modified digital signal generator 842 shown in FIG. 17.

In the example of cyclic time-varying filter 836 described above with reference to FIG. 17, the correction filter 821 of each filter channel 813 operates at a frequency equal to the frequency $F_s$ of the conversion clock signal CC of digital-to-analog converter 204. Filters that provide acceptable performance at high operating frequencies are typically difficult to design. In filter channel 819 shown in FIG. 17, and in each of the remaining filter channels 813, correction filter 821 and downsampler 823 collectively constitute a decimator 807. By implementing the decimator in each filter channel 813 as a polyphase decimator, the operational frequency of the correction filter 821 constituting the decimator 807 in each filter channel 813 can be reduced, and acceptable performance can be obtained even at a high conversion frequency.

Figure 19:
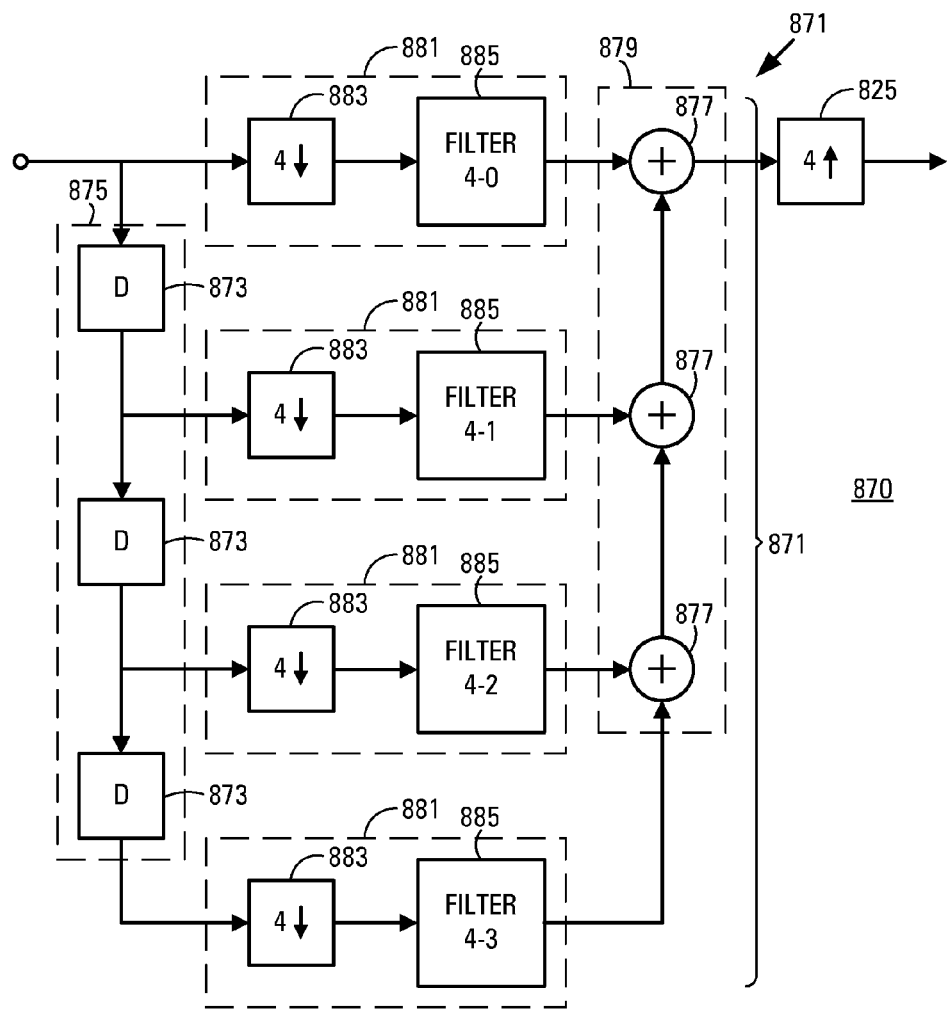
FIG. 19 is a block diagram showing an example of one of the filter channels of the modified digital signal generator shown in FIG. 17 in which the decimator has a polyphase implementation.

FIG. 19 is a block diagram showing an example 870 of exemplary filter channel 819 of filter 836 shown in FIG. 17 in which decimator 807 is implemented as a polyphase decimator. This allows the correction filters to operate at the frequency of sub-harmonic clock signal SHC. Remaining filter channels 813 having polyphase implementations of their respective decimators are similar in structure. Filter channel 870 is composed of a polyphase decimator 871 in series with upsampler 825. Polyphase decimator 871 is equivalent to decimator 807 described above with reference to FIG. 17. Upsampler 825 is also described above with reference to FIG. 17. The number of phases is equal to the number of filter channels 813 (FIG. 17) in cyclic time varying filter-based modified digital signal generator 842, and, hence, is equal to the number of the sub-harmonic of the conversion frequency equal to the periodicity of the periodic error of digital-to-analog converter 204. In the example shown, polyphase decimator 871 is a four-phase decimator.

In polyphase decimator 871, three delay circuits 873 connected in series form an input shift register 875, three two-input summing elements 877 connected in series form an output circuit 879, and four phases, each indicated by reference numeral 881, extend between nodes of input shift register 875 and respective nodes of output circuit 879. Each phase 881 is composed of a downsampler 883 and a respective correction filter component 885 connected in series between a node of input shift register 875 and a respective node of output circuit 879. In the four-phase example shown, each downsampler 883 is a 4:1 downsampler and upsampler 825 is a 4:1 upsampler. In general, each downsampler 883 is a N:1 downsampler and upsampler 825 is a: 1 upsampler, where N is the number of filter channels 813 in modified digital signal generator 842. Correction filter components 885 are components of correction filter 821 described above with reference to FIG. 17.

In each phase 881, downsampler 883 precedes correction filter component 885. Consequently, correction filter component 885 operates at 1/N of the frequency of the conversion clock signal CC of digital-to-analog converter 204, i.e., at the frequency of sub-harmonic clock signal SHC. Moreover, since correction filter components 885 constitute the components of the correction filter 821 (FIG. 17) of decimator 807, the taps of correction filter 821 are distributed among the correction filter components 885 of polyphase decimator 871. In an example in which correction filter 821 is a 9-tap filter, the correction filter components 885 of three of the phases 881 are two-tap filters and the correction filter component 885 of one of the phases 881 is a three-tap filter. In examples of polyphase decimator 871 in which the number of phases 881 is greater than the number of taps of correction filter 821, each correction filter component 885 is either a one-tap filter, i.e., a predetermined gain, or a zero-tap filter. Phases in which correction filter component 885 is a zero-tap filter can be omitted. More information regarding polyphase filter implementations is disclosed by P. P. Vaudyanathan in Multirate Systems and Filter Banks, 122-125, Prentice-Hall, ISBN 0-13-605718-7 (1993).

In an embodiment of modified digital signal generator 842 comprising polyphase decimator 871, in at least some of the filter channels 813, the function of at least part of input shift register 875 can be provided by delay circuit 809 and input shift register 811 (FIG. 17). Moreover, input shift register 875 and downsamplers 883 can be shared among the polyphase decimators 871 of two or more of filter channels 813.

An example of modified digital signal generator 842 similar to that described above with reference to FIG. 18, in which fixed coefficient filter 838 is interposed between the side-path output of a two-path implementation of cyclic time-varying filter 830 and the input of summing element 839, may be manipulated so that it can be implemented in a polyphase manner. In such implementation, N filter channels 813 generate the modified digital signal. Each filter channel 813 comprises N correction filter components 885. Each correction filter component 885 operates at the frequency of sub-harmonic clock signal SHC.

The above-described embodiments of modified digital signal generator 206 are typically implemented in hardware such as an integrated circuit having bipolar, N-MOS, P-MOS or CMOS devices. Design libraries comprising designs for such circuit elements as summing elements, differencing elements, multipliers, filters, scaling elements, delay elements, rounding circuits and volatile and non-volatile memory are commercially available can be used to design such hardware implementation of modified digital signal generator 206. Digital-to-analog converter 204 can be fabricated on the same substrate as modified digital signal generator 206, or can an independent device connected to modified digital signal generator 206 by a printed circuit board, for example. Alternatively, modified digital signal generator 206 can be fabricated from separate circuit elements interconnected by a printed circuit or by some other interconnection technique.

The above-described embodiments of modified digital signal generator 206 may alternatively be implemented in pre-fabricated hardware such as an application-specific integrated circuit (ASIC) or a field-programmable gate array (FPGA). Design libraries providing designs for such circuit elements as summing elements, differencing elements, multipliers, filters, scaling elements, delay elements, rounding circuits and volatile and non-volatile memory are commercially available can be used to configure such pre-fabricated hardware to provide modified digital signal generator 206.

The above-described embodiments of modified digital signal generator 206 can alternatively be implemented in software running on a suitable computational device (not shown) such as a microprocessor or a digital signal processor (DSP). Digital-to-analog converter 204 may additionally constitute part of a digital signal processor. Programming modules capable of programming a computational device to provide such elements as summing elements, differencing elements, multipliers, filters, scaling elements, delay elements and rounding elements are commercially available and may be used to program a computational device to provide a software implementation of modified digital signal generator 206. In such software implementations of modified digital signal generator 206, the various elements described in this disclosure are typically ephemeral, and typically only exist temporarily as the program executes.

The program in response to which the computational device operates can be fixed in a suitable computer-readable medium (not shown) such as a set of floppy disks, an optically-read disk, a hard disk, a CD-ROM, a DVD-ROM, a flash memory, a read-only memory or a programmable read-only memory. The program is then transferred to a memory that forms part of the computational device, or is external to the computational device. Alternatively, the program can be transmitted to the memory of the computational device by a suitable data link.

The above-described implementations of modified digital signal generator 206 differ in operational speed, with the hardware implementation typically having the highest operational speed and the software implementation typically having the lowest operational speed. Modified digital signal generator 206 may be implemented differently from the examples just described.

In the above-described examples of a digital-to-analog conversion system in accordance with various embodiments of the invention, the digital input signal received at digital input 202 is any arbitrary digital signal capable of being converted to an analog signal by digital-to-analog converter 204. In other digital-to-analog conversion systems, the digital input signal subject to digital-to-analog conversion is known in advance. For example, some types of analog signal source comprise a memory in which is stored a digital signal that defines an analog signal. To generate the analog signal, the digital signal is read out of the memory and is converted to an analog signal by a digital-to-analog converter. In accordance with an embodiment of the invention, in an analog signal source in which the digital-to-analog converter is subject to a periodic error, a modified digital signal is stored in the memory. When read out of the memory and input to the digital-to-analog converter, the modified digital signal mitigates the periodic error of the digital-to-analog converter.

Figure 20A:
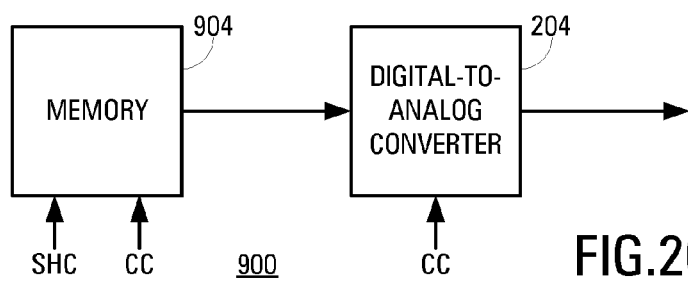
FIG. 20A is a block diagram showing an example of an analog signal generator in accordance with an embodiment of the invention.
Figure 20B:
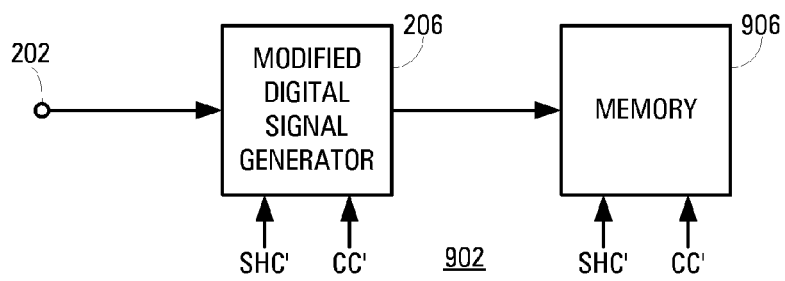
FIG. 20B is a block diagram showing an example of a modified digital signal source capable of providing the modified digital signal used by the analog signal generator shown in FIG. 20A.

FIG. 20A is a block diagram showing an example of an analog signal generator 900 in accordance with an embodiment of the invention. FIG. 20B is a block diagram showing an example of a modified digital signal source 902 capable of generating the modified digital signal used by analog signal generator 900. Turning first to FIG. 20A, analog signal generator 900 is composed of digital-to-analog converter 204 and a memory 904. Digital-to-analog converter 204 is subject to a periodic error, as described above. The output of memory 904 is connected to the input of digital-to-analog converter 204. The output of digital-to-analog converter 204 provides the analog signal. Memory 904 stores modified digital signal values constituting a modified digital signal that, when input to digital-to-analog converter 204 mitigates the periodic error of digital-to-analog converter 204.

To generate an analog signal, the modified digital signal is read out of memory 904 and is input to digital-to-analog converter 204. When the waveform of the analog signal is a repetitive waveform, the modified digital signal is repetitively read out of memory 904. The digital-to-analog converter converts the modified digital signal to an analog signal in which the periodic errors of the digital-to-analog converter are mitigated. When providing the modified digital signal to digital-to-analog converter 204, the memory operates in response to both conversion clock signal CC and sub-harmonic clock signal SHC to ensure that the modified digital signal read out of memory 902 is locked in phase to the periodic error of digital-to-analog converter 204.

Turning now to FIG. 20B, modified digital signal source 902 is composed of digital input 202, modified digital signal generator 206 and a memory 906. A digital input signal that represents the specified waveform of the analog signal to be generated by analog signal source 900 is received at digital input 202. Modified digital signal generator 206 operates as described above in response to the digital input signal to generate the modified digital signal and the modified digital signal values constituting the modified digital are stored in memory 906. In some embodiments, memory 906 is the same memory device as memory 904. In other embodiments, memory 906 is a different memory device from memory 904, in which case, the modified digital signal values are copied from memory 906 to memory 904 via a suitable data link.

While generating and storing the modified digital signal, modified digital signal generator 206 and memory 906 operate in response to a conversion clock signal CC' and a sub-harmonic clock signal SHC'. Conversion clock signal CC' and sub-harmonic clock signal SHC have the same temporal relationship as conversion clock signal CC and sub-harmonic clock signal SHC in analog signal generator 900. In some embodiments, conversion clock signal CC' and sub-harmonic clock signal SHC' have the same frequency as conversion clock signal CC and sub-harmonic clock signal SHC, respectively. In this case, modified digital signal generator 206 and memory 906 operate at the conversion frequency of digital-to-analog converter 204. In other embodiments, the digital input signal is provided to digital input 202, or the modified digital signal generator fetches the digital input signal values, at a rate different from, and typically less than, the real-time rate of the digital input signal. In this case, conversion clock signal CC' and sub-harmonic clock signal SHC' differ in frequency from conversion clock signal CC and sub-harmonic clock signal SHC, respectively, in proportion to the differing rate of the digital input signal. Additionally, modified digital signal generator 206 operates at a rate that differs from the conversion frequency of digital-to-analog converter 204 in proportion to the differing rate of the digital input signal. This allows modified digital signal generator 206 to be conveniently implemented in software, as described above. Implementing modified digital signal generator 206 in software and running the modified digital signal generator slower than real time allows the use of filter structures considerably more complex than would be feasible in a hardware implementation. Such complex filter structures provide more effective periodic mitigation than simpler filter structures that can only approximate the target filter response.

Mathematical Analysis

1. Introduction.

This portion of the disclosure presents a mathematical analysis of the processes disclosed herein with reference to FIGS. 16-19 for mitigating the signal-dependent periodic errors of digital-to-analog converters. Digital-to-analog converters that contain interpolators or interleavers that operate at an integer sub-multiple of the conversion frequency of the digital-to-analog converter commonly have timing or amplitude errors that repeat every N conversion clock periods. The analysis set forth herein is also applicable to digital-to-analog conversion systems in which multiple digital-to-analog converters are interleaved to form a digital-to-analog converter with a conversion frequency that is an integer multiple of the conversion frequency of the individual digital-to-analog converters. In this analysis, Section 2 describes how such periodic errors are generated; Section 3 develops impairment models in the frequency domain for periodic time and amplitude errors and Section 5 develops a method for mitigating such periodic errors by using a modified digital signal generator composed of N discrete filter characteristics.

Figure 21:
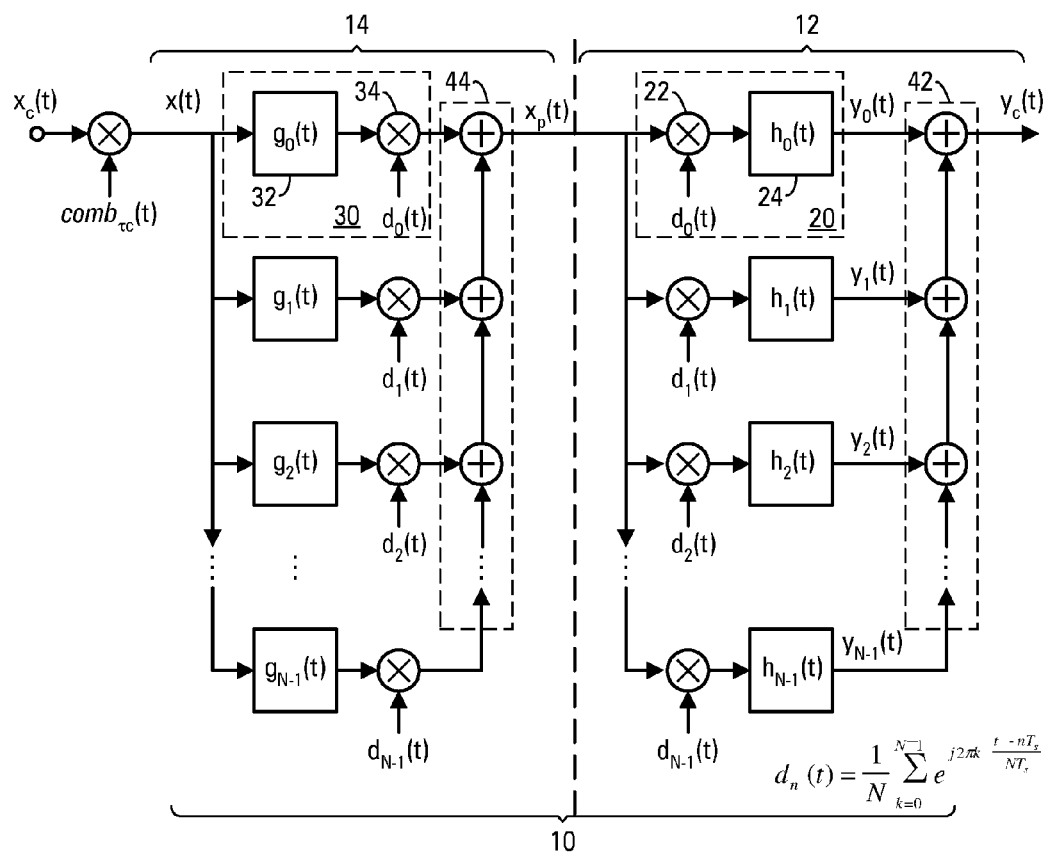
FIG. 21 is a block diagram showing a model of a digital-to-analog conversion system comprising a digital-to-analog converter having a conversion frequency and subject to a signal-dependent periodic error with a periodicity equal to that of an N-th sub-harmonic of the conversion frequency.

FIG. 21 is a block diagram showing a model of a digital-to-analog conversion system 10 comprising a digital-to-analog converter 12 having a conversion frequency and subject to a periodic error with a periodicity equal to that of an N-th sub-harmonic of the conversion frequency. Digital-to-analog conversion system 10 additionally comprises a modified digital signal generator 14 that mitigates the periodic error of digital-to-analog converter 12.

FIG. 21 shows, and the analysis set forth below describes, an example of digital-to-analog converter 12 structured as an interleaved digital-to-analog converter composed of N digital-to-analog converters and a summing chain 42. An exemplary one of the digital-to-analog converters is shown at 20. To avoid confusion between digital-to-analog converter 12 and its constituent digital-to-analog converters 20, constituent digital-to-analog converters 20 will be referred to below as digital-to-analog conversion channels 20. Reference numeral 20 will additionally be used to refer to the digital-to-analog conversion channels collectively.

A conceptual continuous first analog signal $x_c(t)$ is sampled at a sampling frequency $F_s$ equal to the conversion frequency $F_s$ of digital-to-analog converter 12. The sampling is performed using a comb with a period $T_s$ equal to the period $1/F_s$ of conversion frequency $F_s$. The sampling generates an input impulse sequence $x(t)$ that is no longer a continuous function in time, but instead has non-zero values only at times $qT_s$, where q is an integer. Input impulse sequence $x(t)$ is processed by N filter channels, an exemplary one of which is shown at 30. Each filter channel 30 is composed of a correction filter 32 and a staggered downsampler 34 in series. Correction filter 32 and staggered downsampler 34 collectively constitute a decimator. Correction filter 32 has an impulse response represented by $g_n(t)$, where n is the number of the filter channel 30 in which correction filter 32 is located ($0 \leq n \leq N-1$). In each filter channel 30, staggered downsampler 34 downsamples the output of the correction filter 32 by a factor of N and, at a temporal offset of n conversion clock periods, outputs the resulting value to a respective input of summing chain 44. Summing chain interleaves the values output by the staggered downsamplers 34 in all the filter channels 30 to form a modified impulse sequence $x_p(t)$ that is output to digital-to-analog converter 12.

As noted above, digital-to-analog converter 12 is composed of N digital-to-analog conversion channels 20. Each digital-to-analog conversion channel 20 is composed of a staggered downsampler 22 and a conversion filter 24 in series. Staggered downsampler 22 downsamples modified impulse sequence $x_p(t)$ by a factor of N. The staggered downsampler 22 in each conversion channel 20 sequentially selects a respective value of modified input impulse sequence $x_p(t)$ and presents the selected value to the respective conversion filter 24. Each conversion filter 24 has a respective impulse response $h_n(t)$.

2. Sub-Harmonic Image Generation Mechanisms

In an ideal zero-order-hold (ZOH) digital-to-analog converter 12, each conversion filter 24 nominally represents a boxcar function of length $T_s$ that would convert the weighted impulse output by the respective staggered downsampler 22 to constant values over successive conversion clock periods. As will be demonstrated below, the impulse responses of conversion filters 24 can be modified from their nominal shape to represent the effect of sampling time (and amplitude) errors of the respective digital-to-analog conversion channels 20. In this section it will be assumed that correction filters 32 have unity gain, i.e., a pass-through characteristic, to demonstrate how a periodic error can occur in digital-to-analog converter 12. With modified digital signal generator 14 leaving input impulse sequence $x(t)$ unchanged, modified impulse sequence $x_p(t)$ is identical to input impulse sequence $x(t)$, and modified digital signal generator 14 essentially disappears. How modified digital signal generator 14 uses N correction filters 32 to generate modified input impulse sequence $x_p(t)$ input to digital-to-analog converter 12 to mitigate the periodic error of digital-to-analog converter 12 will be described in Section 5 below.

In the time domain, the staggered downsampling function $d_n(t)$ performed by the staggered downsampler 34 in the n-th filter channel 30 and by the staggered downsampler 22 in the n-th digital-to-analog conversion channel 20 is given by:

$$d_n(t) = \frac{1}{N} \sum_{k=0}^{N-1} e^{j2\pi k \frac{t-nT_s}{T_s}} \quad (1)$$

where k is an index of summation. In each filter channel 30, staggered downsampling function $d_n(t)$ performed by staggered downsampler 34 provides a staggered downsampling of the output of the respective correction filter 32. Examination of staggered downsampling function $d_n(t)$ indicates it has value of zero at all the sampling instants $pT_s$ except when p mod N=n. When p mod N=n, staggered downsampling function $d_n(t)$ equals 1. Consequently, staggered downsampler 34 passes only one out of N of the impulses output by correction filter 32.

Summing chain 44 sums the outputs of the staggered downsamplers 34 of all the filter channels 30. The summed staggered downsampling functions, indexed on n, effectively commutate the outputs of filter channels 30 to generate the modified impulse sequence $x_p(t)$ input to digital-to-analog converter 12. Each of the filter channels 30 provides one modified value of the modified impulse sequence that is input to a respective one of the conversion channels 20 of digital-to-analog converter 12 in each period of the sub-harmonic clock signal. While FIG. 21 illustrates commutation to a single full-rate modified impulse sequence $x_p(t)$ input to digital-to-analog converter 12, a mathematically-equivalent model simply connects the output of each filter channel 30 directly to the input of the respective conversion channel 20 of digital-to-analog converter 12, as will be described below with reference to FIG. 25.

While a number of functions having the above-described functionality of staggered downsampling function $d_n(t)$ set forth in Equation (1) exist, staggered downsampling function $d_n(t)$ has a simple Fourier transform $F_n(f)$ that simplifies the analysis that follows. The Fourier transform $F_n(f)$ of staggered downsampling function $d_n(t)$ is given by:

$$F_n(f) = \frac{1}{N}\sum_{k=0}^{N-1} e^{-j2\pi\frac{nk}{N}} \delta\left(f - k\frac{F_s}{N}\right) \quad (2)$$

where $\delta$ is the Dirac delta function.

The spectrum $Y_n(f)$ of the analog output signal component $y_n(t)$ output by each conversion channel 20 in response to input impulse sequence $x(t)$ is given by:

$$Y_n(f) = [X_p(f) * F_n(f)] H_n(f) \quad (3)$$

where $X_p(f)$, $Y_n(f)$ and $H_n(f)$ are the Fourier transforms of the input impulse sequence $x(t)$, the analog output signal component $y_n(t)$ output by the n-th conversion channel 20 and the impulse response $h_n(t)$ of the conversion filter 24 of the n-th conversion channel 20, respectively, and the asterisk (*) denotes convolution.

Expanding Equation (3) gives:

$$Y_n(f) = \frac{1}{N}\left[\sum_{k=0}^{N-1} X_p(f) * e^{-j2\pi\frac{nk}{N}} \delta\left(f - k\frac{F_s}{N}\right)\right] H_n(f) \quad (4)$$

$$= \frac{1}{N} H_n(f) \sum_{k=0}^{N-1} e^{-j2\pi\frac{nk}{N}} X_p\left(f - k\frac{F_s}{N}\right).$$

The spectrum $Y_c(f)$ of the analog output signal $y_c(t)$ output by digital-to-analog converter 12 is given by the sum of the output spectra $Y_n(f)$ of the analog output signal components $y_n(t)$ output by digital-to-analog conversion channels 20:

$$Y_c(f) = \sum_{n=0}^{N-1} Y_n(f) \quad (5)$$

$$= \frac{1}{N}\sum_{n=0}^{N-1} H_n(f) \sum_{k=0}^{N-1} e^{-j2\pi\frac{nk}{N}} X_p\left(f - k\frac{F_s}{N}\right)$$

Interchanging the order of the summations yields:

$$Y_c(f) = \frac{1}{N}\sum_{k=0}^{N-1} X_p\left(f - k\frac{F_s}{N}\right) \sum_{n=0}^{N-1} H_n(f) e^{-j2\pi\frac{nk}{N}}. \quad (6)$$

It can be seen that the spectrum $Y_c(f)$ of the analog output signal $y_c(t)$ output by digital-to-analog converter 12 is composed of multiple images of the spectrum $X_p(f)$ of the input impulse sequence $x(t)$ offset in frequency by multiples of $F_s/N$ and weighted by the inner summation. The inner summation is closely related to a DFT of the responses across the frequency responses $H_n$ of the N conversion filters 24. Note that the DFT is across n, which denotes the channel number, and its outputs, for a frequency f, are indexed by k.

If the conversion filters 24 of all the conversion channels 20 have the same impulse response $h_n$, the spectrum $Y_c(f)$ of the analog output signal output by digital-to-analog converter 12 degenerates to:

$$Y_c(f) = \frac{1}{N}\sum_{k=0}^{N-1} X_p\left(f - k\frac{F_s}{N}\right) H(f) \sum_{n=0}^{N-1} e^{-j2\pi\frac{nk}{N}} \quad (7)$$

$$= X_p(f) H(f)$$

because:

$$\sum_{n=0}^{N-1} e^{-j2\pi\frac{nk}{N}} = \begin{cases} N & k \bmod N = 0 \\ 0 & \text{otherwise} \end{cases} \quad (8)$$

This is just the output of an embodiment of digital-to-analog converter 12 without any periodic errors. However, in an embodiment in which the responses of the conversion filters 24 of all the conversion channels 20 are not equal, the sums, for values of $k \neq 0$, will result in undesired sub-harmonic images with non-zero levels. The DFT $\Psi_k(f)$ across the non-identical frequency responses $H_n(f)$ of the conversion filters 24 of the N conversion channels 20 is defined as:

$$\Psi_k(f) = \frac{1}{N}\sum_{n=0}^{N-1} H_n(f) e^{-j2\pi\frac{nk}{N}} \quad (9)$$

With this substitution, the spectrum $Y_c(f)$ of the analog output signal output by digital-to-analog converter 12 becomes:

$$Y_c(f) = \sum_{k=0}^{N-1} \Psi_k(f) X_p\left(f - k\frac{F_s}{N}\right). \quad (10)$$

This shows that the relative levels of the sub-harmonic images are simply determined by the DFT across the frequency responses $H_n(f)$ of conversion filters 24. The ratios of the magnitudes of the DFT for non-zero values of k to the magnitude of the DFT for k=0 are the relative levels of the desired portion of the analog output signal of digital-to-analog converter 12 to the undesired portion of the analog output signal, i.e., the sub-harmonic images. An FFT may be used to improve the efficiency of evaluating this response.

3. Periodic Timing Error Modeling

Figure 22:
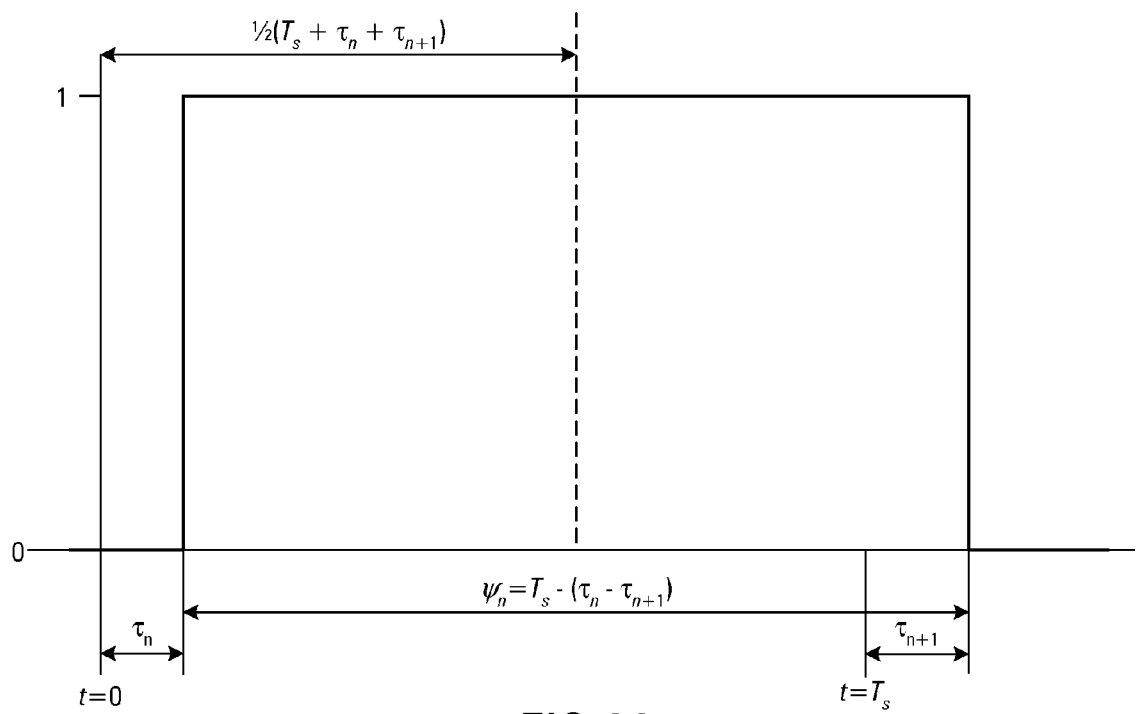
FIG. 22 is a graph showing the ZOH boxcar function of a representative conversion channel of the digital-to-analog converter model shown in FIG. 21.

Initially consider the uncorrected output spectrum of a non-interleaved embodiment of digital-to-analog converter 12 having only a periodic timing error. The responses of the constituent digital-to-analog conversion channels 20 of digital-to-analog converter 12 are determined by the impulse responses $h_n(t)$ of their respective conversion filters 24. In this analysis, the output of digital-to-analog converter 12 will be designated as $y(t)$ because no periodic error mitigation is performed. Modeling the effect of timing errors only, each conversion channel 20 is impaired by a respective timing error $\tau_n$. FIG. 22 is a graph showing the ZOH boxcar function of a representative conversion channel 20 of digital-to-analog converter 12. N respective boxcar functions are required to model the NRZ impulse responses of digital-to-analog converter 12 using this model.

The leading edge of the boxcar function for the n-th digital-to-analog conversion channel 20 of digital-to-analog converter 12 is delayed by a timing error $\tau_n$ and the width of the boxcar function is given by:

$$\psi_n = T_s - (\tau_n - \tau_{n+1})$$

where $\tau_{n+1}$ is the timing error of the leading edge of the boxcar function of the (n+1)-th digital-to-analog conversion channel 20. Note that width $\psi_n$ is periodic on N. A signal passing through a ZOH digital-to-analog converter incurs a group delay equal to the time to the mid-point of the boxcar function. This group delay is given by:

$$\tau_n + \frac{\psi_n}{2} = \tau_n + \frac{T_s}{2} - \frac{\tau_n}{2} + \frac{\tau_{n+1}}{2} = \frac{1}{2}(T_s + \tau_n + \tau_{n+1}). \quad (11)$$

The width and delay are functions of timing errors of both the current (n-th) digital-to-analog conversion channel 20 and the next ((n+1)-th) digital-to-analog conversion channel 20. Note that the delays can be bipolar, denoting early or late, and index n is interpreted modulo N. The impairment responses are the Fourier transforms of the boxcar functions $h_n(t)$, and are given by:

$$H_n(f) = \psi_n \operatorname{sinc}(\psi_n f) e^{-j\pi f(T_s + \tau_n + \tau_{n+1})} \quad (12)$$
$$= e^{-j\pi f T_s} \psi_n \operatorname{sinc}(\psi_n f) e^{-j\pi f(\tau_n + \tau_{n+1})}$$

The variation of width $\psi_n$ from the nominal width of $T_s$ causes frequency-dependent differences among the responses $H_n(f)$ across the entire frequency range. Additionally, the sampling time offset errors $\tau_n, \tau_{n+1}$ introduce a different linear phase term on each phase. The first linear phase term in the second equation is due to the causal requirement on the nominal boxcar function. Under this impairment model, the Fourier transform $\Psi_k(f)$ of the variations of width $\psi_n$ is given by:

$$\Psi_k(f) = \frac{e^{-j\pi f T_s}}{N} \sum_{n=0}^{N-1} \psi_n \operatorname{sinc}(\psi_n f) e^{-j\pi f(\tau_n + \tau_{n+1})} e^{-j2\pi \frac{nk}{N}}. \quad (13)$$

The ZOH $T_s/2$ delay induces a linear phase term in the output spectrum and is not relevant to the periodic error levels. For small values of $\tau_n$, the $\psi_n$ values are close to $T_s$ and the sinc amplitudes are not significantly different. The linear phase terms $e^{-j\pi f(\tau_n + \tau_{n+1})}$ generally introduce the greatest differences in these frequency responses, particularly at higher signal frequencies.

Returning to the timing error case, the response of digital-to-analog conversion system 10 to a simple sinusoid will be described next. Let the input impulse sequence x(t) be obtained by sampling a cosinusoidal first analog signal $x_c(t)$ having an amplitude $A_e$, a frequency $F_e$ and a phase $\phi_e$ and represented by:

$$x_c(t) = A_e \cos(2\pi F_e t + \phi_e), \quad (14)$$

where the frequency $F_e$ of the first analog signal is normally assumed to be non-negative for real signals.

The Fourier transform of the first analog signal is:

$$X_c(f) = \frac{A_e}{2}(e^{j\phi_e}\delta(f - F_e) + e^{-j\phi_e}\delta(f + F_e)). \quad (15)$$

The spectrum of the first analog signal sampled at a sampling frequency $F_s$ equal to the conversion frequency $F_s$ of digital-to-analog converter 12 is the scaled periodic repetition of the spectrum of the first analog signal on $F_s$:

$$X(f) = \frac{A_e}{2T_s} \sum_{m=-\infty}^{\infty} e^{j\phi_e}\delta(f - F_e - mF_s) + e^{-j\phi_e}\delta(f + F_e - mF_s). \quad (16)$$

The spectrum of the analog output signal $y_c(t)$ output by digital-to-analog converter 12 in response to the input impulse sequence is thus given by:

$$Y(f) = \frac{A_e}{2T_s} \sum_{m=-\infty}^{\infty} \sum_{k=0}^{N-1} \Psi_k(f) \left[ \begin{array}{l} e^{j\phi_e}\delta\!\left(f - F_e - F_s\!\left(m + \frac{k}{N}\right)\right) + \\ e^{-j\phi_e}\delta\!\left(f + F_e - F_s\!\left(m + \frac{k}{N}\right)\right) \end{array} \right]. \quad (17)$$

This function only has a non-zero weight at the frequencies of the spectral components. Hence Equation 17 can be written as:

$$Y(f) = \frac{A_e}{2T_s} \sum_{m=-\infty}^{\infty} \sum_{k=0}^{N-1} \quad (18)$$

$$\left[ \begin{array}{l} \Psi_k\!\left(F_e + F_s\!\left(m + \frac{k}{N}\right)\right) e^{j\phi_e}\delta\!\left(f - F_e - F_s\!\left(m + \frac{k}{N}\right)\right) + \\ \Psi_k\!\left(-F_e + F_s\!\left(m + \frac{k}{N}\right)\right) e^{-j\phi_e}\delta\!\left(f + F_e - F_s\!\left(m + \frac{k}{N}\right)\right) \end{array} \right].$$

Evident in Equation 18 are sub-harmonic spectral components present at frequency offsets of $kF_s/N$ from the frequency $F_e$ of the first analog signal. Evaluation at just a few small values of m will yield all the spectral components in the low Nyquist regions.

Section 7 below contains the derivation of the weights of the uncorrected spectral components at frequencies $$\pm F_e + p\frac{F_s}{N}.$$

This derivation is useful in numerical evaluation of these spectral components.

4. Finite Risetime and Periodic Amplitude Error Modeling

Figure 23:
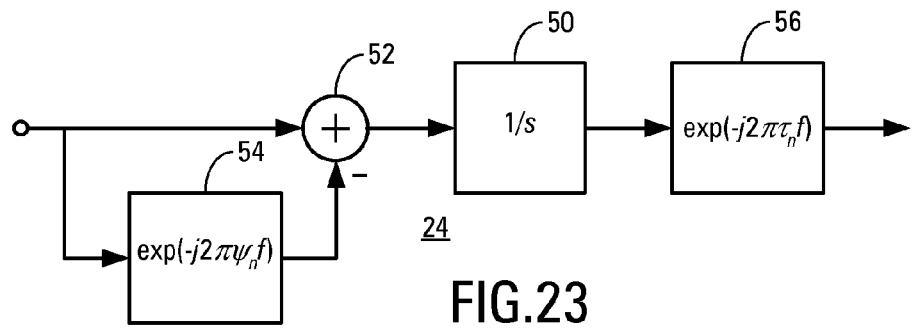
FIG. 23 is a block diagram showing a model of the conversion filter of one of the conversion channels of the digital-to-analog converter model shown in FIG. 21.

This section shows how the functions $h_n(t)$ that describe the impulse responses of conversion filters 24 can additionally emulate finite risetimes. FIG. 23 is a block diagram showing a model of conversion filter 24 in which $s = j2\pi f$. The impulse response represented by function $h_n(t)$ may be developed as follows. The impulse enters an integrator 50 via a main path that includes a summing element 52 and excites the integrator to generate an output step of height 1 (for a unity-weighted impulse) at time 0. The impulse also enters a side path that contains a delay 54 that provides a delay of duration $\psi_n$. A time $\psi_n$ after the original impulse arrives, the impulse emerges from delay 54, is inverted and is input via summing element 52 to integrator 50. This generates an equal and opposite step, which returns the output of integrator 50 to zero, thus terminating the boxcar function. An additional delay 56 that produces a delay of duration $\tau_n$ delays the boxcar function output by integrator 50 to implement the above-described timing error.

Figure 24:
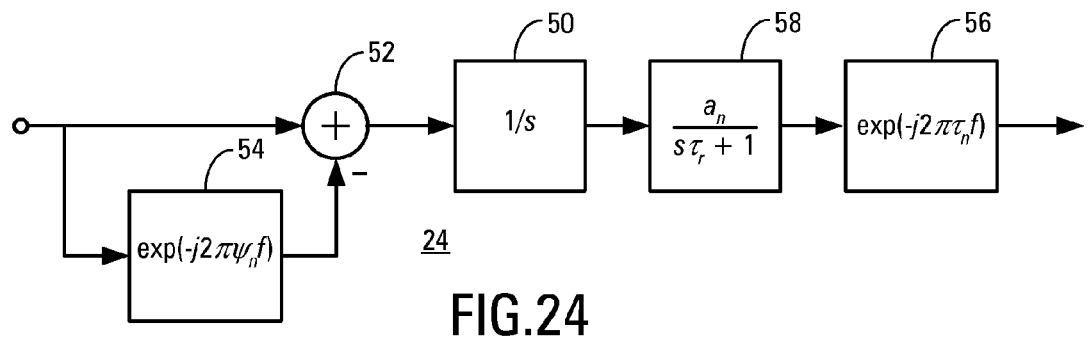
FIG. 24 is a block diagram showing a conversion filter model based on the conversion filter model shown in FIG. 23 with additional risetime modelling.

One or more additional transfer functions representing, for example, a linear risetime effect or periodic amplitude errors may be incorporated into the model described above with reference to FIG. 23. FIG. 24 is a block diagram showing an example of a model that additionally incorporates a block 58 that represents a simple RC response. In one example, $\tau_r$ represents the risetime of digital-to-analog converter 12. The model shown in FIG. 24 can be further indexed on n to model conversion channels 20 having different risetimes. In embodiments in which conversion channels 20 differ negligibly in risetime, risetime will not contribute to the periodic error. In this case, it is simpler to move the risetime modelling to the output of digital-to-analog converter 12 where it effectively becomes part of the reconstruction filter. The $a_n$ term in block 58 represent a periodic amplitude error between conversion channels 20. The periodic amplitude errors could alternatively be included in the original boxcar-based analysis.

The above-described exemplary model and analyses fall into the class of linear, periodic, time-varying systems. For the mitigation scheme to work well, the impairments must closely satisfy the linearity conditions.

5. Correction Analysis

Figure 25:
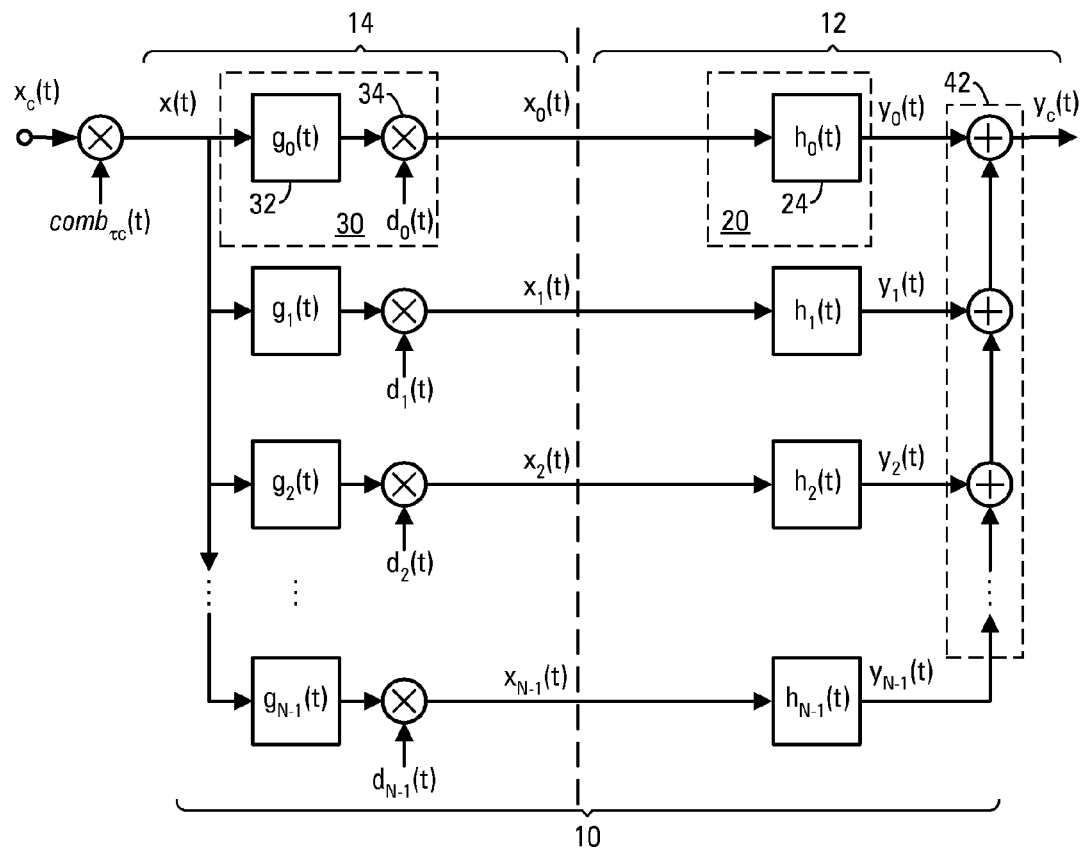
FIG. 25 is a block diagram showing an equivalent but simpler representation of the digital-to-analog conversion system model shown in FIG. 21.

FIG. 25 is a block diagram showing an equivalent but simpler depiction of the model of digital-to-analog conversion system 10 described above with reference to FIG. 21. In the depiction shown in FIG. 25, each conversion channel 20 is composed of a respective conversion filter 24 that receives a respective modified input impulse sequence component $x_p(t)$ from a respective filter channel 30 of modified digital signal generator 14.

The process for determining the frequency responses of the N correction filters 32 that will mitigate the periodic error resulting from the impairments of digital-to-analog converter 12 whose modelling was described above will be described next. In addition, correction filters 32 can concurrently correct for other frequency-dependent effects such as sinc rolloff and risetime effects. Such corrections will also be described but the emphasis will be on mitigating the periodic error of digital-to-analog converter 12. In most applications it may be more efficient to use separate filters to correct such other frequency-dependent effects.

The spectrum Y(f) of the analog output signal y(t) output by digital-to-analog converter 12 without modified digital signal generator 14 is described above. The spectrum $Y_c(f)$ of the analog output signal $y_c(t)$ output by digital-to-analog conversion system 10 comprising the tandem arrangement of modified digital signal generator 14 and digital-to-analog converter 12 will be described next.

The spectrum $Y_n(f)$ of the analog output signal component $y_n(t)$ output by each conversion channel 20 of digital-to-analog converter 12 is given by:

$$Y_n(f) = \{[X(f)G_n(f)]*F(f)\}H_n(f) \tag{19}$$

where $G_n(f)$ is the Fourier transform of the impulse response $g_n(t)$ of correction filter 32. Note that X(f) and $G_n(f)$ are periodic on $F_s$.

Expanding Equation 19 gives:

$$Y_n(f) = \frac{1}{N} H_n(f) \sum_{k=0}^{N-1} e^{-j2\pi\frac{nk}{N}} [X(f)G_n(f)] * \delta\left(f - k\frac{F_s}{N}\right) \tag{20}$$

$$= \frac{1}{N} H_n(f) \sum_{k=0}^{N-1} e^{-j2\pi\frac{nk}{N}} X\left(f - k\frac{F_s}{N}\right) G_n\left(f - k\frac{F_s}{N}\right)$$

The spectrum Y(f) of the analog output signal $y_c(t)$ output by digital-to-analog conversion system 10 is simply the sum of the spectra $Y_n(f)$ of the analog output signal components $y_n(t)$ output by the respective conversion channels 20:

$$Y(f) = \tag{21}$$

$$\sum_{n=0}^{N-1} Y_n(f) = \frac{1}{N} \sum_{n=0}^{N-1} H_n(f) \sum_{k=0}^{N-1} e^{-j2\pi\frac{nk}{N}} X\left(f - k\frac{F_s}{N}\right) G_n\left(f - k\frac{F_s}{N}\right).$$

Interchanging the order of summation gives:

$$Y(f) = \frac{1}{N} \sum_{k=0}^{N-1} X\left(f - k\frac{F_s}{N}\right) \sum_{n=0}^{N-1} e^{-j2\pi\frac{nk}{N}} H_n(f) G_n\left(f - k\frac{F_s}{N}\right). \tag{22}$$

Equation 22 shows that the desired output spectrum is obtained when k=0, and that N−1 undesired sub-harmonic spectral components are additionally obtained when k≠0.

Consider an input impulse sequence obtained by sampling a first analog signal having a frequency $F_e$. As just shown, the analog output signal generated from such input impulse sequence will include sub-harmonic spectral components at intervals spaced in frequency by $F_s/N$. However, correction filters 32 themselves will only be operating on the input impulse sequence at the frequency $F_e$ of the first analog signal periodically replicated on the conversion frequency $F_s$. What needs to be known is the response of each correction filter 32 at frequency $F_e$ such that the unwanted sub-harmonic spectral components in the (analog) frequency range of interest are mitigated. As noted above, sampling an analog signal $x_c(t)$ that is a real cosinusoid and has a frequency $F_e$ at a sampling frequency of $F_s$ gives an input impulse sequence x(t) with a spectrum represented by:

$$X(f) = \frac{A_e}{2T_s} \sum_{m=-\infty}^{\infty} e^{j\phi_e}\delta(f - F_e - mF_s) + e^{-j\phi_e}\delta(f + F_e - mF_s) \tag{23}$$

The analysis can be simplified by initially considering an input impulse sequence obtained by sampling a first analog signal that is a single-frequency complex exponential signal at frequency $F_e$. The argument for this approach is as follows: consider two equal real systems (conjugate symmetric response) conceptually capable of processing an input impulse sequence obtained by sampling a complex first analog signal. If the positive frequency components of a real signal are applied to one system and the conjugate negative frequency components are applied to the other, the outputs of these two systems will be conjugates by the linearity theorem. If the complex conjugate outputs are added together, the imaginary parts will cancel leaving a real output signal. Hence the conceptual response of the real system to only the positive (or negative) frequency components describes the operation of the system for real signals, i.e., for signals with no imaginary component.

The spectrum of the complex exponential signal is given by:

$$X(f) = \frac{A_e}{T_s} \sum_{m=-\infty}^{\infty} e^{j\phi_e} \delta(f - F_e - mF_s). \quad (24)$$

The following discussion will be confined to a consideration of the first Nyquist region, defined as $-F_s/2 \leq f \leq F_s/2$. The (continuous, not sampled) frequency of the first analog signal will also be confined to the Nyquist region in which the periodic error of digital-to-analog converter 12 is mitigated. Generalization to other Nyquist regions is straightforward, and an extension to the second Nyquist region with RZ and doublet hold functions will be described in Section 6 below. The goal is to rearrange Equation 24 to yield the spectral responses associated with the sub-harmonic spectral components in the first Nyquist region. To accomplish this, Equation 21 that describes the spectrum of the analog output signal output by digital-to-analog conversion system 10 is evaluated at the frequencies of all the sub-harmonic spectral components in the first Nyquist region.

The frequencies of the sub-harmonic spectral components are given by:

$$F_e + p\frac{F_s}{N} \quad (25)$$

where p takes on N values that result in values of Equation 25 that lie in the first Nyquist region.

The minimum value of p is given by:

$$P_{min} = -\left\lfloor N\left(\frac{1}{2} + \frac{F_e}{F_s}\right)\right\rfloor \quad (26)$$

where $\lfloor \ \rfloor$ indicates the integer floor of the argument.

The maximum value of p is given by:

$$P_{max} = P_{max} + N - 1 \quad (27)$$

i.e., N values of p.

With a first analog signal that is a complex exponential signal, the spectrum of the analog output signal at the frequencies of the sub-harmonic spectral components is given by:

$$Y\left(F_e + p\frac{F_s}{N}\right) = \frac{1}{N}\sum_{k=0}^{N-1} X\left(F_e + p\frac{F_s}{N} - k\frac{F_s}{N}\right) \sum_{n=0}^{N-1} e^{-j2\pi\frac{nk}{N}} H_n\left(F_e + p\frac{F_s}{N}\right) G_n\left(F_e + p\frac{F_s}{N} - k\frac{F_s}{N}\right) \quad (28)$$

-continued $$= \frac{1}{N}\sum_{k=0}^{N-1} X\left(F_e + (p-k)\frac{F_s}{N}\right) \sum_{n=0}^{N-1} e^{-j2\pi\frac{nk}{N}} H_n\left(F_e + p\frac{F_s}{N}\right) G_n\left(F_e + (p-k)\frac{F_s}{N}\right)$$

$$= \frac{A_e e^{j\phi_e}}{NT_s} \sum_{k=0}^{N-1} \sum_{m=-\infty}^{\infty} \delta\left((p-k)\frac{F_s}{N} - mF_s\right) \sum_{n=0}^{N-1} e^{-j2\pi\frac{nk}{N}} H_n\left(F_e + p\frac{F_s}{N}\right) G_n\left(F_e + (p-k)\frac{F_s}{N}\right)$$

$$= \frac{A_e e^{j\phi_e}}{NT_s} \sum_{m=-\infty}^{\infty} \sum_{k=0}^{N-1} \delta\left(p - k - mN\right)\frac{F_s}{N} \sum_{n=0}^{N-1} e^{-j2\pi\frac{nk}{N}} H_n\left(F_e + p\frac{F_s}{N}\right) G_n\left(F_e + (p-k)\frac{F_s}{N}\right)$$

The desired spectral component corresponds to p=0 and the undesired sub-harmonic spectral components correspond to the non-zero values of p. Note that $-N+1 \leq P_{min} \leq 0$ and $0 \leq P_{max} \leq N-1$.

When p=0:

$$Y(F_e) = \quad (29)$$

$$\frac{A_e e^{j\phi_e}}{NT_s} \sum_{m=-\infty}^{\infty} \sum_{k=0}^{N-1} \delta\left(-(k+mN)\frac{F_s}{N}\right) \sum_{n=0}^{N-1} e^{-j2\pi\frac{nk}{N}} H_n(F_e) G_n\left(F_e - k\frac{F_s}{N}\right)$$

The impulse can have value only when k+mN=0, which only can hold for k=m=0.

The weight of the desired impulse at the frequency $F_e$ of the first analog signal is given by:

$$\frac{A_e e^{j\phi_e}}{NT_s} \sum_{n=0}^{N-1} H_n(F_e) G_n(F_e) \quad (30)$$

For the non-zero values of p, the weights of the undesired sub-harmonic spectral components are given by:

$$\frac{A_e e^{j\phi_e}}{NT_s} \sum_{k=0}^{N-1}\sum_{n=0}^{N-1} e^{-j2\pi\frac{nk}{N}} H_n\left(F_e + p\frac{F_s}{N}\right) G_n\left(F_e + (p-k)\frac{F_s}{N}\right) \quad (31)$$

when p−k mod N=0.

When this is true it implies:

$$p-k=mN \quad (32)$$

where m is an integer.

Under this condition:

$$k = p - mN. \quad (33)$$

Note also that $G_n(f)$ is periodic on $F_s$. With these two results, the weights of the undesired sub-harmonic spectral components are given by:

$$\frac{A_e e^{j\phi_e}}{NT_s} \sum_{n=0}^{N-1} e^{-j2\pi \frac{n(p-mN)}{N}} H_n\left(F_e - p\frac{F_s}{N}\right) G_n(F_e + mN) = \quad (34)$$

$$\frac{A_e e^{j\phi_e}}{NT_s} \sum_{n=0}^{N-1} e^{-j2\pi \frac{nP}{N}} H_n\left(F_e + p\frac{F_s}{N}\right) G_n(F_e)$$

Since mitigation of all the unwanted sub-harmonic spectral components is desired, this expression should be zero for all non-zero values of p.

For any frequency $F_e$ of the first analog signal, N equations with N unknowns can now be written. The desired response is obtained when p=0, and the desired response at frequency $F_e$ can be denoted as:

$$\frac{A_e e^{j\phi_e}}{NT_s} \sum_{n=0}^{N-1} H_n(F_e) G_n(F_e) = \frac{A_e e^{j\phi_e}}{T_s} D(F_e). \quad (35)$$

where $D(F_e)$ is the specified response of digital-to-analog conversion system 10, hence its normalization by $A_e e^{j\Phi_e}/T_s$. Simplifying Equation 35 gives:

$$\frac{1}{N} \sum_{n=0}^{N-1} H_n(F_e) G_n(F_e) = D(F_e) \quad (36)$$

The characteristics of the specified response will be developed below. Since the frequency $F_e$ of the first analog signal can be any frequency, denoted by f in the equations below, in the first Nyquist region, Equations (34) and (36) may be generalized to yield the N constraint equations on the frequency responses $G_n(f)$ of correction filters 32 over the first Nyquist region:

$$\frac{1}{N} \sum_{n=0}^{N-1} e^{-j2\pi \frac{np}{N}} H_n\left(f + p\frac{F_s}{N}\right) G_n(f) = \begin{cases} D(f) & p = 0 \\ & |f| < F_s/2 \\ 0 & p \neq 0 \end{cases} \quad (37)$$

where D(f) is the specified response, as noted above.

If correction of sinc and other analog amplitude unflatness and non-linear phase effects is desired, the above function can be modified to include such corrections, as noted above. However, the goal of the analysis described herein is for digital-to-analog conversion system 10 to have the same nominal response as would occur if digital-to-analog converter 12 had no timing errors and modified digital signal generator 14 were omitted. In this case, the nominal boxcar function is used as the specified response.

When correction filters 32 are synthesized, they will generally be non-causal. At the time of synthesis, additional delay can be included in the specified response to make the filters causal. This delay should be an integer multiple of the conversion period $1/F_s$ to yield the simplest correction filters. Otherwise the correction filters would also have to perform a fractional interpolation function.

For the current analysis, the specified response is:

$$D(f) = T_s \operatorname{sinc}(T_s f) e^{-j\pi f T_s}. \quad (38)$$

This is based on the understanding that the responses of correction filters 32 will in general be non-causal. In practice, the simplest correction filters should result when D(f) is equal to the average of the responses $H_n(f)$ of the conversion filters 24 constituting digital-to-analog converter 12.

At a given frequency, the constraint equations on correction filters 32 may be expressed in matrix form as:

$$\begin{bmatrix} H_{p_{\min},0}(f) & H_{p_{\min},1}(f) & H_{p_{\min},2}(f) & \cdots & H_{p_{\min},N-1}(f) \\ H_{p_{\min}+1,0}(f) & H_{p_{\min}+1,1}(f) & H_{p_{\min}+1,2}(f) & & H_{p_{\min}+1,N-1}(f) \\ \vdots & & \vdots & & \vdots \\ H_{0,0}(f) & H_{0,1}(f) & H_{0,2}(f) & & H_{0,N-1}(f) \\ \vdots & & \vdots & \ddots & \vdots \\ H_{p_{\max},0}(f) & H_{p_{\max},1}(f) & H_{p_{\max},2}(f) & \cdots & H_{p_{\max},N-1}(f) \end{bmatrix} \begin{bmatrix} G_0(f) \\ G_1(f) \\ \vdots \\ \vdots \\ G_{N-1}(f) \end{bmatrix} = \begin{bmatrix} 0 \\ 0 \\ \vdots \\ D(f) \\ \vdots \\ 0 \end{bmatrix} \quad (39)$$

where:

$$H_{p,n}(f) = \frac{e^{-j2\pi \frac{np}{N}}}{N} H_n\left(f + p\frac{F_s}{N}\right). \quad (40)$$

These equations may be solved to yield a target response for each correction filter 32 at each frequency of interest. To obtain target frequency responses for the correction filters over a specified range of frequencies, this set of equations is formulated and solved over the specified range of frequencies.

Some pathological situations can be envisaged where the matrix will not be invertible but these should not occur in practice provided that the errors of digital-to-analog converter 12 are relatively small, e.g., the timing errors are small compared with the conversion period. While part of the analysis set forth above described how some common periodic timing and amplitude errors can cause periodic errors with a periodicity equal to that of a sub-harmonic of the conversion frequency, it must be noted that the correction methodology is only concerned with the frequency responses of constituent conversion channels 20. It does not care what mechanism caused the frequency responses of the conversion channels to differ.

Corrections based on the above analysis are only valid in the Nyquist region for which the analysis was performed. An embodiment of modified digital signal generator 14 comprising correction filters 32 with target frequency responses based on the above analysis will in general not be capable of mitigating signal-dependent periodic errors of digital-to-analog converter 12 in other Nyquist regions. However, digital-to-analog converter 12 typically incorporates a reconstruction filter (not shown). One purpose of the reconstruction filter is to mitigate such errors. Using the above analysis to determine target responses of correction filters 32 at a particular frequency of the first analog signal will result in correction filter responses that will fully mitigate the periodic errors at the frequencies of N−1 of the sub-harmonics of conversion frequency $F_s$.

In typical applications, the digital input signal input to digital-to-analog conversion system 10 represents a first analog signal having a range of frequencies. The consequences of discontinuities in Equation (39) that can occur when the frequency of the first analog signal is swept over a range of frequencies are mitigated by generating an over-specified system of equations upon which a weighted least-squares solution is found, as described above.

6. RZ and Doublet Extensions

Figure 26:
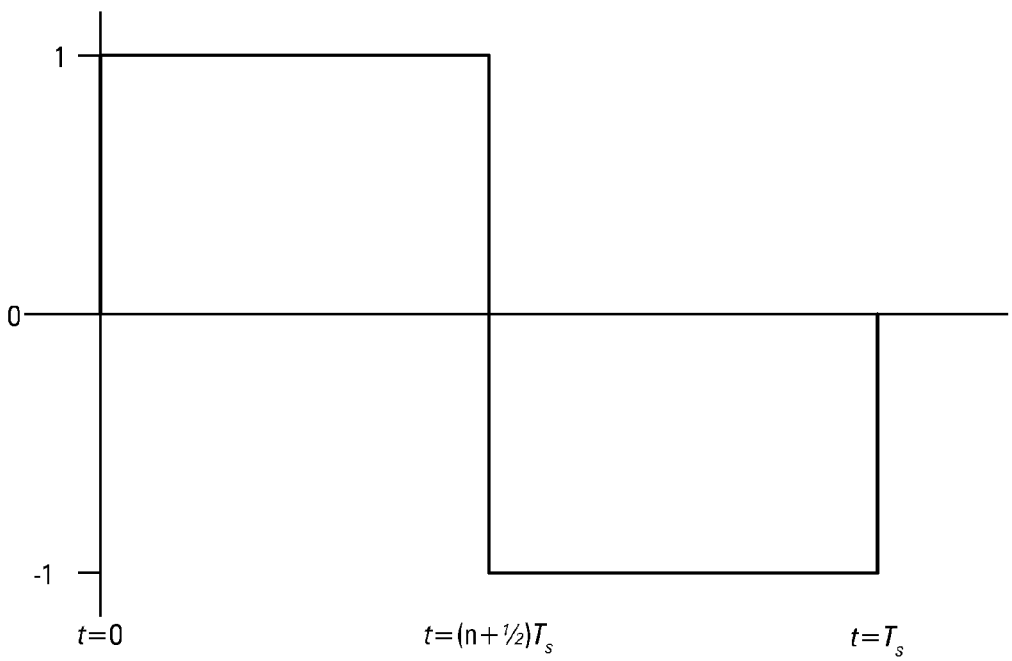
FIG. 26 is a graph showing a nominal doublet waveform.

Operation of digital-to-analog conversion system 10 can be extended into the second Nyquist region by using an RZ or doublet waveform. FIG. 26 is a graph showing a nominal doublet waveform. The frequency response of this function peaks in the second Nyquist region and is much flatter in the second Nyquist region than the NRZ waveform. The RZ waveform is similar to the doublet waveform except that the negative-going portion of the waveform shown in FIG. 26 is replaced by a portion of zero amplitude.

Figure 27:
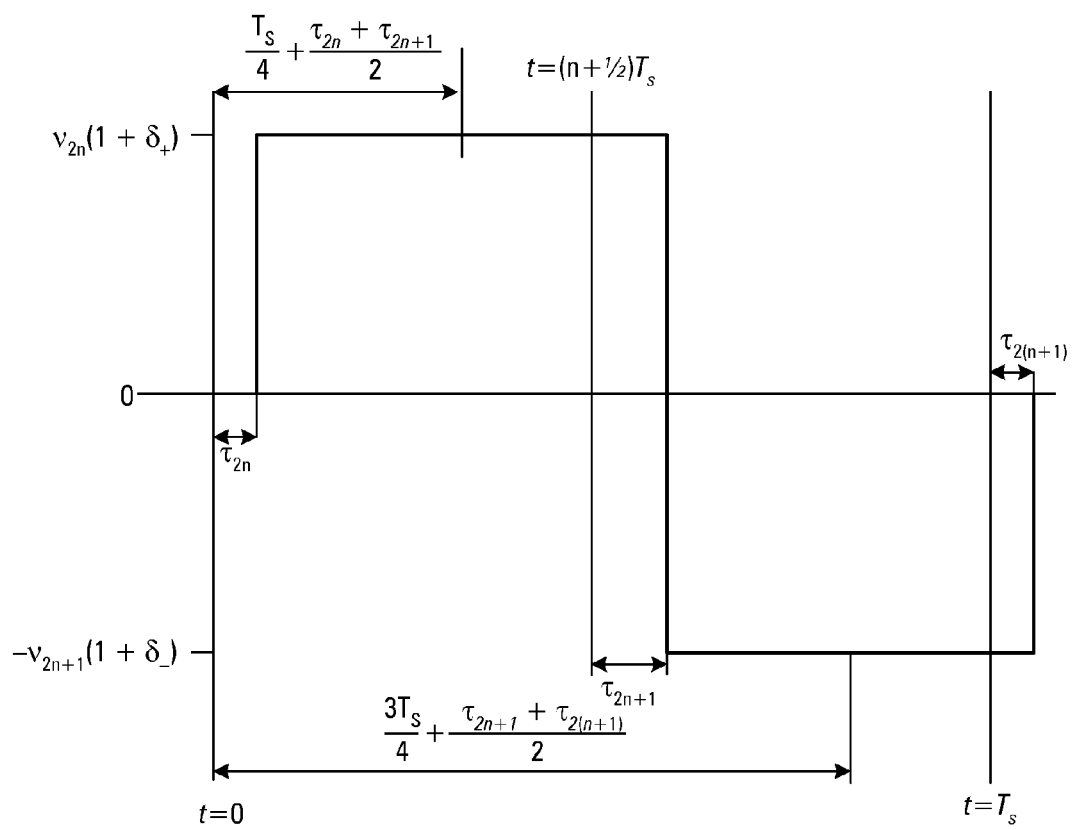
FIG. 27 is a graph showing a doublet waveform having periodic sampling errors.

FIG. 27 is a graph showing a doublet waveform having periodic sampling errors. The timing of the n-th doublet is characterized by three times: (1) the time of the beginning of the positive-going portion $\tau_{2n}$, (2) the time of the beginning of the negative-going portion, and (3) the time of the end of the negative portion. In FIG. 27, the timing errors between these three times and their respective nominal times shown in FIG. 26 are indicated by $\tau_{2n}$, $\tau_{2n+1}$ and $\tau_{2(n+1)}$. Time (1) also corresponds to the end of the negative portion of the previous doublet's pulse and time (3) corresponds to the beginning of the positive portion of the next doublet's pulse. Additionally, there may be periodically-varying multiplicative amplitude errors represented by $v_{2n}$ and $v_{2n+1}$. There may also be systematic gain differences between the positive and negative pulses represented by $\delta_+$ and $\epsilon_-$.

The frequency responses of the periodically impaired doublets are given by:

where the leading linear-phase term is just that needed to make the doublet nominally causal.

Defining:

$$\psi_n = \frac{T_s}{2} + \tau_{n+1} - \tau_n \qquad (42)$$

the frequency responses of the doublets may be expressed as:

$$H_n(f) = \qquad (43)$$

$$e^{j\pi fT_s} \begin{bmatrix} v_{2n}(1+\delta_+)e^{-j\pi f\left[\frac{T_s}{2}+\tau_{2n}+\tau_{2n+1}\right]}\psi_{2n}\mathrm{sinc}(\psi_{2n}f) \\ -v_{2n+1}(1+\delta_-)e^{-j\pi f\left[\frac{T_s}{2}+\tau_{2n+1}+\tau_{2(n+1)}\right]}\psi_{2n+1}\mathrm{sinc}(\psi_{2n+1}f) \end{bmatrix}.$$

If all the periodic time and amplitude errors are equal, no sub-harmonic spectral components will be generated. When all the error terms are zero, the doublet responses can be simplified significantly but the form set forth above is the general form that will need to be used with a doublet embodiment of digital-to-analog converter 12 having a periodic error.

The solution follows that for the NRZ embodiment in the first Nyquist region using a doublet transfer function (or an RZ transfer function if the second part is excluded), except for the values of p corresponding to the sub-harmonic spectral components of interest. One difference is that the sub-harmonic spectral components that are to be mitigated are no longer in contiguous frequency regions since they are in the negative and positive second Nyquist regions, which are separated by the first Nyquist region. The above-described issue regarding the sudden arrival and departure of periodic errors is now exacerbated in that periodic errors suddenly arrive and depart in two Nyquist regions instead of in only one. To mitigate this problem, the above-described technique of adding two equations to the matrix and obtaining a weighted least-squares solution is used, but with four additional equations included in the matrix. Applying this technique is straightforward but the additional degradation of the suppression performance that may be incurred is not known.

7. Derivation of the Weights of the Uncorrected Spectral Components

Evaluation of the uncorrected output spectrum due to a real cosinusoidal first analog signal at the frequencies of the sub-harmonic spectral components is simplified by considering the sub-harmonic spectral components generated by an input impulse sequence obtained by sampling the first analog signal with a frequency of $F_e$ and those generated by an input impulse sequence obtained by sampling the first analog signal with a frequency of $-F_e$.

$$H_n(f) = \begin{bmatrix} v_{2n}(1+\delta_+)e^{-j2\pi f\left[\frac{T_s}{4}+\frac{\tau_{2n}+\tau_{2n+1}}{2}\right]}\left(\frac{T_s}{2}+\tau_{2n+1}-\tau_{2n}\right)\mathrm{sinc}\left(\left(\frac{T_s}{2}+\tau_{2n+1}-\tau_{2n}\right)f\right) \\ -v_{2n+1}(1+\delta_-)e^{-j2\pi f\left[\frac{3T_s}{4}+\frac{\tau_{2n+1}+\tau_{2(n+1)}}{2}\right]}\left(\frac{T_s}{2}+\tau_{2(n+1)}-\tau_{2n+1}\right)\mathrm{sinc}\left(\left(\frac{T_s}{2}+\tau_{2(n+1)}-\tau_{2n+1}\right)f\right) \end{bmatrix} \qquad (41)$$

$$= e^{-j\pi fT_s} \begin{bmatrix} v_{2n}(1+\delta_+)e^{-j\pi f\left[\frac{T_s}{2}+\tau_{2n}+\tau_{2n+1}\right]}\left(\frac{T_s}{2}+\tau_{2n+1}-\tau_{2n}\right)\mathrm{sinc}\left(\left(\frac{T_s}{2}+\tau_{2n+1}-\tau_{2n}\right)f\right) \\ -v_{2n+1}(1+\delta_-)e^{-j\pi f\left[\frac{T_s}{2}+\tau_{2n+1}+\tau_{2(n+1)}\right]}\left(\frac{T_s}{2}+\tau_{2(n+1)}-\tau_{2n+1}\right)\mathrm{sinc}\left(\left(\frac{T_s}{2}+\tau_{2(n+1)}-\tau_{2n+1}\right)f\right) \end{bmatrix}$$

Define the spectra $X_+(f)$, $X_-(f)$ of the input impulse sequences representing the above-described first analog signals as:

$$X_+(f) = \frac{A_e}{2T_s} \sum_{m=-\infty}^{\infty} e^{j\phi_e} \delta(f - F_e - mF_s) \quad (44)$$

and $$X_-(f) = \frac{A_e}{2T_s} \sum_{m=-\infty}^{\infty} e^{-j\phi_e} \delta(f + F_e - mF_s). \quad (45)$$

Additionally:

$$X(f) = X_+(f) + X_-(f) \quad (46)$$

The spectrum of the analog output signal output by digital-to-analog conversion system 10 due to an input impulse sequence representing the first analog signal having the positive frequency is:

$$Y_+(f) = \quad (47)$$

$$\frac{A_e e^{j\phi_e}}{2T_s} \sum_{m=-\infty}^{\infty} \sum_{k=0}^{N-1} \Psi_k\left(F_e + F_s\left(m + \frac{k}{N}\right)\right) \delta\left(f - F_e - F_s\left(m + \frac{k}{N}\right)\right)$$

This spectrum can only have non-zero value at the frequencies of the impulses. These can fall at:

$$f = F_e + p\frac{F_s}{N} \quad (48)$$

where p is an integer, as described above.

The value of the spectrum of the analog output signal at these frequencies is given by:

$$Y_+\left(F_e + p\frac{F_s}{N}\right) = \frac{A_e e^{j\phi_e}}{2T_s} \sum_{m=-\infty}^{\infty} \sum_{k=0}^{N-1} \Psi_k\left(F_e + F_s\left(m + \frac{k}{N}\right)\right) \delta\left(F_e + p\frac{F_s}{N} - F_e - F_s\left(m + \frac{k}{N}\right)\right) \quad (49)$$

$$= \frac{A_e e^{j\phi_e}}{2T_s} \sum_{m=-\infty}^{\infty} \sum_{k=0}^{N-1} \Psi_k\left(F_e + F_s\left(m + \frac{k}{N}\right)\right) \delta\left(p\frac{F_s}{N} - F_s\left(m + \frac{k}{N}\right)\right)$$

$$= \frac{A_e e^{j\phi_e}}{2T_s} \sum_{m=-\infty}^{\infty} \sum_{k=0}^{N-1} \Psi_k\left(F_e + F_s\left(m + \frac{k}{N}\right)\right) \delta\left(-F_s\left(m + \frac{k-p}{N}\right)\right).$$

The impulse only has value when its argument is equal to zero. This implies:

$$m + \frac{k-p}{N} = 0 \Rightarrow m = \frac{p-k}{N} \Rightarrow p - k = mN \quad (50)$$

The weight of the impulse for this value is given by:

$$W_+\left(F_e + p\frac{F_s}{N}\right) = \frac{A_e e^{j\phi_e}}{2T_s} \Psi_{p-mN}\left(F_e + F_s\left(\frac{p-k}{N} + \frac{k}{N}\right)\right) \quad (51)$$

-continued $$= \frac{A_e e^{j\phi_e}}{2T_s} \Psi_p\left(F_e + \frac{p}{N}F_s\right)$$

because $\Psi_k(f)$ is periodic on k modulo N.

A similar development is used to determine the weights of the sub-harmonic spectral components due to the input impulse sequence representing the first analog signal having the negative frequency. With such input impulse sequence, excitation impulses occur at the frequencies $$-F_e + p\frac{F_s}{N}.$$

The weight of the sub-harmonic spectral components are given by:

$$W_-\left(-F_e + p\frac{F_s}{N}\right) = \frac{A_e e^{-j\phi_e}}{2T_s} \Psi_p\left(-F_e + \frac{p}{N}F_s\right) \quad (52)$$

This disclosure describes the invention in detail using illustrative embodiments. However, the invention defined by the appended claims is not limited to the precise embodiments described.

We claim:

1. A digital-to-analog conversion system, comprising:
    a digital input operable to receive a digital input signal;
    a digital-to-analog converter having a conversion frequency, the digital-to-analog converter subject to a periodic error having a periodicity equal to that of an N-th sub-harmonic of the conversion frequency, where N is an integer; and
    a modified digital signal generator interposed between the digital input and the digital-to-analog converter and operable in response to the digital input signal to generate a modified digital signal, the modified digital signal comprising a dynamic digital mitigation component that mitigates the periodic error of the digital-to-analog converter.

2. The system of claim 1, in which:
    the periodic error comprises a signal-independent periodic error; and
    the modified digital signal generator comprises a correction value source operable to cyclically output N signal-independent correction values to provide a signal-independent portion of the digital mitigation component, the signal-independent portion mitigating the signal-independent periodic error.

3. The system of claim 1, in which the modified digital signal generator comprises:
   a correction value source operable to cyclically output N offset correction values; and
   a summing element operable to generate respective values of the modified digital signal by summing (1) the N offset correction values cyclically output by the correction value source, and (2) respective values of one of (a) the digital input signal, and (b) an intermediate modified digital signal derived from the digital input signal.

4. The system of claim 1, in which:
   the periodic error comprises a signal-dependent periodic error; and
   the modified digital signal generator comprises:
      a correction value source operable to cyclically output N signal-dependent correction values,
         a signal-dependent mitigation signal generator operable in response to the N signal-dependent correction values cyclically output by the correction value source and the digital input signal to generate a signal-dependent portion of the digital mitigation component, and
      a combining element operable to incorporate the digital input signal and the signal-dependent portion of the digital mitigation component into the modified digital signal.

5. The system of claim 1, in which the modified digital signal generator comprises:
   a correction value source operable to cyclically output N gain correction values;
   a multiplier operable to generate respective values of the modified digital signal by multiplying (1) the N gain correction values cyclically output by the correction value source, and (2) respective values of one of (a) the digital input signal, and (b) an intermediate modified digital signal derived from the digital input signal.

6. The system of claim 1, in which the modified digital signal generator comprises:
   a correction value source operable to cyclically output N gain correction values;
   a multiplier operable to generate respective product values by multiplying (1) the N gain correction values cyclically output by the correction value source, and (2) respective values of one of (a) the digital input signal, and (b) an intermediate modified digital signal derived from the digital input signal; and
   a summing element operable to generate respective values of the modified digital signal by summing (1) the product values, and (2) the respective values of the one of (a) the digital input signal, and (b) the intermediate modified digital signal.

7. The system of claim 1, in which the modified digital signal generator comprises:
   a correction value source operable to cyclically output N timing correction values;
   a differencing element operable on one of (a) the digital input signal, and (b) an intermediate modified digital signal derived from the digital input signal to subtract (1) current values thereof, and (2) immediately-preceding values thereof to generate respective difference values;
   a multiplier operable to multiply (1) the N timing correction values cyclically output by the correction value source, and (2) respective ones of the difference values to generate respective product values; and
   a summing element operable to sum (1) the product values, and (2) respective values of the one of the (a) digital input signal, and (b) the intermediate modified digital signal to generate respective values of the modified digital signal.

8. The system of claim 7, additionally comprising a filter located one of (a) preceding the differencing element, (b) following the differencing element and (c) following the multiplier.

9. The system of claim 8, in which the filter has filter characteristic that approximates an inverse sinc filter characteristic.

10. The system of claim 1, in which:
    the conversion frequency has a conversion period;
    the sub-harmonic of the conversion frequency has a sub-harmonic period composed of N conversion periods, each having a respective conversion period number; and
    the modified digital signal generator comprises:
       a memory structured to store modified digital signal values each linked to (1) a respective value of (a) the digital input signal, and (b) an intermediate modified digital signal derived from the digital input signal, and (2) a respective conversion period number, and
       a memory controller operable to output from the memory one of the modified digital signal values as a respective modified digital signal value in response to (1) each value of the one of the (a) digital input signal, and (b) the intermediate modified digital input signal, and (2) the conversion period number of the conversion period in which the digital-to-analog converter converts the modified digital signal value.

11. The system of claim 1, in which:
    the conversion frequency has a conversion period;
    the sub-harmonic of the conversion frequency has a sub-harmonic period composed of N conversion periods, each having a respective conversion period number, where N is an integer; and
    the modified digital signal generator comprises:
       a memory structured to store timing correction values each linked to (1) a respective current value of (a) the digital input signal, and (b) an intermediate modified digital signal derived from the digital input signal, (2) a respective immediately-preceding value of the one of (a) the digital input signal, and (b) the intermediate modified digital signal, and (3) a respective conversion period number,
       a memory controller operable to output from the memory one of the timing correction values as a respective timing correction value, the memory controller operating in response to (1) the current value of the one of the (a) digital input signal, and (b) the intermediate modified digital input signal, (2) the immediately-preceding value of the one of the (a) digital input signal, and (b) the intermediate modified digital input signal, and (3) the conversion period number of the conversion period in which the digital-to-analog converter converts the modified digital signal value, and
       a summing element operable to generate the modified digital signal value by summing (1) the timing correction value output from the memory, and (2) the respective value of the one of (a) the digital input signal, and (b) the intermediate modified digital signal.

12. The system of claim 1, in which the modified digital signal generator comprises a cyclic time-varying filter having N discrete filter characteristics, the filter operable to filter the digital input signal to generate the modified digital signal.

13. The system of claim 12, in which at least two of the N filter characteristics are mutually different.

14. The system of claim 12, in which the cyclic time-varying filter comprises a finite impulse response filter.

15. The system of claim 12, in which the modified digital signal generator additionally comprises a fixed-coefficient filter in series with the cyclic time-varying filter.

16. The system of claim 12, in which is the filter comprises a polyphase filter.

17. The system of claim 12, in which the cyclic time-varying filter comprises:
   a filter having a filter characteristic defined by a set of filter coefficients; and
   a coefficient store operable to cyclically output N sets of the filter coefficients to the filter.

18. The system of claim 12, in which the cyclic time-varying filter comprises N filter channels each comprising a correction filter having a respective fixed filter characteristic.

19. A computer-readable medium in which is fixed a program operable to cause a computational device to perform a method that mitigates a periodic error of a digital-to-analog conversion process having a conversion frequency, the periodic error having a periodicity equal to that of an N-th sub-harmonic of the conversion frequency, where N is an integer, the method comprising:
   receiving a digital input signal;
   in response to the digital input signal, generating a modified digital signal, the modified digital signal comprising a dynamic digital mitigation component that mitigates the periodic error of the digital-to-analog conversion process; and
   outputting the modified digital signal to the digital-to-analog conversion process for conversion to an analog signal.

20. The computer-readable medium of claim 19, in which the generating comprises cyclically filtering the digital input signal with N discrete filter characteristics to generate the modified digital signal.

21. An analog signal generator, comprising:
   a digital-to-analog converter comprising a digital input and having a conversion frequency, the digital-to-analog converter subject to a periodic error having a periodicity equal to that of an N-th sub-harmonic of the conversion frequency, where N is an integer; and
   a memory operable to provide a modified digital signal representing an analog signal to the digital input of the digital-to-analog converter for conversion to an analog signal by the digital-to-analog converter, the modified digital signal comprising a dynamic digital mitigation component that mitigates the periodic error of the digital-to-analog converter.

22. The analog signal generator of claim 21, in which the memory is operable to provide the modified digital signal generator to the digital-to-analog converter locked in phase to the periodic error of the digital-to-analog converter.

* * * * *